(12) United States Patent
Kim et al.

(10) Patent No.: US 8,705,297 B2
(45) Date of Patent: Apr. 22, 2014

(54) SEMICONDUCTOR MEMORY DEVICES AND SEMICONDUCTOR MEMORY SYSTEMS

(75) Inventors: Sua Kim, Seongnam-si (KR); Chul-woo Park, Yongin-si (KR); Hong-sun Hwang, Suwon-si (KR); Hak-soo Yu, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 214 days.

(21) Appl. No.: 13/282,830

(22) Filed: Oct. 27, 2011

(65) Prior Publication Data

US 2012/0106281 A1 May 3, 2012

(30) Foreign Application Priority Data

Oct. 27, 2010 (KR) .................. 10-2010-0105372

(51) Int. Cl.
*G11C 7/00* (2006.01)
(52) U.S. Cl.
USPC . 365/196; 365/205; 365/185.29; 365/185.11; 365/230.03
(58) Field of Classification Search
USPC ........... 365/196, 205, 185.29, 185.11, 230.03
See application file for complete search history.

(56) References Cited

U.S. PATENT DOCUMENTS

2006/0083072 A1* 4/2006 Umezawa ................ 365/185.29

FOREIGN PATENT DOCUMENTS

| JP | 2000-048564 A | 2/2000 |
| KR | 10-0283907 B1 | 3/2001 |
| KR | 2009-0076133 A | 7/2009 |

* cited by examiner

*Primary Examiner* — Jason Lappas
(74) *Attorney, Agent, or Firm* — Harness, Dickey & Pierce, P.L.C.

(57) ABSTRACT

A semiconductor memory device includes at least one memory cell block and at least one connection unit. The at least one memory cell block has a first region including at least one first memory cell connected to a first bit line, and a second region including at least one second memory cell connected to a second bit line. The at least one connection unit is configured to selectively connect the first bit line to a corresponding bit line sense amplifier based on a first control signal, and configured to selectively connect the second bit line to the corresponding bit line sense amplifier via a corresponding global bit line based on a second control signal.

25 Claims, 36 Drawing Sheets

FIG. 16

SEMICONDUCTOR MEMORY DEVICES AND SEMICONDUCTOR MEMORY SYSTEMS

CROSS-REFERENCE TO RELATED APPLICATION(S)

This application claims priority under 35 U.S.C. §119 to Korean Patent Application No. 10-2010-0105372, filed on Oct. 27, 2010, in the Korean Intellectual Property Office, the entire contents of which are incorporated herein by reference.

BACKGROUND

1. Field

Example embodiments of inventive concepts relate to semiconductor memory devices and semiconductor memory systems, for example, to semiconductor memory devices and semiconductor memory systems, in which coupling between bit lines or between word lines is reduced.

2. Description of Conventional Art

A semiconductor memory device includes a plurality of memory cells for storing data. Each of the plurality of memory cells is connected to one of a plurality of bit lines and one of a plurality of word lines. As the integration degree of semiconductor memory devices increases, coupling between bit lines or between word lines may also increase.

SUMMARY

At least some example embodiments provide semiconductor memory devices, in which coupling between bit lines or between word lines may be reduced.

At least some example embodiments provide semiconductor memory systems that include semiconductor memory devices, in which coupling between bit lines or between word lines may be reduced.

At least one example embodiment provides a semiconductor memory device. According to at least this example embodiment, the semiconductor memory device includes: a plurality of memory cell blocks, each including a first region including first memory cells connected to a first bit line, and a second region including second memory cells connected to a second bit line; a plurality of bit line sense amplifiers, each of which is configured to be connected to the first or second memory cells of a corresponding memory cell block from among the plurality of memory cell blocks; and a plurality of connection units each connecting the first bit line to a corresponding bit line sense amplifier according to a first control signal or connecting the second bit line to the corresponding bit line sense amplifier via a corresponding global bit line according to a second control signal, wherein the first region and second region of each of the plurality of memory cell blocks cross each other in a first direction, and the first region and second region of each of the plurality of memory cell blocks are arranged adjacent to each other in a second direction.

According to at least some example embodiments, the semiconductor memory device may further include: a plurality of memory cell arrays, each including at least one memory cell block from among the plurality of memory cell blocks; a plurality of sub word line driver regions located between the plurality of memory cell arrays; a plurality of first sub word line drivers, each configured to apply a corresponding first driving signal or a ground voltage to a first end of a corresponding sub word line according to a main word line signal; and a plurality of second sub word line drivers, each configured to selectively apply the ground voltage to a second end of the corresponding sub word line according to a corresponding second driving signal. A first sub word line driver and a second sub word line driver connected to a sub word line different from a sub word line connected to the first sub word line driver may be formed in a first sub word line driver region from among the plurality of sub word line driver regions.

According to another aspect of the inventive concept, there is provide a semiconductor memory device including a plurality of first memory cell blocks each including a first region including first memory cells connected to a first bit line, and a second region including second memory cells connected to a second bit line; a plurality of second memory cell blocks each including third memory cells connected to a third bit line; a plurality of first bit line sense amplifiers, each of which is to be connected to the first or second memory cells of a corresponding first memory cell block from among the plurality of first memory cell blocks; at least one second bit line sense amplifier to be connected to the third memory cells of a corresponding second memory cell block from among the plurality of second memory cell blocks; and a plurality of connection units each connecting the first bit line to a corresponding first bit line sense amplifier according to a first control signal or connecting the second bit line to the corresponding first bit line sense amplifier via a corresponding global bit line according to a second control signal, and wherein at least one of the plurality of first memory cell blocks and at least one of the plurality of second memory cell blocks cross each other in a first direction.

According to at least some example embodiments, the semiconductor memory device may further include: a plurality of memory cell arrays each including at least one memory cell block from among the plurality of first memory cell blocks and the plurality of second memory cell blocks; a plurality of sub word line driver regions located between the plurality of memory cell arrays; a plurality of first sub word line drivers, each configured to apply a corresponding first driving signal or a ground voltage to a first end of a corresponding sub word line according to a main word line signal; and a plurality of second sub word line drivers, each configured to selectively apply the ground voltage to a second end of the corresponding sub word line according to a corresponding second driving signal. One of the plurality of first sub word line drivers and a second sub word line driver connected to a sub word line different from a sub word line connected to the first sub word line driver may be formed in a first sub word line driver region from among the plurality of sub word line driver regions.

At least one other example embodiment provides a semiconductor memory device. According to at least this example embodiment, the semiconductor memory device includes: a plurality of sub word line driver regions located between a plurality of memory cell arrays; a plurality of first sub word line drivers, each configured to apply a corresponding first driving signal or a ground voltage to a first end of a corresponding sub word line according to a main word line signal; and a plurality of second sub word line drivers, each configured to selectively apply the ground voltage to a second end of the corresponding sub word line according to a corresponding second driving signal. One of the plurality of first sub word line drivers and a second sub word line driver connected to a sub word line different from a sub word line connected to the first sub word line driver may be formed in a first sub word line driver region from among the plurality of sub word line driver regions.

At least one other example embodiment provides a semiconductor memory system including: a semiconductor memory device; and a controller configured to control the semiconductor memory device. The semiconductor memory device includes: a plurality of memory cell blocks each including a first region including first memory cells connected to a first bit line, and a second region including second memory cells connected to a second bit line; a plurality of bit line sense amplifiers, each of which is configured to be connected to the first or second memory cells of a corresponding memory cell block from among the plurality of memory cell blocks; and a plurality of connection units, each configured to connect the first bit line to a corresponding bit line sense amplifier according to a first control signal or the second bit line to the corresponding bit line sense amplifier via a corresponding global bit line according to a second control signal. The first region and second region of each of the plurality of memory cell blocks cross each other in a first direction, and the first region and second region of each of the plurality of memory cell blocks are arranged adjacent to each other in a second direction.

At least one other example embodiment provides semiconductor memory system including: a semiconductor memory device; and a controller configured to control the semiconductor memory device. The semiconductor memory device includes: a plurality of first memory cell blocks, each including a first region including first memory cells connected to a first bit line, and a second region including second memory cells connected to a second bit line; a plurality of second memory cell blocks, each including third memory cells connected to a third bit line; a plurality of first bit line sense amplifiers, each of which is configured to be connected to the first or second memory cells of a corresponding first memory cell block from among the plurality of first memory cell blocks; at least one second bit line sense amplifier configured to be connected to the third memory cells of a corresponding second memory cell block from among the plurality of second memory cell blocks; and a plurality of connection units, each configured to connect the first bit line to a corresponding first bit line sense amplifier according to a first control signal or to connect the second bit line to the corresponding first bit line sense amplifier via a corresponding global bit line according to a second control signal. At least one of the plurality of first memory cell blocks and at least one from among the plurality of second memory cell blocks cross each other in a first direction.

At least one other example embodiment provides a semiconductor memory system including: a semiconductor memory device; and a controller configured to control the semiconductor memory device. The semiconductor memory device includes: a plurality of sub word line driver regions located between a plurality of memory cell arrays; a plurality of first sub word line drivers, each configured to apply a corresponding first driving signal or a ground voltage to a first end of a corresponding sub word line according to a main word line signal; and a plurality of second sub word line drivers each configured to selectively apply the ground voltage to a second end of the corresponding sub word line according to a corresponding second driving signal. One of the plurality of first sub word line drivers and a second sub word line driver connected to a sub word line different from a sub word line connected to the first sub word line driver are formed in one sub word line driver region from among the plurality of sub word line driver regions.

At least one other example embodiment provides a semiconductor memory device including: at least one memory cell block having a first region including at least one first memory cell connected to a first bit line, and a second region including at least one second memory cell connected to a second bit line; and at least one connection unit configured to selectively connect the first bit line to a corresponding bit line sense amplifier based on a first control signal, and configured to selectively connect the second bit line to the corresponding bit line sense amplifier via a corresponding global bit line based on a second control signal.

At least one other example embodiment provides a semiconductor memory device including: at least one memory cell block having a first region including at least one first memory cell connected to a first bit line, and a second region including at least one second memory cell connected to a second bit line; and at least one bit line sense amplifier, the at least one bit line sense amplifier being connected to the at least one first memory cell via the first bit line, and being connected to the at least one second memory cell via a second bit line and a corresponding global bit line.

According to at least some example embodiments, the first direction may not be parallel to the second direction. The first direction may be perpendicular to the second direction. The first direction may be a column-wise direction, and the second direction may be a row-wise direction.

According to at least some example embodiments, the semiconductor memory device may further include: a plurality of first bit lines and a plurality of second bit lines as local bit lines, wherein
pitches between a plurality of global bit lines are about two times pitches between the local bit lines.

The global bit line may be at a location corresponding to a location between a first bit line and a second bit line adjacent in the first direction. The global bit line may be a metal line.

According to at least some example embodiments, the semiconductor memory device may further include: at least one control signal generation unit configured to generate the first control signal and the second control signal based on a row address. The at least one control signal generation unit may be further configured to: generate the first control signal having a first voltage when an enabled word line is connected to a corresponding first memory cell; generate the first control signal having a second voltage when the enabled word line is not connected to the corresponding first memory cell; generate the second control signal having the first voltage when the enabled word line is connected to a corresponding second memory cell; and generate the second control signal having the second voltage when the enabled word line is not connected to the corresponding second memory cell.

Each of the plurality of connection units may be further configured to: connect the first bit line to the corresponding bit line sense amplifier in response to the first control signal having the first voltage; disconnect the first bit line from the corresponding bit line sense amplifier in response to the first control signal having the second voltage; connect the second bit line to the corresponding bit line sense amplifier via the corresponding global bit line in response to the second control signal having the first voltage; and disconnect one of the second bit line and the corresponding bit line sense amplifier from the corresponding global bit line in response to the second control signal having the second voltage.

The at least one control signal generation unit may be configured to generate the first control signal and the second control signal having a third voltage when the semiconductor memory device performs a precharging operation. The first voltage may be higher than the second voltage and the third voltage, and the third voltage may be higher than the second voltage.

According to at least some example embodiments, the at least one control signal generation unit may include: at least one signal generator configured to generate the first control signal or the second control signal. The at least one signal generator may include: a decoding unit configured to generate a decoded row address by decoding the row address; a first voltage controller configured to control the first or second control signal to have the first voltage based on the decoded row address; a second voltage controller configured to control the first or second control signal to have the second voltage based on the decoded row address; and a third voltage controller configured to control the first or second control signal to have the third voltage in response to an enabled precharge enable signal when the semiconductor memory device performs a precharging operation.

According to at least some example embodiments, the semiconductor memory device may further include: at least one shield line between global bit lines adjacent to one another in the first direction, the at least one shield line being maintained at a constant voltage level (e.g., a ground voltage level).

According to at least some example embodiments, each of the plurality of connection units may include: a first switch unit configured to selectively connect the first bit line to the corresponding bit line sense amplifier based on the first control signal; and a second switch unit configured to selectively connect the second bit line to the global bit line based on the second control signal.

The first switch unit may be between the corresponding bit line sense amplifier and the corresponding memory cell block, and the second switch unit may be at a location corresponding to the center of the corresponding memory cell block.

The first switch unit may include: a first transistor having a first gate, a first terminal and a second terminal, wherein the first gate is configured to receive the first control signal, the first terminal is connected to the first bit line, and the second terminal is connected to the corresponding bit line sense amplifier. The second switch unit may include: a second transistor having a second gate, a third terminal and a fourth terminal, wherein the second gate is configured to receive the second control signal, the third terminal is connected to the second bit line, and the fourth terminal is connected to the global bit line.

According to at least some example embodiments, the semiconductor memory device may have an open bit line architecture, and each of the plurality of bit line sense amplifiers may include: an input terminal configured to be connected to the global bit line or the first bit line of a memory cell block adjacent to the bit line sense amplifier in one direction; and an inversion input terminal configured to be connected to the global bit line or the first bit line of a memory cell block adjacent to the bit line sense amplifier in the opposite direction.

According to at least some example embodiments, the semiconductor memory device may have a folded bit line architecture, and each of the plurality of bit line sense amplifiers may include: a first input terminal configured to be connected to the global bit line or the first bit line of a memory cell block adjacent to the bit line sense amplifier in one direction; and an inversion input terminal configured to be connected to an other of the global bit line and the first bit line of a memory cell block adjacent to the bit line sense amplifier, which is not connected to the first input terminal.

Each of the plurality of bit line sense amplifiers may further include: a second input terminal configured to be connected to the global bit line or the first bit line of a memory cell block adjacent to the bit line sense amplifier in the opposite direction; and a second inversion input terminal configured to be connected to an other of the global bit line and the first bit line of the memory cell block adjacent to the bit line sense amplifier, which is not connected to the second input terminal.

Each of the first and second memory cells may include a vertical-channel transistor.

According to at least some example embodiments, the semiconductor memory device may further include: a plurality of memory cell arrays, each of the plurality of memory cell arrays including at least one memory cell block from among the plurality of memory cell blocks; a plurality of sub word line driver regions between the plurality of memory cell arrays; a plurality of first sub word line drivers, each of the plurality of first sub word line drivers being configured to apply a corresponding first driving signal or a ground voltage to a first end of a corresponding sub word line based on a main word line signal; and a plurality of second sub word line drivers, each of the plurality of second sub word line drivers being configured to selectively apply the ground voltage to a second end of the corresponding sub word line based on a corresponding second driving signal, wherein a first sub word line driver and a second sub word line driver connected to a sub word line different from a sub word line connected to the first sub word line driver are formed in a first sub word line driver region from among the plurality of sub word line driver regions.

The sub word line connected to the first sub word line driver in the first sub word line driver region may be adjacent to the sub word line connected to the second sub word line driver in the first sub word line driver region.

The first and second sub word line drivers connected to the same sub word line may be located in different sub word line driver regions.

Second ends of the plurality of sub word lines may be connected to each other via the plurality of second sub word line drivers.

Each of the plurality of second sub word line drivers may include at least one transistor having a gate, a first terminal and a second terminal, wherein the gate is configured to receive a corresponding second driving signal, the first terminal is configured to receive the ground voltage, and the second terminal is connected to a second terminal of a corresponding sub word line.

First ends of the plurality of sub word lines are connected to each other via the plurality of first sub word line drivers.

According to at least some example embodiments, the semiconductor memory device may further include: at least one driving signal generation unit configured to generate the first driving signal and the second driving signal based on a row address. The at least one driving signal generation unit may be configured to supply a corresponding first driving signal to a corresponding first sub word line driver, and to supply a corresponding second driving signal to a corresponding second sub word line driver in a sub word line driver region in which the corresponding first sub word line driver is formed.

Each of the at least one driving signal generation unit may be configured to generate the first driving signal and the second driving signal such that the first and second driving signals supplied to the first and second sub word line drivers connected to the same sub word line, respectively, have different logic states.

The at least one driving signal generation unit may include: a decoding unit configured to generate a first reference driving signal and a second reference driving signal based on the row address; and at least one signal generation unit configured to output the first driving signal and the second driving signal based on the first reference driving signal and the second reference driving signal.

The at least one signal generation unit may include: a first inverter chain configured to invert the first or second reference driving signal and output the second driving signal; and a second inverter chain configured to invert the first or second reference driving signal and output the first driving signal.

A second sub word line driver connected to a second end of a sub word line driven with a high voltage by a corresponding first sub word line driver may be disabled according to a corresponding second driving signal.

BRIEF DESCRIPTION OF THE DRAWINGS

Example embodiments of inventive concepts will be more clearly understood from the following detailed description taken in conjunction with the accompanying drawings in which:

FIG. 16 is a block diagram of a semiconductor memory device according to another example embodiment of inventive concepts;

DETAILED DESCRIPTION

Figure 1:
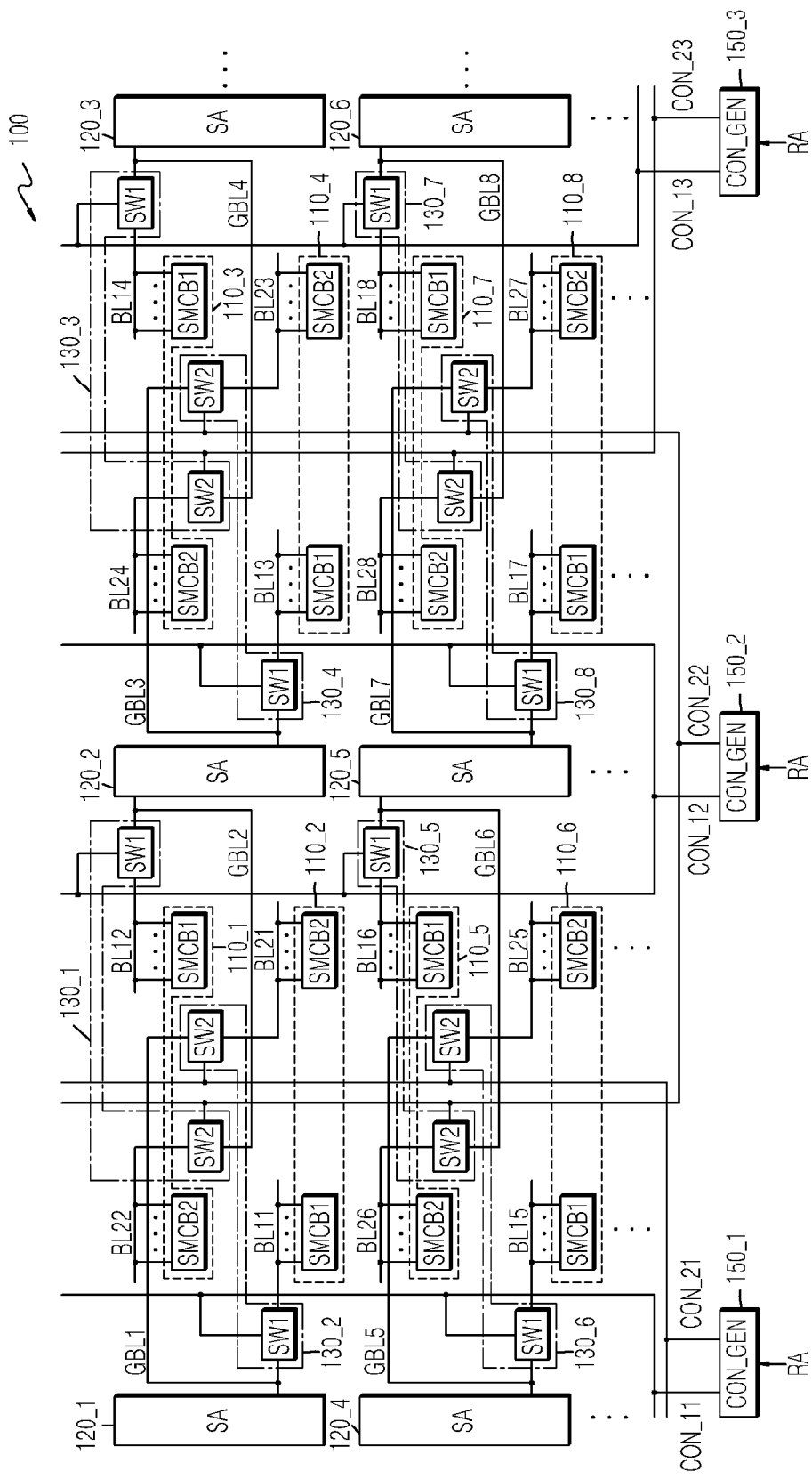
FIG. 1 is a block diagram of a semiconductor memory device according to an example embodiment of inventive concepts.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a semiconductor memory device 100 according to an example embodiment of inventive concepts.

Referring to FIG. 1, the semiconductor memory device 100 may include a plurality of memory cell blocks 110_1, 110_2, 110_3, 110_4, 110_5, 110_6, 110_7, 110_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 120_1, 120_2, 120_3, 120_4, 120_5, 120_6, . . . , a plurality of connection units 130_1, 130_2, 130_3, 130_4, 130_5, 130_6, 130_7, 130_8, . . . , and a plurality of control signal generation units 150_1, 150_2, 150_3, . . . .

Each of the plurality of memory cell blocks 110_1, 110_2, 110_3, 110_4, 110_5, 110_6, 110_7, 110_8, . . . may include a first region SMCB1 in which a plurality of first memory cells are arranged, and a second region SMCB2 in which a plurality of second memory cells are arranged. Each of the first bit lines BL11, BL12, BL13, BL14, BL15, BL16, BL17, . . . may be connected to the first memory cells in the first region SMCB1 of a corresponding memory cell block from among the plurality of memory cell blocks 110_1, 110_2, 110_3, 110_4, 110_5, 110_6, 110_7, 110_8, . . . . Each of the second bit lines BL21, BL22, BL23, BL24, BL25, BL26, BL27, . . . may be connected to the second memory cells in the second region SMCB2 of the corresponding memory cell block from among the plurality of memory cell blocks 110_1, 110_2, 110_3, 110_4, 110_5, 110_6, 110_7, 110_8, . . . . Also, each of the second bit lines BL21, BL22, BL23, BL24, BL25, BL26, BL27, . . . may be connected to a corresponding global bit line from among the plurality of global bit lines GBL1, GBL2, GBL3, GBL4, GBL5, GBL6, GBL7, GBL8, . . . . In this example, the semiconductor memory device 100 may have a hierarchical bit line architecture.

For example, the first memory cells connected to the first bit line BL12 may be arranged in the first region SMCB1 of the memory cell block 110_1, and the second memory cells connected to the second bit line BL22 may be arranged in the second region SMCB2 of the memory cell block 110_1. In another example, the first memory cells connected to the first bit line BL13 may be arranged in the first region SMCB1 of the memory cell block 110_4, and the second memory cells connected to the second bit line BL23 may be arranged in the second region SMCB2 of the memory cell block 110_4. Likewise, in each of the other memory cell blocks 110_2, 110_3, 110_5, 110_6, 110_7, 110_8, . . . , the first memory cells may be arranged in the first region SMCB1 and the second memory cells may be arranged in the second region SMCB2.

FIG. 1 illustrates an example in which first memory cells are arranged in the first region SMCB1 and the second memory cells are arranged in the second region SMCB2.

According to at least some example embodiments of inventive concepts, each of the plurality of memory cell blocks 110_1, 110_2, 110_3, 110_4, 110_5, 110_6, 110_7, 110_8, . . . may be divided into two equal or substantially equal parts: the first and second regions SMCB1 and SMCB2. For example, half the memory cells included in each of the plurality of memory cell blocks 110_1, 110_2, 110_3, 110_4, 110_5, 110_6, 110_7, 110_8, . . . may be the first memory cells, and the other memory cells may be the second memory cells. However, example embodiments are not limited thereto, and the sizes of the first and second regions SMCB1 and SMCB2 may be different from each other.

The first region SMCB1 of each of the plurality of memory cell blocks 110_1, 110_2, 110_3, 110_4, 110_5, 110_6, 110_7, 110_8, . . . , and the second region SMCB2 of a memory cell block adjacent to the memory cell block having the first region SMCB1 cross each other in a first direction. For example, the first region SMCB1 of one memory cell block and the second region SMCB2 of a memory cell block adjacent to the memory cell block cross each other in the first direction. In the example embodiment shown in FIG. 1, the first region SMCB1 of the memory cell block 110_2 and the second region SMCB2 of the memory cell block 110_1 or 110_5 adjacent to the memory cell block 110_2 may be arranged in the first direction. Also, the second region SMCB2 of the memory cell block 110_2 and the first region SMCB1 of the memory cell block 110_1 or 110_5 adjacent to the memory cell block 110_2 may be arranged in the first direction. The first region SMCB1 of each of the other memory cell blocks 110_1, 110_3, 110_4, 110_5, 110_6, 110_7, 110_8, . . . , and the second region SMCB2 of a memory cell block adjacent to this memory cell block may also be arranged as described above.

Still referring to FIG. 1, the first region SMCB1 and the second region SMCB2 of each of the plurality of memory cell blocks 110_1, 110_2, 110_3, 110_4, 110_5, 110_6, 110_7, 110_8, . . . may be arranged adjacent to each other in a second direction. In one example, the first region SMCB1 and the second region SMCB2 included in one memory cell block may be arranged adjacent to each other in the second direction. For example, the first region SMCB1 and the second region SMCB2 included in the memory cell block 110_2 may be arranged adjacent to each other in the second direction. In another example, the first region SMCB1 and the second region SMCB2 of the memory cell block 110_3 may be arranged adjacent to each other in the second direction. Similarly, the first region SMCB1 and the second region SMCB2 of each of the other memory cell blocks 110_1, 110_3, 110_4, 110_5, 110_6, 110_7, 110_8, . . . may also be arranged adjacent to each other in the second direction. The second direction may not be parallel to the first direction or may be perpendicular to the first direction. The first direction may be a column-wise direction, and the second direction may be a row-wise direction.

Each of the bit line sense amplifiers 120_1, 120_2, 120_3, 120_4, 120_5, 120_6, . . . may be connected to the first or second region SMCB1 or SMCB2 of a corresponding memory cell block from among the plurality of memory cell blocks 110_1, 110_2, 110_3, 110_4, 110_5, 110_6, 110_7, 110_8, . . . . In other words, for example, each of the plurality of bit line sense amplifiers 120_1, 120_2, 120_3, 120_4, 120_5, 120_6, . . . may sense and amplify data stored in the first or second memory cells of the corresponding memory cell block. In this example, the bit line sense amplifier 120_2 may be connected to the first region SMCB1 of the memory cell block 110_1 via the first bit line BL12, or may be connected to the second region SMCB2 of the memory cell block 110_1 via the second bit line BL22 and the global bit line GBL2. Also, the bit line sense amplifier 120_2 may be connected to the first region SMCB1 of the memory cell block 110_4 via the first bit line BL13, or may be connected to the second region SMCB2 of the memory cell block 110_4 via the second bit line BL23 and the global bit line GBL3. As illustrated in FIG. 1, each of the other bit line sense amplifiers 120_1, 120_3, 120_4, 120_5, 120_6, . . . may be connected to the first or second region SMCB1 or SMCB2 of a corresponding memory cell block from among the plurality of memory cell blocks 110_1, 110_3, 110_4, 110_5, 110_6, 110_7, 110_8, . . . .

The semiconductor memory device 100 may have an open bit line architecture as illustrated in FIG. 1. According to at least one example embodiment of FIG. 1, each of the plurality of bit line sense amplifiers 120_1, 120_2, 120_3, 120_4, 120_5, 120_6, . . . may include an input terminal via which data stored in the memory cells in the first or second region SMCB1 or SMCB2 of an adjacent memory cell block in a given direction is received, and an inversion input terminal via which data stored in the memory cells in the first or second region SMCB1 or SMCB2 of an adjacent memory cell block in the opposite direction is received. For example, the input terminal of the bit line sense amplifier 120_2 may be connected to the first bit line BL13 or may be connected to the second bit line BL23 via the global bit line GBL3, and the inversion input terminal of the bit line sense amplifier 120_2 may be connected to the first bit line BL12 or may be connected to the second bit line BL22 via the global bit line GBL2. Otherwise, the inversion input terminal of the bit line sense amplifier 120_2 may be connected to the first bit line BL13 or may be connected to the second bit line BL23 via the global bit line GBL3, and the input terminal of the bit line sense amplifier 120_2 may be connected to the first bit line BL12 or may be connected to the second bit line BL22 via the global bit line GBL2. Similarly, the input terminal of each of the other bit line sense amplifiers 120_1, 120_3, 120_4, 120_5, 120_6, . . . may be connected to the first or second bit line connected to an adjacent memory cell in a given direction. The inversion input terminal of each of the other bit line sense amplifiers 120_1, 120_3, 120_4, 120_5, 120_6, . . . may be connected to the first or second bit line connected to an adjacent memory cell in the opposite direction.

Each of the plurality of connection units 130_1, 130_2, 130_3, 130_4, 130_5, 130_6, 130_7, 130_8, . . . may connect a corresponding first bit line to a corresponding bit line sense amplifier, in response to a corresponding first control signal from among a plurality of first control signals CON_11, CON_12, CON_13, . . . , or may connect a corresponding second bit line to the corresponding bit line sense amplifier via a corresponding global bit line, in response to a corresponding second control signal from among a plurality of second control signals CON_21, CON_22, CON_23, . . . .

For example, the connection unit 130_1 may connect the first bit line BL12 to the bit line sense amplifier 120_2, in response to the first control signal CON_12, or may connect the second bit line BL22 to the bit line sense amplifier 120_2 via the global bit line GBL2, in response to the second control signal CON_22. Also, the connection unit 130_4 may connect the first bit line BL13 to the bit line sense amplifier 120_2, in response to the first control signal CON_12, or may connect the second bit line BL23 to the bit line sense amplifier 120_2 via the global bit line GBL3, in response to the second control signal CON_22. As illustrated in FIG. 1, each of the other connection units, 130_2, 130_3, 130_5, 130_6, 130_7, 130_8, . . . may also connect a corresponding first bit line to a corresponding bit line sense amplifier, in response to a corresponding first control signal, or may connect a corresponding second bit line to the corresponding bit line sense amplifier via a corresponding global bit line, in response to a corresponding second control signal.

Each of the plurality of connection units 130_1, 130_2, 130_3, 130_4, 130_5, 130_6, 130_7, 130_8, . . . may include a first switch unit SW1 and a second switch unit SW2. The first switch unit SW1 may selectively connect a corresponding first bit line to (e.g., control the corresponding first bit line to be connected to or disconnected from) a corresponding bit line sense amplifier in response to a corresponding first control signal. The second switch unit SW2 may selectively connect a corresponding second bit line (e.g., control the corresponding second bit line to be connected to or disconnected from) a global bit line connected to the corresponding bit line sense amplifier in response to a corresponding second control signal.

For example, the first switch unit SW1 of the connection unit 130_1 may selectively connect the first bit line BL12 to the bit line sense amplifier 120_2 in response to the first control signal CON_12. The second switch unit SW2 of the connection unit 130_1 may selectively connect the second bit line BL22 to the global bit line GBL2 connected to the bit line sense amplifier 120_2 in response to the second control signal CON_22. Also, the first switch unit SW1 of the connection unit 130_4 may selectively connect the first bit line BL13 to the bit line sense amplifier 120_2 in response to the first control signal CON_12. The second switch unit SW2 of the connection unit 130_4 may selectively connect the second bit line BL23 to the global bit line GBL3 connected to the bit line sense amplifier 120_2 in response to the second control signal CON_22.

In each of the plurality of connection units 130_1, 130_2, 130_3, 130_4, 130_5, 130_6, 130_7, 130_8, one of the first and second switch units SW1 and SW2 may be enabled or both of them may be disabled. If the first switch unit SW1 is disabled in response to a first control signal, then the second switch unit SW2 may be enabled or disabled in response to a corresponding second control signal. If the second switch unit SW2 is disabled in response to a second control signal, then the first switch unit SW1 may be enabled or disabled in response to a corresponding first control signal. If the first switch unit SW1 is enabled, then the first switch unit SW1 connects a corresponding first bit line to a corresponding bit line sense amplifier. If the first switch unit SW1 is disabled, then the first switch unit SW1 disconnects the corresponding first bit line from the corresponding bit line sense amplifier. If the second switch unit SW2 is enabled, then the second switch unit SW2 connects a corresponding second bit line to a corresponding global bit line. If the second switch unit SW2 is disabled, then the second switch unit SW2 disconnects the corresponding second bit line from the corresponding global bit line.

For example, if a word line connected to one of the first memory cells in the first region SMCB1 of the memory cell block 110_1 is enabled, then the first switch unit SW1 of the connection unit 130_1 may connect the first bit line BL12 to the bit line sense amplifier 120_2 in response to the first control signal CON_12, and the second switch unit SW2 of the connection unit 130_1 may disconnect the second bit line BL22 from the global bit line GBL2 in response to the second control signal CON_22.

The first switch unit SW1 may be disposed between the corresponding bit line sense amplifier and the corresponding memory cell block. The second switch unit SW2 may be disposed at a location corresponding to a center of the corresponding memory cell block. In one example, the first switch unit SW1 may be disposed at an edge of the corresponding memory cell block. For example, the first switch unit SW1 of the connection unit 130_1 may be disposed between the bit line sense amplifier 120_2 and the memory cell block 110_1, and the second switch unit SW2 may be disposed at a location corresponding to a center of the memory cell block 110_1. In another example, the first switch unit SW1 of the connection unit 130_4 may be disposed between the bit line sense amplifier 120_2 and the memory cell block 110_4, and the second switch unit SW2 may be disposed at a location corresponding to a center of the memory cell block 110_4.

Each of the second bit lines BL21, BL22, BL23, BL24, BL25, BL26, BL27, BL28, . . . may be selectively connected to a corresponding global bit line from among the plurality of global bit lines GBL1, GBL2, GBL3, GBL4, GBL5, GBL6, GBL7, GBL8, . . . , via the second switch unit SW2 of a corresponding connection unit from among the plurality of connection units 130_1, 130_2 130_3, 130_4, 130_5, 130_6, 130_7, 130_8, . . . . For example, the second bit line BL21 may be selectively connected to the global bit line GBL1 via the second switch unit SW2 of the connection unit 130_1. In another example, the second bit line BL23 may be selectively connected to the global bit line GBL3 via the second switch unit SW2 of the connection unit 130_3.

The plurality of global bit lines GBL1, GBL2, GBL3, GBL4, GBL5, GBL6, GBL7, GBL8, . . . may be poly lines or metal lines. The plurality of global bit lines GBL1, GBL2, GBL3, GBL4, GBL5, GBL6, GBL7, GBL8, . . . may be disposed on a layer that is different from a layer on which the plurality of first bit lines BL11, BL12, BL13, BL14, BL15, BL16, BL17, . . . and the plurality of second bit lines BL21, BL22, BL23, BL24, BL25, BL26, BL27, . . . are disposed. For example, the plurality of first bit lines BL11, BL12, BL13, BL14, BL15, BL16, BL17, . . . and the plurality of second bit lines BL21, BL22, BL23, BL24, BL25, BL26, BL27, . . . may be disposed on a first layer, and the plurality of global bit lines GBL1, GBL2, GBL3, GBL4, GBL5, GBL6, GBL7, GBL8, . . . may be formed on a second layer that is different from the first layer. Each of the plurality of global bit lines GBL1, GBL2, GBL3, GBL4, GBL5, GBL6, GBL7, GBL8, . . . may be disposed at a location of the second layer, which corresponds to a location between a corresponding first bit line and a corresponding second bit line. For example, the global bit line GBL2 may be disposed at a location of the second layer corresponding to the location of the first or second bit line BL12 or BL21. Otherwise, the global bit line GBL2 may be disposed at a location of the second layer corresponding to a location between the first and second bit lines BL12 and BL21. If the global bit line GBL2 is disposed at a location of the second layer corresponding to the location of the second bit line BL21, then the global bit line GBL1 is disposed at a location of the second layer corresponding to the location of the second bit line BL22, and the other global bit lines GBL3, GBL4, GBL5, GBL6, GBL7, GBL8, . . . may be disposed at locations of the second layer corresponding to the locations of the corresponding second bit lines from among the other second bit lines BL24, BL23, BL26, BL25, BL28, BL27, . . . , respectively. The plurality of global bit lines GBL1, GBL2, GBL3, GBL4, GBL5, GBL6, GBL7, GBL8, . . . may be formed on the second layer at regular or substantially regular intervals.

The pitches between the global bit lines GBL1, GBL2, GBL3, GBL4, GBL5, GBL6, GBL7, GBL8, . . . may be equal or substantially equal to the pitches between the first bit lines BL11, BL12, BL13, BL14, BL15, BL16, BL17, . . . or between the second bit lines BL21, BL22, BL23, BL24, BL25, BL26, BL27, . . . . If the first bit lines BL11, BL12, BL13, BL14, BL15, BL16, BL17, . . . and the second bit lines BL21, BL22, BL23, BL24, BL25, BL26, BL27, . . . are referred to as local bit lines, then the pitches between the plurality of global bit lines GBL1, GBL2, GBL3, GBL4, GBL5, GBL6, GBL7, GBL8, . . . may be double the pitches between the local bit lines.

Each of the plurality of control signal generation units 150_1, 150_2, 150_3, . . . may generate a corresponding first control signal and a corresponding second control signal based on a row address RA. For example, the control signal generation unit 150_1 may generate the first control signal CON_11 and the second control signal CON_21 based on the row address RA. The control signal generation unit 150_2 may generate the first control signal CON_12 and the second control signal CON_22 based on the row address RA, and control signal generation unit 150_3 may generate the first control signal CON_13 and the second control signal CON_23 based on the row address RA.

It is assumed that a word line connected to one of the second memory cells in the second region SMCB2 of the memory cell block 110_3, one of the first memory cells in the first region SMCB1 of the memory cell block 110_4, one of the second memory cells in the second region SMCB2 of the memory cell block 110_7, and one of the first memory cells in the first region SMCB1 of the memory cell block 110_8, is enabled. Also, it is assumed that the first switch unit SW1 is enabled when a corresponding first control signal from among the plurality of first control signals CON_11, CON_12, CON_13, . . . has a first voltage, but is disabled when the corresponding first control signal has a second voltage. Also, it is assumed that the second switch unit SW2 is enabled when a corresponding second control signal from among the plurality of second control signals CON_21, CON_22, CON_23, . . . has the first voltage, but is disabled when the corresponding second control signal has the second voltage.

In this case, the control signal generation unit 150_2 generates the first control signal CON_12 having the first voltage and the second control signal CON_22 having the second voltage based on the row address RA. The control signal generation unit 150_3 generates the first control signal CON_13 having the second voltage and the second control signal CON_23 having the first voltage based on the row address RA. The other control signal generation units 150_1, . . . may generate the first control signals CON_11, . . . and the second control signals CON_21, . . . that each have the second voltage, based on the row address RA. Thus, the first switches SW1 of the connection units 130_1, 130_4, 130_5, 130_8, . . . to which the first control signal CON_12 is supplied, and the second switches SW2 of the connection units 130_3, 130_7, . . . to which the second control signal CON_23 is supplied, are enabled. The other first and second switches SW1 and SW2 are disabled.

Accordingly, the bit line sense amplifier 120_2 may sense and amplify data stored in a first memory cell connected to the enabled word line from among the first memory cells in the first region SMCB1 of the memory cell block 110_4. The bit line sense amplifier 120_3 may sense and amplify data stored in a second memory cell connected to the enabled word line from among the second memory cells in the second region SMCB2 of the memory cell block 110_3. The bit line sense amplifier 120_5 may sense and amplify data stored in a first memory cell connected to the enabled word line from among the first memory cells in the first region SMCB1 of the memory cell block 110_8. Also, the bit line sense amplifier 120_6 may sense and amplify data stored in a second memory cell connected to the enabled word line from among the second memory cells in the second region SMCB2 of the memory cell block 110_7. The first switches SW1 of the connection units 130_1 and 130_5 are enabled, but the word lines connected to the first memory cells in the first regions SMCB1 of the memory cell blocks 110_1 and 110_5 are disabled. Thus, the bit line sense amplifiers 120_2 and 120_5 do not sense and amplify data stored in the first memory cells of the first regions SMCB1 of the memory cell blocks 110_1 and 110_5, respectively.

According to at least some example embodiments of inventive concepts, only one of the plurality of first control signals CON_11, CON_12, CON_13, . . . has the first voltage, and the other first control signals have the second voltage. Also, only one of the plurality of second control signals CON_21, CON_22, CON_23, . . . has the first voltage, and the other second control signals have the second voltage. Here, a first control signal and a second control signal having the first voltage may be selected according to the address of a word line to be enabled.

If the semiconductor memory device 100 performs a pre-charging operation, then the plurality of control signal generation units 150_1, 150_2, 150_3, . . . may generate the plurality of first control signals CON_11, CON_12, CON_13, . . . and the plurality of second control signals CON_21, CON_22, CON_23, . . . that each have a third voltage. If all of the first control signals CON_11, CON_12, CON_13, . . . and the second control signals CON_21, CON_22, CON_23, . . . have the third voltage, then all of the first switch units SW1 and the second switches SW2 may be enabled.

Figure 2:
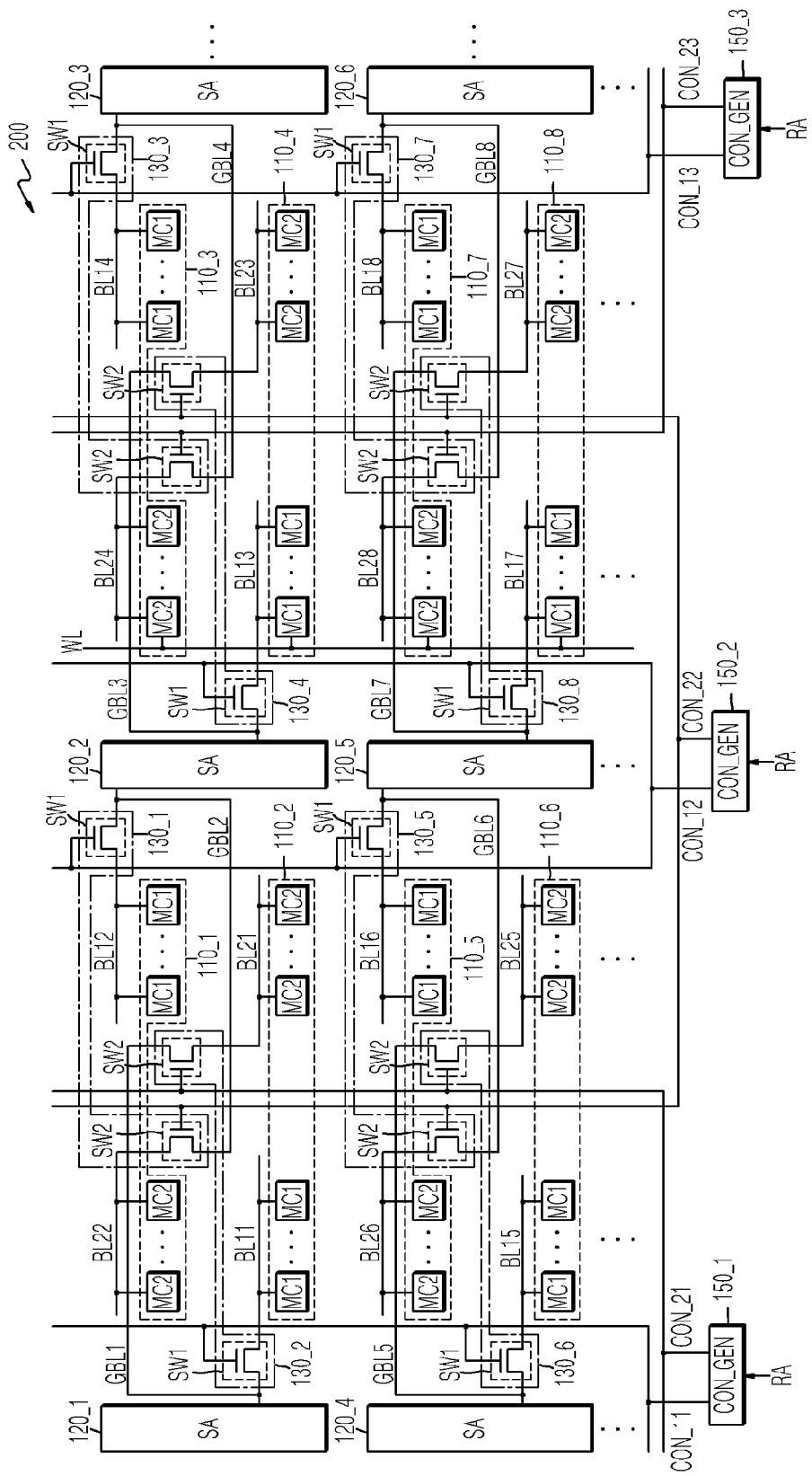
FIG. 2 is a circuit diagram of a semiconductor memory device, such as the semiconductor memory device of FIG. 1, according to an example embodiment of inventive concepts.

FIG. 2 is a circuit diagram of a semiconductor memory device 200, such as the semiconductor memory device 100 of FIG. 1, according to an example embodiment of inventive concepts. In FIGS. 1 and 2, the same reference numerals denote the same elements.

Referring to FIG. 2, the semiconductor memory device 200 may include a plurality of memory cell blocks 110_1, 110_2, 110_3, 110_4, 110_5, 110_6, 110_7, 110_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 120_1, 120_2, 120_3, 120_4, 120_5, 120_6, . . . , a plurality of connection units 130_1, 130_2, 130_3, 130_4, 130_5, 130_6, 130_7, 130_8, . . . , and a plurality of control signal generation units 150_1, 150_2, 150_3, . . . .

Each of the plurality of memory cell blocks 110_1, 110_2, 110_3, 110_4, 110_5, 110_6, 110_7, 110_8, . . . may include a plurality of first memory cells MC1 and a plurality of second memory cells MC2. Each of the first regions SMCB1 illustrated in FIG. 1 may include the first memory cells MC1 of FIG. 2, and each of the second regions SMCB2 illustrated in FIG. 1 may include the second memory cells MC2 of FIG. 2. For example, the first memory cells MC1 of the memory cell block 110_1 may be included in the first region SMCB1 of the memory cell block 110_1 of FIG. 1, and the second memory cells MC2 of the memory cell block 110_1 may be included in the second region SMCB2 of the memory cell block 110_1 of FIG. 1. The first memory cells MC1 may be connected to a corresponding first bit line from among the plurality of first bit lines BL11, BL12, BL13, BL14, BL15, BL16, BL17, . . . , and the second memory cells MC2 may be connected to a corresponding second bit line from among the plurality of second bit lines BL21, BL22, BL23, BL24, BL25, BL26, BL27, . . . . For example, the first memory cells MC1 and the second memory cells MC2 of the memory cell block 110_1 may be connected to the first bit line BL12 and the second bit line BL22, respectively.

The first and/or second memory cells MC1 and/or MC2 may include one transistor and one capacitor. A gate and first terminal of the transistor of the first memory cell MC1 may be connected to a corresponding word line and a corresponding second bit line, respectively. The capacitor of the first memory cell MC1 may be connected between a second terminal of the transistor and a ground voltage source. A gate and a first terminal of the transistor of the second memory cell MC2 may be connected to the corresponding word line and a corresponding second bit line, respectively. The capacitor of the second memory cell MC2 may be connected between a second terminal of the transistor and the ground voltage source.

The structures and connections of the memory cell blocks 110_1, 110_2, 110_3, 110_4, 110_5, 110_6, 110_7, 110_8, ... are the same as or similar to those as described above with reference to FIG. 1, and thus, will not be described again here.

Each of the bit line sense amplifiers 120_1, 120_2, 120_3, 120_4, 120_5, 120_6, ... may be connected to the first or second memory cells MC1 or MC2 of a corresponding memory cell block from among the plurality of memory cell blocks 110_1, 110_2, 110_3, 110_4, 110_5, 110_6, 110_7, 110_8, .... In this example, each of the plurality of bit line sense amplifiers 120_1, 120_2, 120_3, 120_4, 120_5, 120_6, ... may sense and amplify data stored in the first or second memory cells MC1 or MC2 of the corresponding memory cell block. For example, the bit line sense amplifier 120_2 may be connected to the first memory cells MC1 of the memory cell block 110_1 via the first bit line BL12, or may be connected to the second memory cells MC2 of the memory cell block 110_2 via the second bit line BL22 and the global bit line GBL2. Also, the bit line sense amplifier 120_2 may be connected to the first memory cells MC1 of the memory cell block 110_4 via the first bit line BL13, or may be connected to the second memory cells MC2 of the memory cell block 110_4 via the second bit line BL23 and the global bit line GBL3. The connections of the bit line sense amplifiers 120_1, 120_2, 120_3, 120_4, 120_5, 120_6, ... are the same as or similar to those described above with reference to FIG. 1.

Each of the plurality of connection units 130_1, 130_2, 130_3, 130_4, 130_5, 130_6, 130_7, 130_8, ... may connect a corresponding first bit line to a corresponding bit line sense amplifier, in response to a corresponding first control signal from among a plurality of first control signals CON_11, CON_12, CON_13, ..., or may connect a corresponding second bit line to the corresponding bit line sense amplifier via a corresponding global bit line, in response to a corresponding second control signal from among a plurality of second control signals CON_21, CON_22, CON_23, ....

Each of the plurality of connection units 130_1, 130_2, 130_3, 130_4, 130_5, 130_6, 130_7, 130_8, ... may include a first switch unit SW1 and a second switch unit SW2, as illustrated in FIG. 1. As described above with reference to FIG. 1, the first switch unit SW1 may selectively connect a corresponding first bit line to a corresponding bit line sense amplifier in response to a corresponding first control signal, and the second switch unit SW2 may selectively connect a corresponding second bit line to a global bit line connected to the corresponding bit line sense amplifier in response to a corresponding second control signal.

FIG. 2 illustrates an example case in which the first switch unit SW1 and the second switch unit SW2 of FIG. 1 are NMOS transistors. For example, the first switch unit SW1 of the connection unit 130_1 may be an NMOS transistor that selectively connects the first bit line BL12 to the bit line sense amplifier 120_2 in response to the first control signal CON_12. The second switch unit SW2 of the connection unit 130_1 may be an NMOS transistor that selectively connects the second bit line BL22 to the global bit line GBL2 connected to the bit line sense amplifier 120_2 in response to the second control signal CON_22.

In the example embodiment of FIG. 2, if the first switch unit SW1 is an NMOS transistor, then the first switch unit SW1 may connect a corresponding first bit line to a corresponding bit line sense amplifier when the corresponding first control signal is logic high, but disconnect the corresponding first bit line from the corresponding bit line sense amplifier when the corresponding first control signal is logic low. If the second switch unit SW2 is an NMOS transistor, then the second switch unit SW2 may connect a corresponding second bit line to the corresponding bit line sense amplifier when a corresponding second control signal is logic high, but disconnect the corresponding second bit line from the corresponding bit line sense amplifier when the corresponding second control signal is logic low.

Although FIG. 2 illustrates an example case where the first switch unit SW1 and the second switch unit SW2 are NMOS transistors, example embodiments are not limited thereto. Other devices may be embodied as the first switch unit SW1 and the second switch unit SW2, as long as the other devices are capable of operating in the same or a similar manner as the first switch unit SW1 and the second switch unit SW2 described above. For example, the first switch unit SW1 and the second switch unit SW2 may be PMOS transistors. In this example, logic states of the plurality of first control signals CON_11, CON_12, CON_13, ... and the plurality of second control signals CON_21, CON_22, CON_23, ... are opposite to when the first switch unit SW1 and the second switch unit SW2 are NMOS transistors.

Each of the plurality of control signal generation units 150_1, 150_2, 150_3, ... may generate a corresponding first control signal and second control signal based on a row address RA. The structures and operations of the plurality of control signal generation units 150_1, 150_2, 150_3, ... are the same as or similar to those described above with reference to FIG. 1.

Example operation of the semiconductor memory device 100 or 200 according to an example embodiment of inventive concepts will now be described with reference to FIGS. 1 and 2.

Each of the plurality of first memory cells MC1 and the plurality of second memory cells MC2 may be connected to a corresponding word line. A case where one of a plurality of word lines is enabled will now be described. For convenience of explanation, it is assumed that a word line WL commonly connected to one second memory cell MC2 of the memory cell block 110_3, one first memory cell MC1 of the memory cell block 110_4, one second memory cell MC2 of the memory cell block 110_7, and one first memory cell MC1 of the memory cell block 110_8, is enabled. However, example embodiments are not limited to this example, and the semiconductor memory device 100 or 200 may operate according to the location of the enabled word line, as described below. Also, it is assumed that the transistors of corresponding first switch units SW1 are turned on when the first control signals CON_11, CON_12, CON_13, ... each have the first voltage, but are turned off when the first control signals CON_11, CON_12, CON_13, ... each have the second voltage. Also, it is assumed that the transistors of corresponding second switch units SW2 are turned on when the second control signals CON_21, CON_22, CON_23, ... each have the first voltage, but are turned off when the second control signals CON_21, CON_22, CON_23, ... each have the second voltage. For example, if the first switch units SW1 and the second switch units SW2 are NMOS transistors as illustrated in FIG. 2, then the first voltage may be a high voltage and the second voltage may be a low voltage.

Each of the plurality of control signal generation units 150_1, 150_2, 150_3, ... may generate a corresponding first control signal and a corresponding second control signal based on a row address RA that is the address of an enabled word line WL. In this example, the control signal generation unit 150_1 may generate the first control signal CON_11 having the second voltage and the second control signal CON_21 having the second voltage based on the address of the enabled word line WL. The control signal generation unit 150_2 may generate the first control signal CON_12 having the first voltage and the second control signal CON_22 having the second voltage based on the address of the enabled word line WL. The control signal generation unit 150_3 may generate the first control signal CON_13 having the second voltage and the second control signal CON_23 having the first voltage based on the address of the enabled word line WL. The first control signal CON_12 that controls the first switch units SW1 connected to the first memory cells MC1 connected to the enabled word line WL, may have the first voltage. The second control signal CON_23 that controls the second switch units SW2 connected to the second memory cells MC2 connected to the enabled word line WL may have the first voltage.

According to example operations of the control signal generation units 150_1, 150_2, 150_3, . . . described above, only the first control signal CON_12 and the second control signal CON_23 have the first voltage, and the other first control signals CON_11, CON_13, . . . and the other second control signals CON_21, CON_23, . . . have the second voltage. Thus, the transistors of the first switches SW1 of the connection units 130_1, 130_4, 130_5, 130_8, . . . to which the first control signal CON_12 is supplied and the transistors of the second switches SW2 of the connection units 130_3, 130_7, . . . to which the second control signal CON_23 is supplied, are turned on. The transistors of the other first and second switches SW1 and SW2 are turned off. Thus, the bit line sense amplifier 120_2 is connected to the first bit line BL12 and the first bit line BL13, and the bit line sense amplifier 120_5 is connected to the first bit line BL16 and the first bit line BL17. The bit line sense amplifier 120_3 is connected to the second bit line BL24 and the bit line sense amplifier 120_6 is connected to the second bit line BL28.

The bit line sense amplifier 120_2 may receive data from the first memory cells MC1 of the memory cell block 110_4 connected to the enabled word line WL, via the first bit line BL13, and then may sense and amplify the data. The bit line sense amplifier 120_5 may receive data from the first memory cells MC1 of the memory cell block 110_8 connected to the enabled word line WL, via the first bit line BL17, and then may sense and amplify the data. The bit line sense amplifier 120_3 may receive data from the second memory cells MC2 of the memory cell block 110_3 connected to the enabled word line WL, via the second bit line BL24 and the global bit line GBL4, and then may sense and amplify the data. The bit line sense amplifier 120_6 may receive data from the second memory cells MC2 of the memory cell block 110_7 connected to the enabled word line WL, via the second bit line BL28 and the global bit line GBL8, and then may sense and amplify the data. The first switches SW1 of the connection units 130_1, 130_5, . . . are enabled, but the first memory cells MC1 connected to the first bit lines BL12, BL16, . . . are not connected to the enabled word line WL. Thus, the bit line sense amplifiers 120_2, 120_5, . . . do not sense and amplify the data stored in the first memory cells MC1 of the memory cell blocks 110_1, 110_5, . . . , respectively.

If the semiconductor memory device 100 or 200 performs a precharging operation, then the plurality of control signal generation units 150_1, 150_2, 150_3, . . . may generate the plurality of first control signals CON_11, CON_12, CON_13, . . . and the plurality of second control signals CON_21, CON_22, CON_23, . . . that each has the third voltage. If all of the first control signals CON_11, CON_12, CON_13, . . . and the second control signals CON_21, CON_22, CON_23, . . . have the third voltage, then all of the first switch units SW1 and the second switch units SW2 may be enabled, and the semiconductor memory device 100 or 200 may perform the precharging operation. If the first switch unit SW1 and the second switch unit SW2 are NMOS transistors as described above with reference to FIG. 2, then the first voltage may be higher than the second voltage and the third voltage, and the third voltage may be higher than the second voltage. If the first switch unit SW1 and the second switch unit SW2 are PMOS transistors, then the first voltage may be lower than the second voltage and the third voltage, and the third voltage may be lower than the second voltage.

Figure 3:
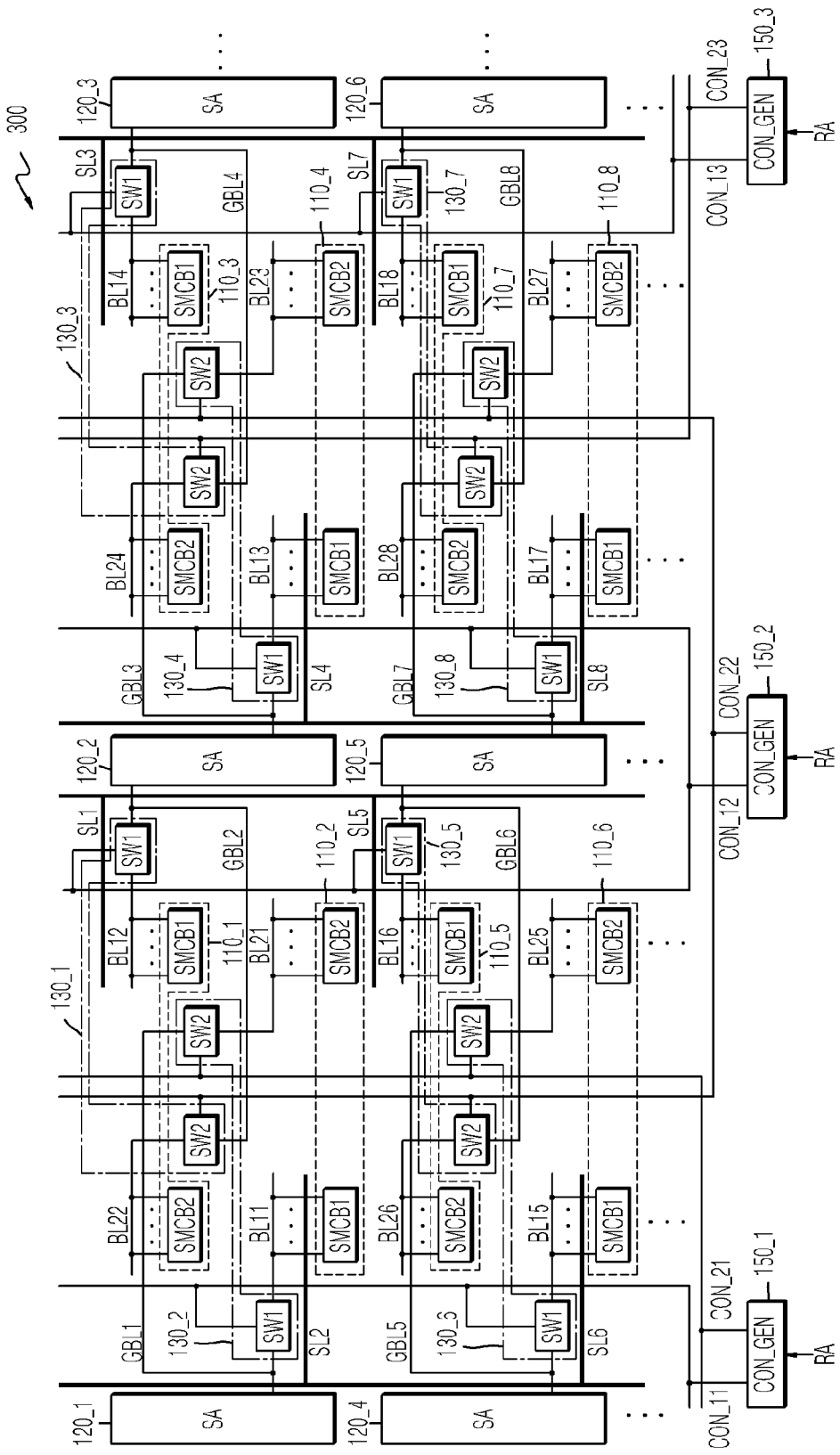
FIG. 3 is a block diagram of a semiconductor memory device according to another example embodiment of inventive concepts.

FIG. 3 is a block diagram of a semiconductor memory device 300 according to another example embodiment of inventive concepts.

Referring to FIG. 3, the semiconductor memory device 300 may include a plurality of memory cell blocks 110_1, 110_2, 110_3, 110_4, 110_5, 110_6, 110_7, 110_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 120_1, 120_2, 120_3, 120_4, 120_5, 120_6, . . . , a plurality of connection units 130_1, 130_2, 130_3, 130_4, 130_5, 130_6, 130_7, 130_8, . . . , a plurality of control signal generation units 150_1, 150_2, 150_3, . . . , and a plurality of shield lines SL1, SL2, SL3, SL4, SL5, SL6, SL7, SL8, . . . .

In FIGS. 1 to 3, the same reference numerals denote the same elements. Thus, in FIG. 3, the plurality of memory cell blocks 110_1, 110_2, 110_3, 110_4, 110_5, 110_6, 110_7, 110_8, . . . , the plurality of first bit lines BL11, BL12, BL13, BL14, BL15, BL16, BL17, . . . , the plurality of second bit lines BL21, BL22, BL23, BL24, BL25, BL26, BL27, . . . , the plurality of global bit lines GBL1, GBL2, GBL3, GBL4, GBL5, GBL6, GBL7, GBL8, . . . , the plurality of bit line sense amplifiers 120_1, 120_2, 120_3, 120_4, 120_5, 120_6, . . . , the plurality of connection units 130_1, 130_2, 130_3, 130_4, 130_5, 130_6, 130_7, 130_8, . . . , and the plurality of control signal generation units 150_1, 150_2, 150_3, . . . are the same as or similar to those described above with reference to FIG. 1, and thus, will not be described again here. The memory cell blocks 110_1, 110_2, 110_3, 110_4, 110_5, 110_6, 110_7, 110_8, . . . , and the plurality of connection units 130_1, 130_2, 130_3, 130_4, 130_5, 130_6, 130_7, 130_8, . . . may be embodied as described above with reference to FIG. 2, and thus, will not be described again here.

Each of the plurality of shield lines SL1, SL2, SL3, SL4, SL5, SL6, SL7, SL8, . . . may be disposed on the same layer as the plurality of global bit lines GBL1, GBL2, GBL3, GBL4, GBL5, GBL6, GBL7, GBL8, . . . , and between adjacent global bit lines. For example, the shield line SL2 may be disposed between the global dbit line GBL1 and the global bit line GBL5, and the shield line SL5 may be disposed between the global bit line GBL2 and the global bit line GBL6. Each of the other shield lines SL1, SL3, SL4, SL6, SL7, SL8, . . . may be disposed between a corresponding global bit line and a global bit line adjacent to the corresponding global bit line in the first direction.

Each of the shield lines SL1, SL2, SL3, SL4, SL5, SL6, SL7, SL8, . . . may be maintained at a constant or substantially constant voltage level. For example, each of the shield lines SL1, SL2, SL3, SL4, SL5, SL6, SL7, SL8, . . . may be maintained at a ground voltage level. Thus, each of the shield lines SL1, SL2, SL3, SL4, SL5, SL6, SL7, SL8, . . . may compensate for coupling between the corresponding global bit line and the global bit line adjacent to the corresponding global bit line in the first direction. For example, the shield line SL2 may compensate for coupling between the global bit line GBL1 and the global bit line GBL5, and the shield line SL5 may compensate for coupling between the global bit line GBL2 and the global bit line GBL6. Each of the other shield lines SL1, SL3, SL4, SL6, SL7, SL8, . . . may compensate for coupling between the corresponding global bit line and the global bit line adjacent to the corresponding global bit line in the first direction.

Figure 4:
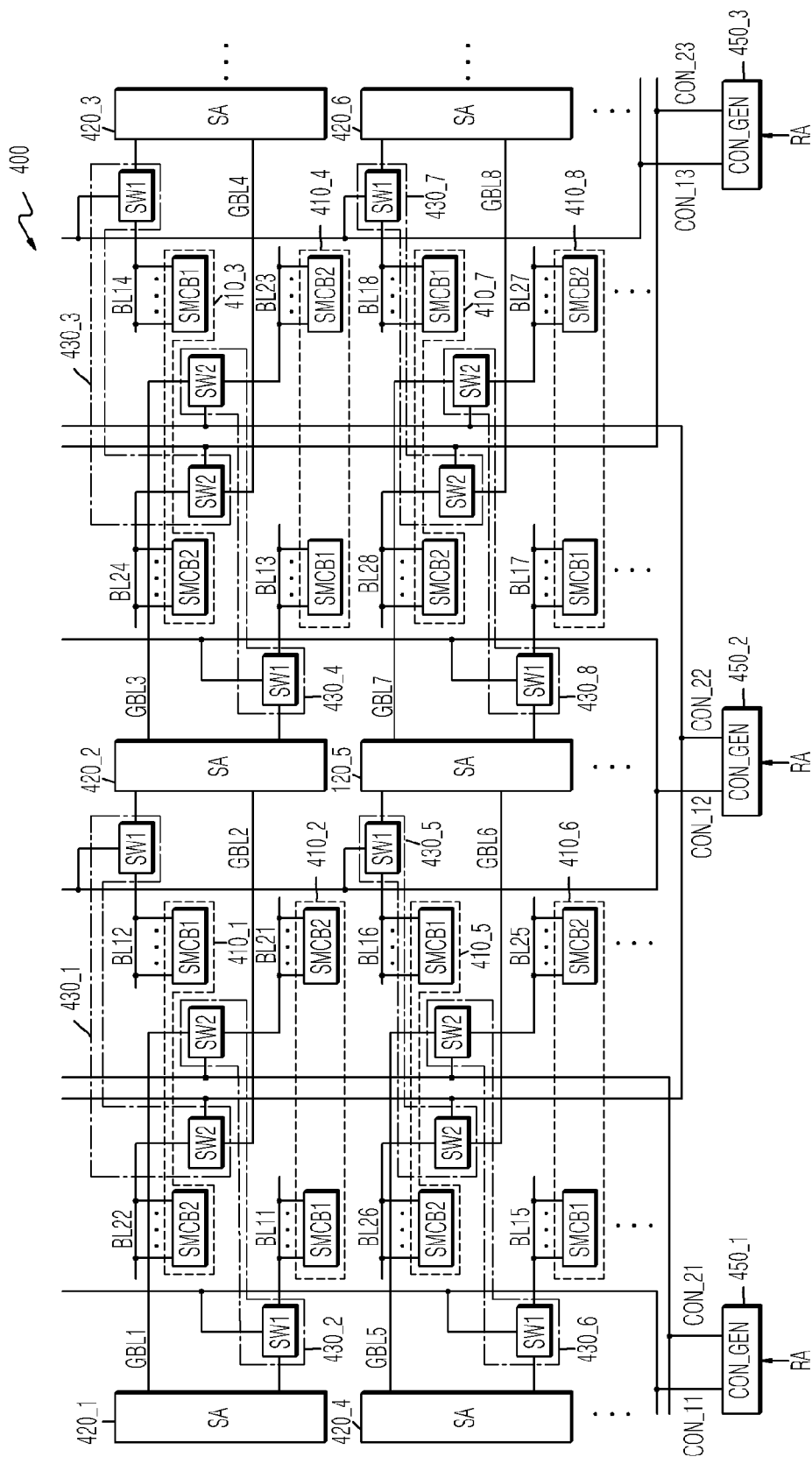
FIG. 4 is a block diagram of a semiconductor memory device according to another example embodiment of inventive concepts.

FIG. 4 is a block diagram of a semiconductor memory device 400 according to another example embodiment of inventive concepts.

Referring to FIG. 4, the semiconductor memory device 400 may include a plurality of memory cell blocks 410_1, 410_2, 410_3, 410_4, 410_5, 410_6, 410_7, 410_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 420_1, 420_2, 420_3, 420_4, 420_5, 420_6, . . . , a plurality of connection units 430_1, 430_2, 430_3, 430_4, 430_5, 430_6, 430_7, 430_8, . . . , and a plurality of control signal generation units 450_1, 450_2, 450_3, . . . .

FIG. 4 illustrates the semiconductor memory device 400 having a folded bit line architecture according to an example embodiment of inventive concepts. Thus, whereas FIG. 1 illustrates an example embodiment of the semiconductor memory device 100 having an open bit line architecture, FIG. 4 illustrates an example embodiment of a semiconductor memory device 400 having a folded bit line architecture.

Each of the plurality of memory cell blocks 410_1, 410_2, 410_3, 410_4, 410_5, 410_6, 410_7, 410_8, . . . may include a first region SMCB1 in which a plurality of first memory cells are arranged, and a second region SMCB2 in which a plurality of second memory cells are arranged, similar to the memory cell blocks 110_1, 110_2, 110_3, 110_4, 110_5, 110_6, 110_7, 110_8, . . . of FIG. 1. The structures of the plurality of memory cell blocks 410_1, 410_2, 410_3, 410_4, 410_5, 410_6, 410_7, 410_8, . . . are the same as or similar to those of the plurality of memory cell blocks 110_1, 110_2, 110_3, 110_4, 110_5, 110_6, 110_7, 110_8, . . . of FIG. 1, and thus, will not be described again here.

Each of the bit line sense amplifiers 420_1, 420_2, 420_3, 420_4, 420_5, 420_6, . . . may be connected to the first or second region SMCB1 or SMCB2 of a corresponding memory cell block from among the plurality of memory cell blocks 410_1, 410_2, 410_3, 410_4, 410_5, 410_6, 410_7, 410_8, . . . . In this example, each of the plurality of bit line sense amplifiers 420_1, 420_2, 420_3, 420_4, 420_5, 420_6, . . . may sense and amplify data stored in the first or second memory cells of the corresponding memory cell block.

Because the semiconductor memory device 400 has the folded bit line architecture, each of the plurality of bit line sense amplifiers 420_1, 420_2, 420_3, 420_4, 420_5, 420_6, . . . may include an input terminal connected to one of the first and second region SMCB1 and SMCB2 of an adjacent memory cell block, and an inversion input terminal connected to the other first or second region SMCB1 or SMCB2 of the adjacent memory cell block. For example, the first bit line BL13 may be connected to the input terminal of the bit line sense amplifier 420_2, or the second bit line BL23 may be connected to the inversion input terminal of the bit line sense amplifier 420_2 via the global bit line GBL3. Otherwise, the first bit line BL13 may be connected to the inversion input terminal of the bit line sense amplifier 420_2, or the second bit line BL23 may be connected to the input terminal of the bit line sense amplifier 420_2 via the global bit line GBL3. Similarly, the input terminal of each of the other bit line sense amplifiers 420_1, 420_3, 420_4, 420_5, 420_6, . . . may be connected to the first or second bit line connected to an adjacent memory cell, and the inversion input terminal thereof may be connected to the other bit line.

Each of the plurality of connection units 430_1, 430_2, 430_3, 430_4, 430_5, 430_6, 430_7, 430_8, . . . may connect a corresponding first bit line to a corresponding bit line sense amplifier in response to a corresponding first control signal from among a plurality of first control signals CON_11, CON_12, CON_13, . . . , or may connect a corresponding second bit line to the corresponding bit line sense amplifier via a corresponding global bit line in response to a corresponding second control signal from among a plurality of second control signals CON_21, CON_22, CON_23, . . . . Each of the plurality of connection units 430_1, 430_2, 430_3, 430_4, 430_5, 430_6, 430_7, 430_8, . . . may include a first switch unit SW1 and a second switch unit SW2. The first switch unit SW1 may selectively connect the corresponding first bit line to the corresponding bit line sense amplifier in response to the corresponding first control signal. The second switch unit SW2 may selectively connect a corresponding second bit line to a global bit line, which is connected to the corresponding bit line sense amplifier, in response to a corresponding second control signal. The structures and operations of the plurality of connection units 430_1, 430_2, 430_3, 430_4, 430_5, 430_6, 430_7, 430_8, . . . are the same as or similar to those of the plurality of connection units 130_1, 130_2, 130_3, 130_4, 130_5, 130_6, 130_7, 130_8, . . . of FIG. 1, and thus, will not be described again here.

Each of the plurality of control signal generation units 450_1, 450_2, 450_3, . . . may generate a corresponding first control signal and second control signal based on a row address RA. The structures and operations of the plurality of control signal generation units 450_1, 450_2, 450_3, . . . are the same as or similar to those of the plurality of control signal generation units 150_1, 150_2, 150_3, . . . of FIG. 1, and thus, will not be described again here.

The plurality of global bit lines GBL1, GBL2, GBL3, GBL4, GBL5, GBL6, GBL7, GBL8, . . . may be poly lines or metal lines. Each of the plurality of global bit lines GBL1, GBL2, GBL3, GBL4, GBL5, GBL6, GBL7, GBL8, . . . may be disposed on a layer different from a layer where the first and second bit lines are disposed, and may be disposed on a location of the different layer, which corresponds to a location between a corresponding first bit line or a corresponding second bit line. The pitches between the global bit lines GBL1, GBL2, GBL3, GBL4, GBL5, GBL6, GBL7, GBL8, . . . may be equal or substantially equal to the pitches between the first bit lines BL11, BL12, BL13, BL14, BL15, BL16, BL17, . . . or between the second bit lines BL21, BL22, BL23, BL24, BL25, BL26, BL27, . . . . The global bit lines GBL1, GBL2, GBL3, GBL4, GBL5, GBL6, GBL7, GBL8, . . . are the same as or similar to those described above with reference to FIG. 1, and thus, will not be described again here.

Figure 5:
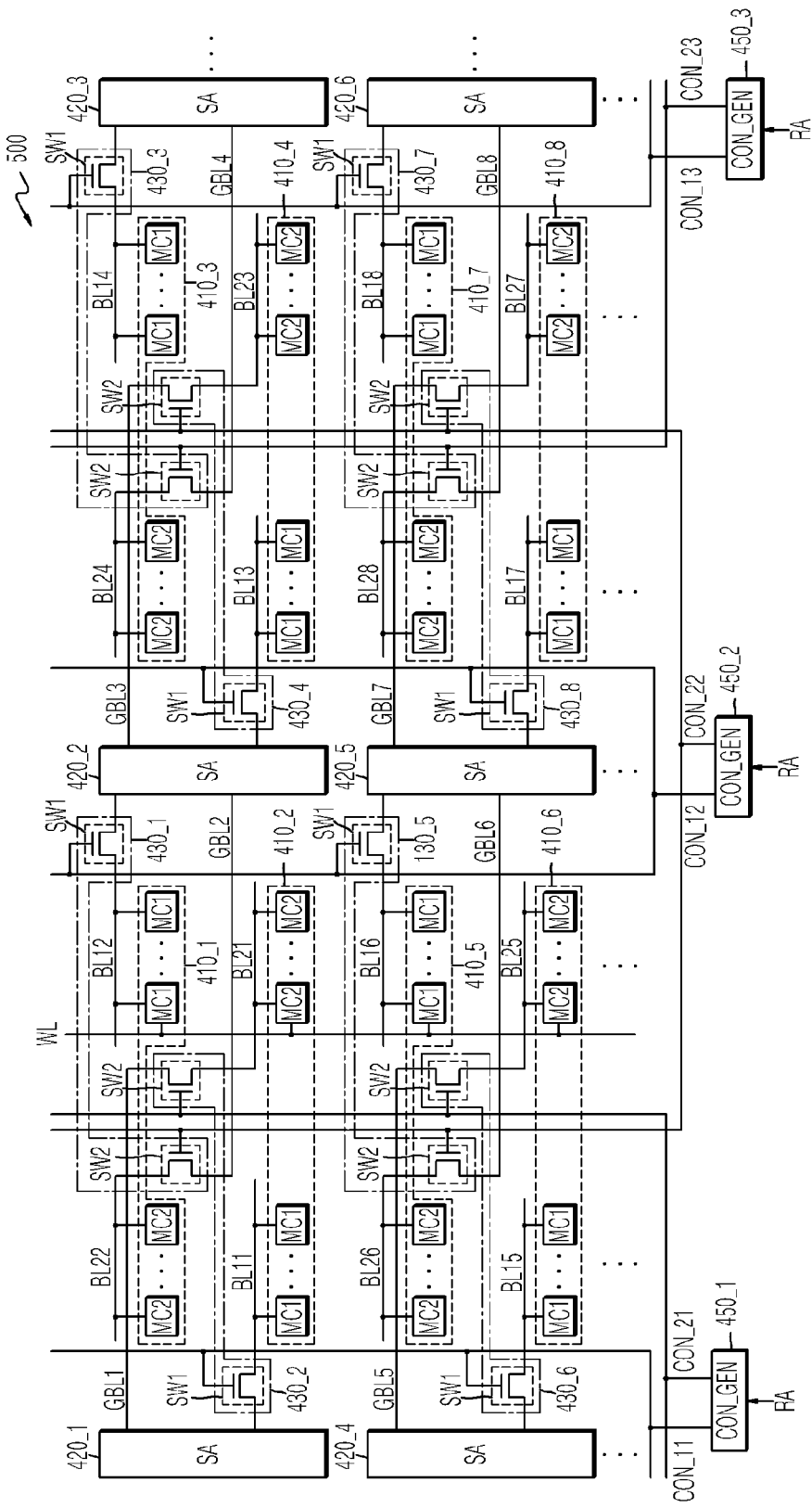
FIG. 5 is a circuit diagram of a semiconductor memory device, such as the semiconductor memory device of FIG. 4, according to another example embodiment of inventive concepts.

FIG. 5 is a circuit diagram of a semiconductor memory device 500, such as the semiconductor memory device 400 of FIG. 4, according to another example embodiment of inventive concepts.

Referring to FIG. 5, the semiconductor memory device 400 may include a plurality of memory cell blocks 410_1, 410_2, 410_3, 410_4, 410_5, 410_6, 410_7, 410_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 420_1, 420_2, 420_3, 420_4, 420_5, 420_6, . . . , a plurality of connection units 430_1, 430_2, 430_3, 430_4, 430_5, 430_6, 430_7, 430_8, . . . , and a plurality of control signal generation units 450_1, 450_2, 450_3, . . . . In FIGS. 4 and 5, the same reference numerals denote the same elements.

Each of the plurality of memory cell blocks 410_1, 410_2, 410_3, 410_4, 410_5, 410_6, 410_7, 410_8, . . . may include a plurality of first memory cells MC1 and a plurality of second memory cells MC2. The first region SMCB1 and the second region SMCB2 of FIG. 4 may include the first memory cells MC1 and the second memory cells MC2 of FIG. 5, respectively. For example, the first memory cells MC1 of the memory cell block 410_1 may be included in the first region SMCB1 of the memory cell block 410_1 of FIG. 4, and the second memory cells MC2 of the memory cell block 410_1 may be included in the second region SMCB2 of the memory cell block 410_1 of FIG. 4. The first memory cells MC1 may be connected to a corresponding first bit line from among the plurality of first bit lines BL11, BL12, BL13, BL14, BL15, BL16, BL17, . . . , and the second memory cells MC2 may be connected to a corresponding second bit line from among the plurality of second bit lines BL21, BL22, BL23, BL24, BL25, BL26, BL27, . . . . For example, the first memory cells MC1 and the second memory cells MC2 of the memory cell block 410_1 may be connected to the first bit line BL12 and the second bit line BL22, respectively.

The first memory cell MC1 and/or the second memory cell MC2 may include one transistor and one capacitor. The structures of the first memory cell MC1 and the second memory cell MC2 are the same as or similar to those described above with reference to FIG. 2, and thus, will not be described again here. The structures and connections of the memory cell blocks 410_1, 410_2, 410_3, 410_4, 410_5, 410_6, 410_7, 410_8, . . . are the same as or similar to those described above with reference to FIG. 1, and thus, will not be described again here.

Each of the plurality of bit line sense amplifiers 420_1, 420_2, 420_3, 420_4, 420_5, 420_6, . . . may be connected to the first or second memory cells MC1 or MC2 of a corresponding memory cell block from among the plurality of memory cell blocks 410_1, 410_2, 410_3, 410_4, 410_5, 410_6, 410_7, 410_8, . . . . In this example, each of the plurality of bit line sense amplifiers 420_1, 420_2, 420_3, 420_4, 420_5, 420_6, . . . may sense and amplify data stored in the first or second memory cells MC1 or MC2 of a corresponding memory cell block. For example, the bit line sense amplifier 420_2 may be connected to the first memory cells MC1 of the memory cell block 410_1 via the first bit line BL12, or may be connected to the second memory cells MC2 of the memory cell block 410_2 via the second bit line BL22 and the global bit line GBL2. Also, the bit line sense amplifier 420_2 may be connected to the first memory cells MC1 of the memory cell block 410_4 via the first bit line BL13, or may be connected to the second memory cells MC2 of the memory cell block 410_4 via the second bit line BL23 and the global bit line GBL3. The connections of the bit line sense amplifiers 420_1, 420_2, 420_3, 420_4, 420_5, 420_6, . . . are the same as or similar to those described above with reference to FIG. 4, and thus, will not be described again here.

Each of the plurality of connection units 430_1, 430_2, 430_3, 430_4, 430_5, 430_6, 430_7, 430_8, . . . may connect a corresponding first bit line to a corresponding bit line sense amplifier in response to a corresponding first control signal from among a plurality of first control signals CON_11, CON_12, CON_13, . . . , or may connect a corresponding second bit line to the corresponding bit line sense amplifier via a corresponding global bit line in response to a corresponding second control signal from among a plurality of second control signals CON_21, CON_22, CON_23, . . . .

Each of the plurality of connection units 430_1, 430_2, 430_3, 430_4, 430_5, 430_6, 430_7, 430_8, . . . may include a first switch unit SW1 and a second switch unit SW2, as illustrated in FIG. 4. As described above with reference to FIG. 4, the first switch unit SW1 may selectively connect a corresponding first bit line to a corresponding bit line sense amplifier, in response to a corresponding first control signal, and the second switch unit SW2 may selectively connect a corresponding second bit line to a global bit line, which is connected to the corresponding bit line sense amplifier, in response to a corresponding second control signal.

FIG. 5 illustrates an example embodiment in which the first switch unit SW1 and the second switch unit SW2 of FIG. 4 are NMOS transistors. An example embodiment in which the first switch units SW1 and the second switch units SW2 are NMOS transistors has been described above in detail with reference to FIG. 2. As also described above with reference to FIG. 2, example embodiments are not limited to these examples, and other devices may be embodied as the first switch units SW1 and the second switch units SW2, as long as the other devices are capable of operating in the same or a similar manner as the first switch units SW1 and the second switch units SW2 described above. For example, the first switch unit SW1 and the second switch unit SW2 may be PMOS transistors. In this example, logic states of the plurality of first control signals CON_11, CON_12, CON_13, . . . and the plurality of second control signals CON_21, CON_22, CON_23, . . . may be opposite to when the first switch unit SW1 and the second switch unit SW2 are NMOS transistors.

Each of the plurality of control signal generation units 450_1, 450_2, 450_3, . . . may generate a corresponding first control signal and second control signal based on a row address RA. The structures and operations of the plurality of control signal generation units 450_1, 450_2, 450_3, . . . are the same as or similar to those described above with reference to FIG. 4.

An example operation of the semiconductor memory device 400 or 500 according to an example embodiment of inventive concepts will now be described with reference to FIGS. 4 and 5.

Each of the plurality of first memory cells MC1 and the plurality of second memory cells MC2 may be connected to a corresponding word line. An example in which one of a plurality of word lines is enabled will now be described. For convenience of explanation, it is assumed that a word line WL being commonly connected to one first memory cell MC1 of the memory cell block 410_1, one second memory cell MC2 of the memory cell block 410_2, one first memory cell MC1 of the memory cell block 410_5, and one second memory cell MC2 of the memory cell block 410_6, is enabled. However, example embodiments are not limited to this example, and the semiconductor memory device 400 or 500 may operate according to the location of the enabled word line, as described below. Also, it is assumed that the transistors of corresponding first switch units SW1 are turned on when the first control signals CON_11, CON_12, CON_13, . . . each have the first voltage, but are turned off when the first control signals CON_11, CON_12, CON_13, . . . each have the second voltage. Also, it is assumed that the transistors of corresponding second switch units SW1 are turned on when the second control signals CON_21, CON_22, CON_23, . . . each have the first voltage, but are turned off when the second control signals CON_21, CON_22, CON_23, . . . each have the second voltage. For example, if the first switch units SW1 and the second switch units SW2 are NMOS transistors as illustrated in FIG. 5, then the first voltage may be a high voltage and the second voltage may be a low voltage. In addition, it is assumed that a first bit line is connected to an input terminal of a corresponding bit line sense amplifier via a corresponding first switch unit SW1, and a second bit line is connected to an inversion input terminal of the corresponding bit line sense amplifier via a corresponding second switch unit SW2 and a corresponding global bit line. However, example embodiments are not limited thereto, and the first bit line may be connected to the inversion input terminal of the corresponding bit line sense amplifier via the corresponding first switch unit SW1, and the second bit line may be connected to the input terminal of the corresponding bit line sense amplifier via the corresponding second switch unit SW2 and the corresponding global bit line.

Each of the plurality of control signal generation units 450_1, 450_2, 450_3, . . . may generate a corresponding first control signal and a corresponding second control signal from an address of an enabled word line WL. In this example, the control signal generation unit 450_1 may generate the first control signal CON_11 having the second voltage and the second control signal CON_21 having the first voltage based on the address of the enabled word line WL. The control signal generation unit 450_2 may generate the first control signal CON_12 having the first voltage and the second control signal CON_22 having the second voltage based on the address of the enabled word line WL. The control signal generation unit 450_3 may generate the first control signal CON_13 having the second voltage and the second control signal CON_23 having the second voltage based on the address of the enabled word line WL. In this example, the first control signal CON_12 that controls the first switch units SW1 connected to the first memory cells MC1 connected to the enabled word line WL may have the first voltage. The second control signal CON_21 that controls the second switch units SW2 connected to the second memory cells MC2 connected to the enabled word line WL, may have the first voltage.

According to the example operations of the control signal generation units 450_1, 450_2, 450_3, . . . described above, only the first control signal CON_12 and the second control signal CON_21 have the first voltage, and the other first control signals CON_11, CON_13, . . . and the other second control signals CON_21, CON_23, . . . have the second voltage. Thus, the transistors of the first switches SW1 of the connection units 430_1, 430_4, 430_5, 430_8, . . . to which the first control signal CON_12 is supplied, and the transistors of the second switches SW2 of the connection units 430_2, 430_6, . . . to which the second control signal CON_23 is supplied, are turned on. The transistors of the other first and second switches SW1 and SW2 are turned off. Thus, a first input terminal and second input terminal of the bit line sense amplifier 420_2 are connected to the first bit line BL12 and the first bit line BL13, respectively. A first input terminal and second input terminal of the bit line sense amplifier 420_5 are connected to the first bit line BL16 and the first bit line BL17, respectively. The inversion input terminal of the bit line sense amplifier 420_1 is connected to the second bit line BL21 and the inversion input terminal of the bit line sense amplifier 420_4 is connected to the second bit line BL25.

The bit line sense amplifier 420_2 may receive data from the first memory cells MC1 of the memory cell block 410_1 connected to the enabled word line WL, via the first bit line BL12, and then may sense and amplify the data. The bit line sense amplifier 420_5 may receive data from the first memory cells MC1 of the memory cell block 410_5 connected to the enabled word line WL, via the first bit line BL16, and then may sense and amplify the data. The bit line sense amplifier 420_1 may receive data from the second memory cells MC2 of the memory cell block 410_2 connected to the enabled word line WL, via the second bit line BL21 and the global bit line GBL1, and then may sense and amplify the data. The bit line sense amplifier 420_4 may receive data from the second memory cells MC2 of the memory cell block 410_6 connected to the enabled word line WL, via the second bit line BL25 and the global bit line GBL5, and then may sense and amplify the data. The first switches SW1 of the connection units 430_4, 430_8, . . . are enabled, but the first memory cells MC1 connected to the first bit lines BL13, BL17, . . . are not connected to the enabled word line WL. Thus, the bit line sense amplifiers 420_2, 420_5, . . . do not sense and amplify the data stored in the first memory cells MC1 of the memory cell blocks 410_1, 410_8, . . . , respectively.

If the semiconductor memory device 400 or 500 performs a precharging operation, then the plurality of control signal generation units 450_1, 450_2, 450_3, . . . may generate the plurality of first control signals CON_11, CON_12, CON_13, . . . and the plurality of second control signals CON_21, CON_22, CON_23, . . . having the third voltage. If all of the first control signals CON_11, CON_12, CON_13, . . . and the second control signals CON_21, CON_22, CON_23, . . . have the third voltage, then all of the first switch units SW1 and the second switch units SW2 may be enabled, and the semiconductor memory device 400 or 500 may perform the precharging operation. If the first switch unit SW1 and the second switch unit SW2 are NMOS transistors as described above with reference to FIG. 5, then the first voltage may be higher than the second voltage and the third voltage, and the third voltage may be higher than the second voltage. If the first switch unit SW1 and the second switch unit SW2 are PMOS transistors, then the first voltage may be lower than the second voltage and the third voltage, and the third voltage may be lower than the second voltage.

Figure 6:
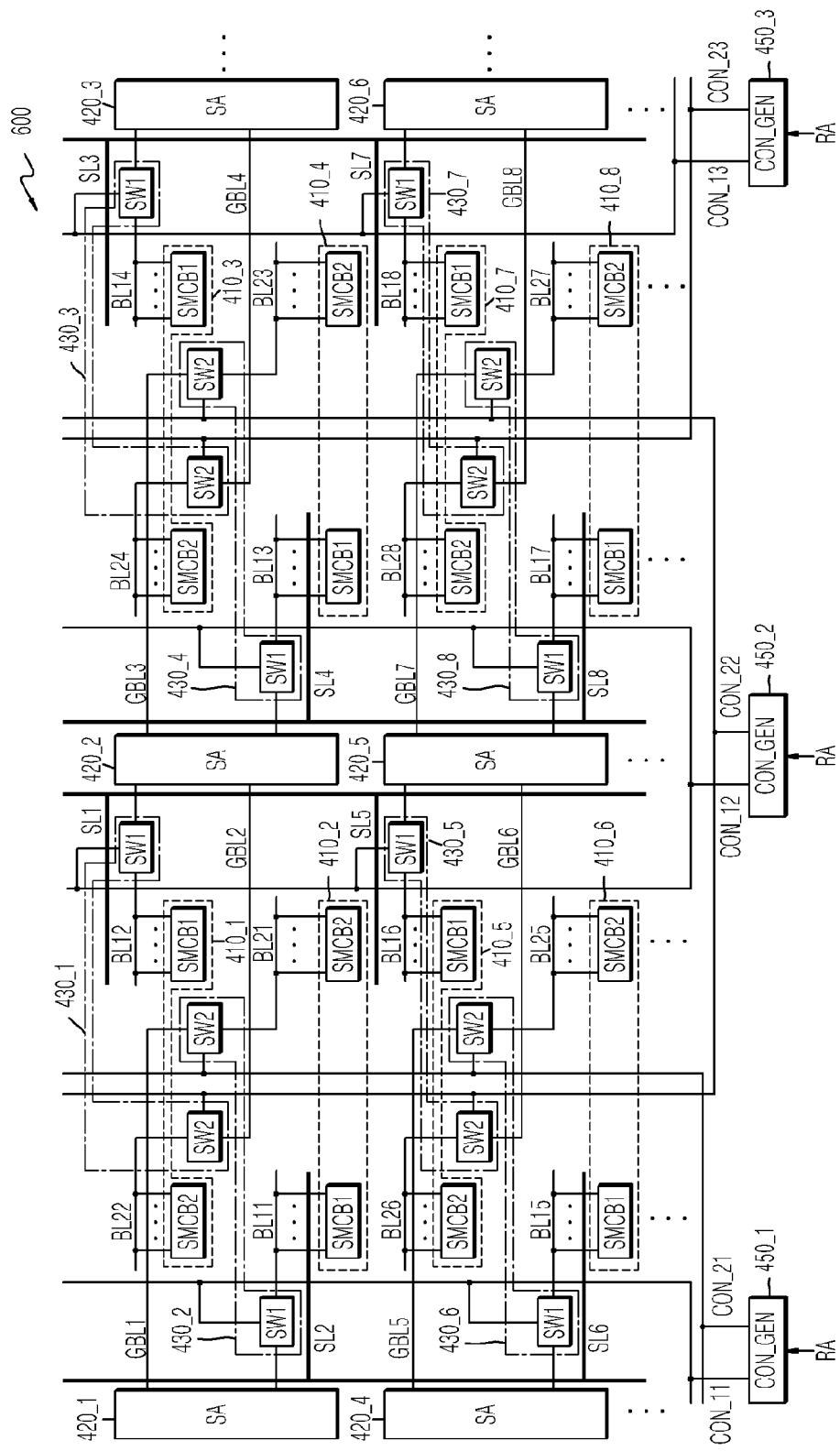
FIG. 6 is a block diagram of a semiconductor memory device according to another example embodiment of inventive concepts.

FIG. 6 is a block diagram of a semiconductor memory device 600 according to another example embodiment of inventive concepts.

Referring to FIG. 6, the semiconductor memory device 600 may include a plurality of memory cell blocks 410_1, 410_2, 410_3, 410_4, 410_5, 410_6, 410_7, 410_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 420_1, 420_2, 420_3, 420_4, 420_5, 420_6, . . . , a plurality of connection units 430_1, 430_2, 430_3, 430_4, 430_5, 430_6, 430_7, 430_8, . . . , a plurality of control signal generation units 450_1, 450_2, 450_3, . . . , and a plurality of shield lines SL1, SL2, SL3, SL4, SL5, SL6, SL7, SL8, . . . .

In FIGS. 4 to 6, the same reference numerals denote the same elements. In the example shown in FIG. 6, the plurality of memory cell blocks 410_1, 410_2, 410_3, 410_4, 410_5, 410_6, 410_7, 410_8, . . . , the plurality of first bit lines BL11, BL12, BL13, BL14, BL15, BL16, BL17, . . . , the plurality of second bit lines BL21, BL22, BL23, BL24, BL25, BL26, BL27, . . . , the plurality of global bit lines GBL1, GBL2, GBL3, GBL4, GBL5, GBL6, GBL7, GBL8, . . . , the plurality of bit line sense amplifiers 420_1, 420_2, 420_3, 420_4, 420_5, 420_6, . . . , the plurality of connection units 430_1, 430_2, 430_3, 430_4, 430_5, 430_6, 430_7, 430_8, . . . , and the plurality of control signal generation units 450_1, 450_2, 450_3, . . . are the same as or similar to those described above with reference to FIG. 4. The memory cell blocks 410_1, 410_2, 410_3, 410_4, 410_5, 410_6, 410_7, 410_8, . . . and the plurality of connection units 430_1, 430_2, 430_3, 430_4, 430_5, 430_6, 430_7, 430_8, . . . may be embodied as described above with reference to FIG. 5, and thus, will not be described again here.

Each of the plurality of shield lines SL1, SL2, SL3, SL4, SL5, SL6, SL7, SL8, . . . may be disposed on the same layer as the plurality of global bit lines GBL1, GBL2, GBL3, GBL4, GBL5, GBL6, GBL7, GBL8, . . . , and between adjacent global bit lines. For example, the shield line SL4 may be disposed between the global bit line GBL3 and the global bit line GBL7, and the shield line SL7 may be disposed between the global bit line GBL4 and the global bit line GBL8. Each of the other shield lines SL1, SL2, SL3, SL5, SL6, SL8, . . . may be disposed between a corresponding global bit line and a global bit line adjacent to the corresponding global bit line in the first direction.

Each of the shield lines SL1, SL2, SL3, SL4, SL5, SL6, SL7, SL8, . . . may be maintained at a constant or substantially constant voltage level. For example, each of the shield lines SL1, SL2, SL3, SL4, SL5, SL6, SL7, SL8, . . . may be maintained at a ground voltage level. Thus, each of the shield lines SL1, SL2, SL3, SL4, SL5, SL6, SL7, SL8, . . . may compensate for coupling between the corresponding global bit line and the global bit line adjacent to the corresponding global bit line in the first direction. The shield lines SL1, SL2, SL3, SL4, SL5, SL6, SL7, SL8, . . . are the same as or similar to those described above with reference to FIG. 3, and thus, will not be described again here.

Figure 7:
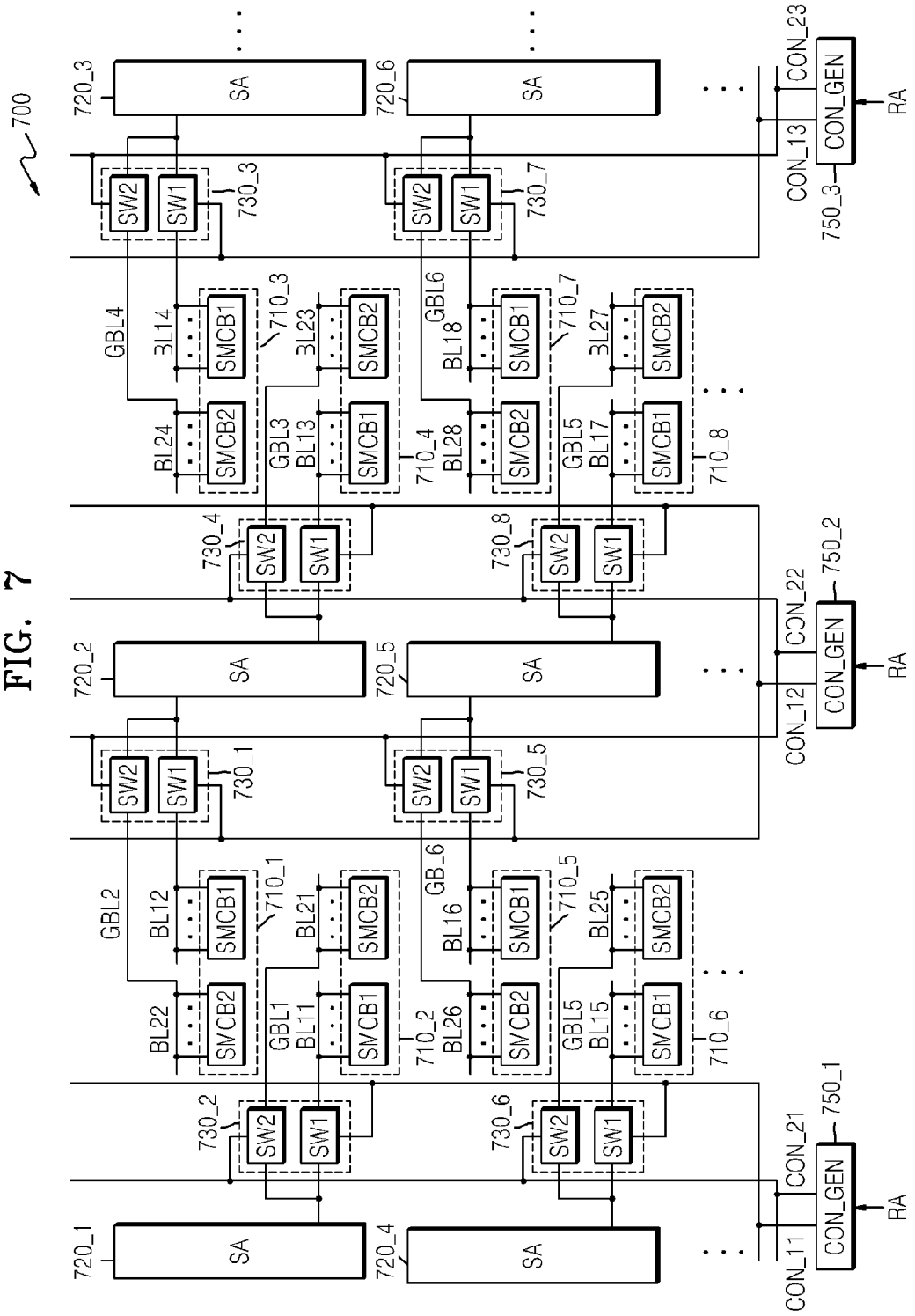
FIG. 7 is a block diagram of a semiconductor memory device according to another example embodiment of inventive concepts.

FIG. 7 is a block diagram of a semiconductor memory device 700 according to another example embodiment of inventive concepts.

Referring to FIG. 7, the semiconductor memory device 700 may include a plurality of memory cell blocks 710_1, 710_2, 710_3, 710_4, 710_5, 710_6, 710_7, 710_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 720_1, 720_2, 720_3, 720_4, 720_5, 720_6, . . . , a plurality of connection units 730_1, 730_2, 730_3, 730_4, 730_5, 730_6, 730_7, 730_8, . . . , and a plurality of control signal generation units 750_1, 750_2, 750_3, . . . .

The semiconductor memory device 700 is the same as or similar to the semiconductor memory device 100 of FIG. 1, except for locations of the plurality of connection units 730_1, 730_2, 730_3, 730_4, 730_5, 730_6, 730_7, 730_8, . . . . More specifically, for example, locations of second switch units SW2 of the semiconductor memory device 700 are different from those of the second switch units SW2 of the semiconductor memory device 100. The semiconductor memory device 700 will now be described focusing on the differences between the semiconductor memory device 700 and the semiconductor memory device 100 due to the different locations of the connection units 730_1, 730_2, 730_3, 730_4, 730_5, 730_6, 730_7, 730_8, . . . .

Each of the plurality of connection units 730_1, 730_2, 730_3, 730_4, 730_5, 730_6, 730_7, 730_8, . . . may connect a corresponding first bit line to a corresponding bit line sense amplifier in response to a corresponding first control signal from among a plurality of first control signals CON_11, CON_12, CON_13, . . . , or may connect a corresponding second bit line to the corresponding bit line sense amplifier via a corresponding global bit line in response to a corresponding second control signal from among a plurality of second control signals CON_21, CON_22, CON_23, . . . .

Each of the plurality of connection units 730_1, 730_2, 730_3, 730_4, 730_5, 730_6, 730_7, 730_8, . . . may include a first switch unit SW1 and a second switch unit SW2. The first switch unit SW1 may selectively connect a corresponding first bit line to a corresponding bit line sense amplifier in response to a corresponding first control signal. The second switch unit SW2 may selectively connect the corresponding bit line sense amplifier to a global bit line, which is connected to a corresponding second bit line, in response to a corresponding second control signal.

For example, the first switch unit SW1 of the connection unit 730_1 may selectively connect the first bit line BL12 to the bit line sense amplifier 720_2 in response to the first control signal CON_12. The second switch unit SW2 of the connection unit 730_1 may selectively connect the bit line sense amplifier 720_2 to the global bit line GBL2, which is connected to the second bit line BL22, in response to the second control signal CON_22. Also, the first switch unit SW1 of the connection unit 730_4 may selectively connect the first bit line BL13 to the bit line sense amplifier 720_2 in response to the first control signal CON_12. The second switch unit SW2 of the connection unit 730_4 may selectively connect the global bit line GBL3, which is connected to the second bit line BL23 to the bit line sense amplifier 720_2, in response to the second control signal CON_22.

One of the first and second switch units SW1 and SW2 included in each of the plurality of connection units 730_1, 730_2, 730_3, 730_4, 730_5, 730_6, 730_7, 730_8, . . . may be enabled, or both of them may be disabled. If the first switch unit SW1 is disabled in response to a first control signal, then the second switch unit SW2 may be enabled or disabled in response to a corresponding second control signal. If the second switch unit SW2 is disabled in response to a second control signal, then the first switch unit SW1 may be enabled or disabled in response to a corresponding first control signal. If the first switch unit SW1 is enabled, then the first switch unit SW1 connects a corresponding first bit line to a corresponding bit line sense amplifier. If the first switch unit SW1 is disabled, then the first switch unit SW1 disconnects the corresponding first bit line from the corresponding bit line sense amplifier. If the second switch unit SW2 is enabled, then the second switch unit SW2 connects the corresponding bit line sense amplifier to a corresponding global bit line. If the second switch unit SW2 is disabled, then the second switch unit SW2 disconnects the corresponding bit line sense amplifier from the corresponding global bit line.

For example, if a word line connected to one of first memory cells in a first region SMCB1 of the memory cell block 710_1 is enabled, then the first switch unit SW1 of the connection unit 730_1 may connect the first bit line BL12 to the bit line sense amplifier 720_2 in response to the first control signal CON_12, and the second switch unit SW2 of the connection unit 730_1 may disconnect the global bit line GBL2 from the corresponding bit line sense amplifier 720_2 in response to the second control signal CON_22.

The first switch unit SW1 and the second switch SW2 may be disposed between a corresponding bit line sense amplifier and a corresponding memory cell block. In this example, the first switch unit SW1 and the second switch unit SW2 may be disposed at an edge of the corresponding memory cell block.

FIG. 1 illustrates an example case where each second switch unit SW2 is disposed at a location corresponding to a center of a corresponding memory cell block, whereas FIG. 7 illustrates an example case where each second switch unit SW2 is disposed at an edge of a corresponding memory cell block. As shown, the first switch unit SW1 and the second switch SW2 of the connection unit 730_1 may be disposed between the bit line sense amplifier 720_2 and the memory cell block 710_1. As another example, the first switch unit SW1 and the second switch SW2 of the connection unit 730_4 may be disposed between the bit line sense amplifier 720_2 and the memory cell block 710_4.

Each of the plurality of global bit lines GBL1, GBL2, GBL3, GBL4, GBL5, GBL6, GBL7, GBL8, . . . that are connected to the plurality of second bit lines BL21, BL22, BL23, BL24, BL25, BL26, BL27, BL28, . . . , respectively, may be selectively connected to a corresponding bit line sense amplifier from among the plurality of bit line sense amplifiers 720_1, 720_2, 720_3, 720_4, 720_5, 720_6, . . . via the second switch unit SW2 of a corresponding connection unit from among the plurality of connection units 730_1, 730_2, 730_3, 730_4, 730_5, 730_6, 730_7, 730_8, . . . . For example, the global bit line GBL1 connected to the second bit line BL21 may be selectively connected to the bit line sense amplifier 720_1 via the second switch unit SW2 of the connection unit 630_1. As another example, the global bit line GBL3 connected to the second bit line BL23 may be selectively connected to the bit line sense amplifier 720_2 via the second switch unit SW2 of the connection unit 730_3.

Figure 8:
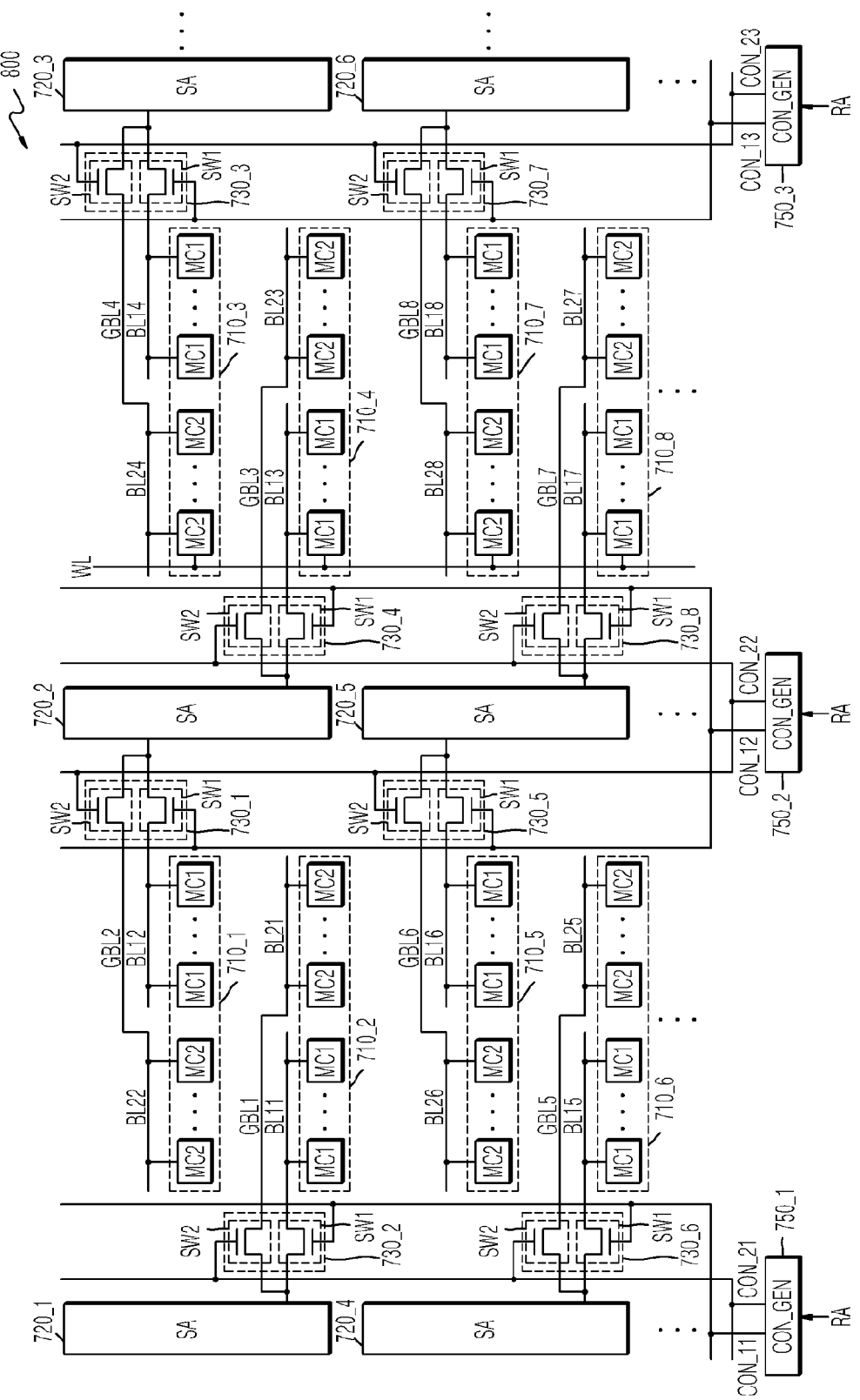
FIG. 8 is a circuit diagram of a semiconductor memory device, such as the semiconductor memory device of FIG. 7, according to another example embodiment of inventive concepts.

FIG. 8 is a circuit diagram of a semiconductor memory device 800, such as the semiconductor memory device 700 of FIG. 7, according to another example embodiment of inventive concepts.

Referring to FIG. 8, the semiconductor memory device 800 may include a plurality of memory cell blocks 710_1, 710_2, 710_3, 710_4, 710_5, 710_6, 710_7, 710_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 720_1, 720_2, 720_3, 720_4, 720_5, 720_6, . . . , a plurality of connection units 730_1, 730_2, 730_3, 730_4, 730_5, 730_6, 730_7, 730_8, . . . , and a plurality of control signal generation units 750_1, 750_2, 750_3, . . . . In FIGS. 7 and 8, the same reference numerals denote the same elements.

Each of the plurality of memory cell blocks 710_1, 710_2, 710_3, 710_4, 710_5, 710_6, 710_7, 710_8, . . . may include a plurality of first memory cells MC1 and a plurality of second memory cells MC2. The first region SMCB1 and the second region SMCB2 of FIG. 7 may include the first memory cells MC1 and the second memory cells MC2 of FIG. 8, respectively. For example, the first memory cells MC1 of the memory cell block 710_1 may be included in the first region SMCB1 of the memory cell block 710_1 of FIG. 7, and the second memory cells MC2 of the memory cell block 710_1 may be included in the second region SMCB2 of the memory cell block 710_1 of FIG. 7. The first memory cells MC1 may be connected to a corresponding first bit line from among the plurality of first bit lines BL11, BL12, BL13, BL14, BL15, BL16, BL17, . . . , and the second memory cells MC2 may be connected to a corresponding second bit line from among the plurality of second bit lines BL21, BL22, BL23, BL24, BL25, BL26, BL27, . . . . For example, the first memory cells MC1 and the second memory cells MC2 of the memory cell block 710_1 may be connected to the first bit line BL12 and the second bit line BL22, respectively.

The first memory cell MC1 or the second memory cell MC2 may include one transistor and one capacitor. The structures of the first memory cell MC1 and the second memory cell MC2 are the same as or similar to those described above with reference to FIG. 2, and thus, will not be described again here. The structures and connections of the memory cell blocks 710_1, 710_2, 710_3, 710_4, 710_5, 710_6, 710_7, 710_8, . . . are the same as or similar to those described above with reference to FIG. 7, and thus, will not be described again here.

Each of the plurality of bit line sense amplifiers 720_1, 720_2, 720_3, 720_4, 720_5, 720_6, . . . may be connected to the first or second memory cells MC1 or MC2 of a corresponding memory cell block from among the plurality of memory cell blocks 710_1, 710_2, 710_3, 710_4, 710_5, 710_6, 710_7, 710_8, . . . . In this example, each of the plurality of bit line sense amplifiers 720_1, 720_2, 720_3, 720_4, 720_5, 720_6, . . . may sense and amplify data stored in the first or second memory cells MC1 or MC2 of a corresponding memory cell block. The connections of the bit line sense amplifiers 720_1, 720_2, 720_3, 720_4, 720_5, 720_6, . . . are the same as or similar to those described above with reference to FIG. 7.

Each of the plurality of connection units 730_1, 730_2, 730_3, 730_4, 730_5, 730_6, 730_7, 730_8, . . . may connect a corresponding first bit line to a corresponding bit line sense amplifier in response to a corresponding first control signal from among a plurality of first control signals CON_11, CON_12, CON_13, . . . , or may connect a corresponding second bit line to the corresponding bit line sense amplifier via a corresponding global bit line in response to a corresponding second control signal from among a plurality of second control signals CON_21, CON_22, CON_23, . . . .

Each of the plurality of connection units 730_1, 730_2, 730_3, 730_4, 730_5, 730_6, 730_7, 730_8, . . . may include a first switch unit SW1 and a second switch unit SW2. As described above with reference to FIG. 7, the first switch unit SW1 may selectively connect a corresponding first bit line to a corresponding bit line sense amplifier in response to a corresponding first control signal, and the second switch unit SW2 may selectively connect a global bit line, which is connected to a corresponding second bit line, to the corresponding bit line sense amplifier in response to a corresponding second control signal.

FIG. 8 illustrates a case where the first switch unit SW1 and the second switch unit SW2 of FIG. 7 are NMOS transistors. In this example, the first switch unit SW1 of the connection unit 730_1 may be an NMOS transistor that selectively connects the first bit line BL12 to the bit line sense amplifier 720_2, in response to the first control signal CON_12. The second switch unit SW2 of the connection unit 730_1 may selectively connect the global bit line GBL2 connected to the second bit line BL22 to the bit line sense amplifier 720_2, in response to the second control signal CON_22.

In the example embodiment of FIG. 8, if the first switch unit SW1 is an NMOS transistor, then the first switch unit SW1 may be enabled to connect a corresponding first bit line to a corresponding bit line sense amplifier when the corresponding first control signal is logic high, but may be disabled to disconnect the corresponding first bit line from the corresponding bit line sense amplifier when the corresponding first control signal is logic low. If the second switch unit SW2 is an NMOS transistor, then the second switch unit SW2 may be enabled to connect a corresponding second bit line to the corresponding bit line sense amplifier when a corresponding second control signal is logic high, but may be disabled to disconnect the corresponding second bit line from the corresponding bit line sense amplifier when the corresponding second control signal is logic low.

Although FIG. 8 illustrates a case where the first switch unit SW1 and the second switch unit SW2 are NMOS transistors, example embodiments of inventive concepts are not limited thereto, and other devices may be embodied as the first switch unit SW1 and the second switch unit SW2, as long as the other devices are capable of operating in the same or a similar manner as the first switch unit SW1 and the second switch unit SW2 as described above. For example, the first switch unit SW1 and the second switch unit SW2 may be PMOS transistors. In this example, logic states of the plurality of first control signals CON_11, CON_12, CON_13, . . . and the plurality of second control signals CON_21, CON_22, CON_23, . . . may be opposite to when the first switch unit SW1 and the second switch unit SW2 are NMOS transistors.

Each of the plurality of control signal generation units 750_1, 750_2, 750_3, . . . may generate a corresponding first control signal and second control signal based on a row address RA. The structures and operations of the plurality of control signal generation units 750_1, 750_2, 750_3, . . . are the same as or similar to those described above with reference to FIG. 1, and thus, will not be described again here.

The semiconductor memory device 700 of FIG. 7 and the semiconductor memory device 800 of FIG. 8 operate in the same or a similar manner as the semiconductor memory device 100 of FIG. 1 and the semiconductor memory device 200 of FIG. 2, except that the locations of the second switch units SW2 are different. Thus, example operations of the semiconductor memory device 700 and the semiconductor memory device 800 will not be described again here.

Figure 9:
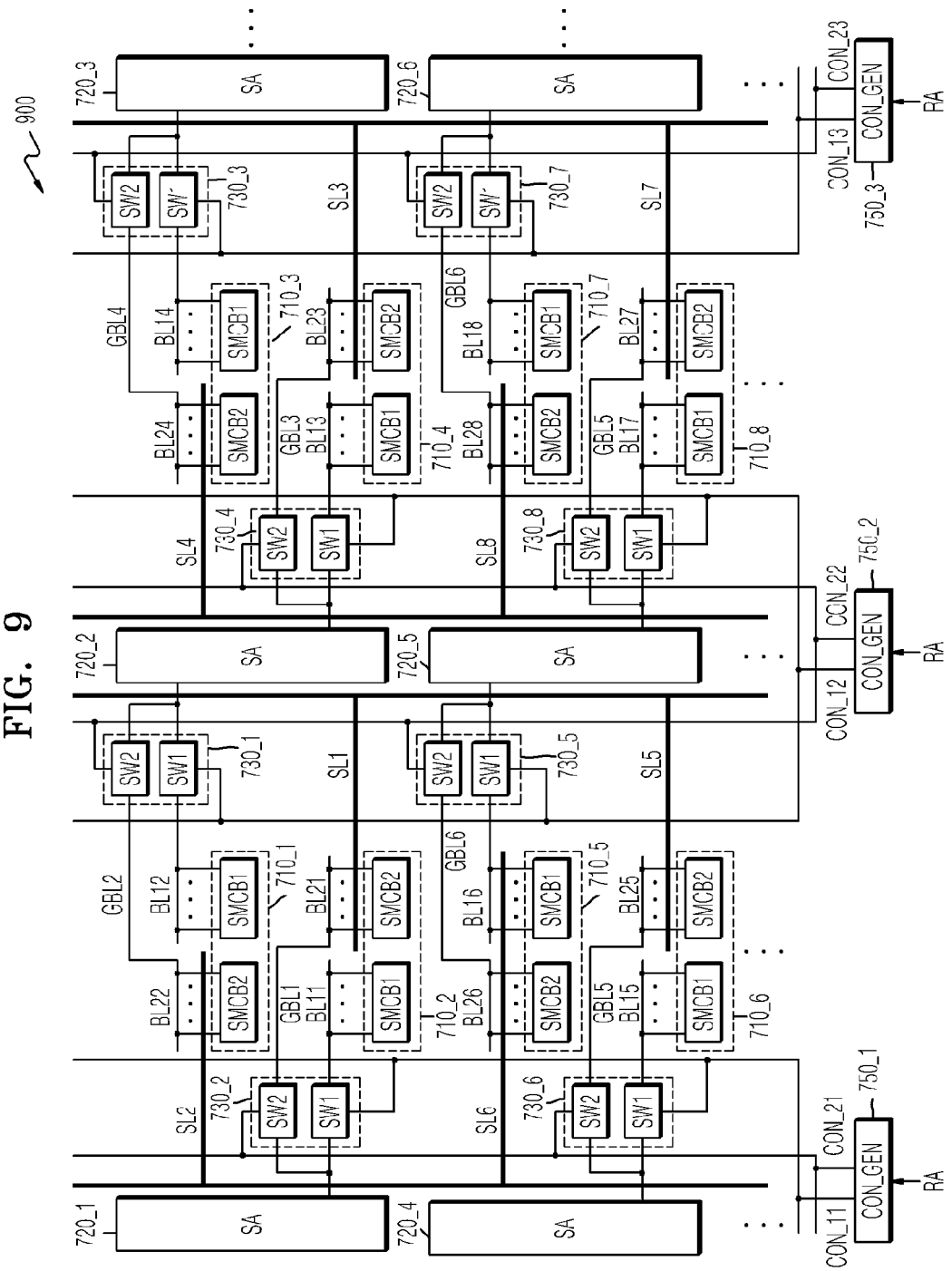
FIG. 9 is a block diagram of a semiconductor memory device according to another example embodiment of inventive concepts.

FIG. 9 is a block diagram of a semiconductor memory device 900 according to another example embodiment of inventive concepts.

Referring to FIG. 9, the semiconductor memory device 900 may include a plurality of memory cell blocks 710_1, 710_2, 710_3, 710_4, 710_5, 710_6, 710_7, 710_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 720_1, 720_2, 720_3, 720_4, 720_5, 720_6, . . . , a plurality of connection units 730_1, 730_2, 730_3, 730_4, 730_5, 730_6, 730_7, 730_8, . . . , a plurality of control signal generation units 750_1, 750_2, 750_3, . . . , and a plurality of shield lines SL1, SL2, SL3, SL4, SL5, SL6, SL7, SL8, . . . .

In FIGS. 7 to 9, the same reference numerals denote the same elements. In the example shown in FIG. 9, the plurality of memory cell blocks 710_1, 710_2, 710_3, 710_4, 710_5, 710_6, 710_7, 710_8, . . . , the plurality of first bit lines BL11, BL12, BL13, BL14, BL15, BL16, BL17, . . . , the plurality of second bit lines BL21, BL22, BL23, BL24, BL25, BL26, BL27, . . . , the plurality of global bit lines GBL1, GBL2, GBL3, GBL4, GBL5, GBL6, GBL7, GBL8, . . . , the plurality of bit line sense amplifiers 720_1, 720_2, 720_3, 720_4, 720_5, 720_6, . . . , the plurality of connection units 730_1, 730_2, 730_3, 730_4, 730_5, 730_6, 730_7, 730_8, . . . , and the plurality of control signal generation units 750_1, 750_2, 750_3, . . . are the same as or similar to those described above with reference to FIG. 7. Also, in FIG. 9, the memory cell blocks 710_1, 710_2, 710_3, 710_4, 710_5, 710_6, 710_7, 710_8, . . . and the plurality of connection units 730_1, 730_2, 730_3, 730_4, 730_5, 730_6, 730_7, 730_8, . . . may be embodied as described above with reference to FIG. 8, and thus, will not be described again here.

Each of the plurality of shield lines SL1, SL2, SL3, SL4, SL5, SL6, SL7, SL8, . . . may be disposed on the same layer as the plurality of global bit lines GBL1, GBL2, GBL3, GBL4, GBL5, GBL6, GBL7, GBL8, . . . , and between adjacent global bit lines. For example, the shield line SL1 may be disposed between the global bit line GBL2 and the global bit line GBL6, and the shield line SL6 may be disposed between the global bit line GBL1 and the global bit line GBL5. Each of the other shield lines SL2, SL3, SL4, SL5, SL7, SL8, . . . may be disposed between a corresponding global bit line and a global bit line adjacent to the corresponding global bit line in the first direction.

Each of the shield lines SL1, SL2, SL3, SL4, SL5, SL6, SL7, SL8, . . . may be maintained at a constant or substantially constant voltage level. For example, each of the shield lines SL1, SL2, SL3, SL4, SL5, SL6, SL7, SL8, . . . may be maintained at a ground voltage level. Thus, each of the shield lines SL1, SL2, SL3, SL4, SL5, SL6, SL7, SL8, . . . may compensate for coupling between the corresponding global bit line and the global bit line adjacent to the corresponding global bit line in the first direction. The shield lines SL1, SL2, SL3, SL4, SL5, SL6, SL7, SL8, . . . are the same as or similar to those described above with reference to FIG. 3, and thus, will not be described again here.

Figure 10:
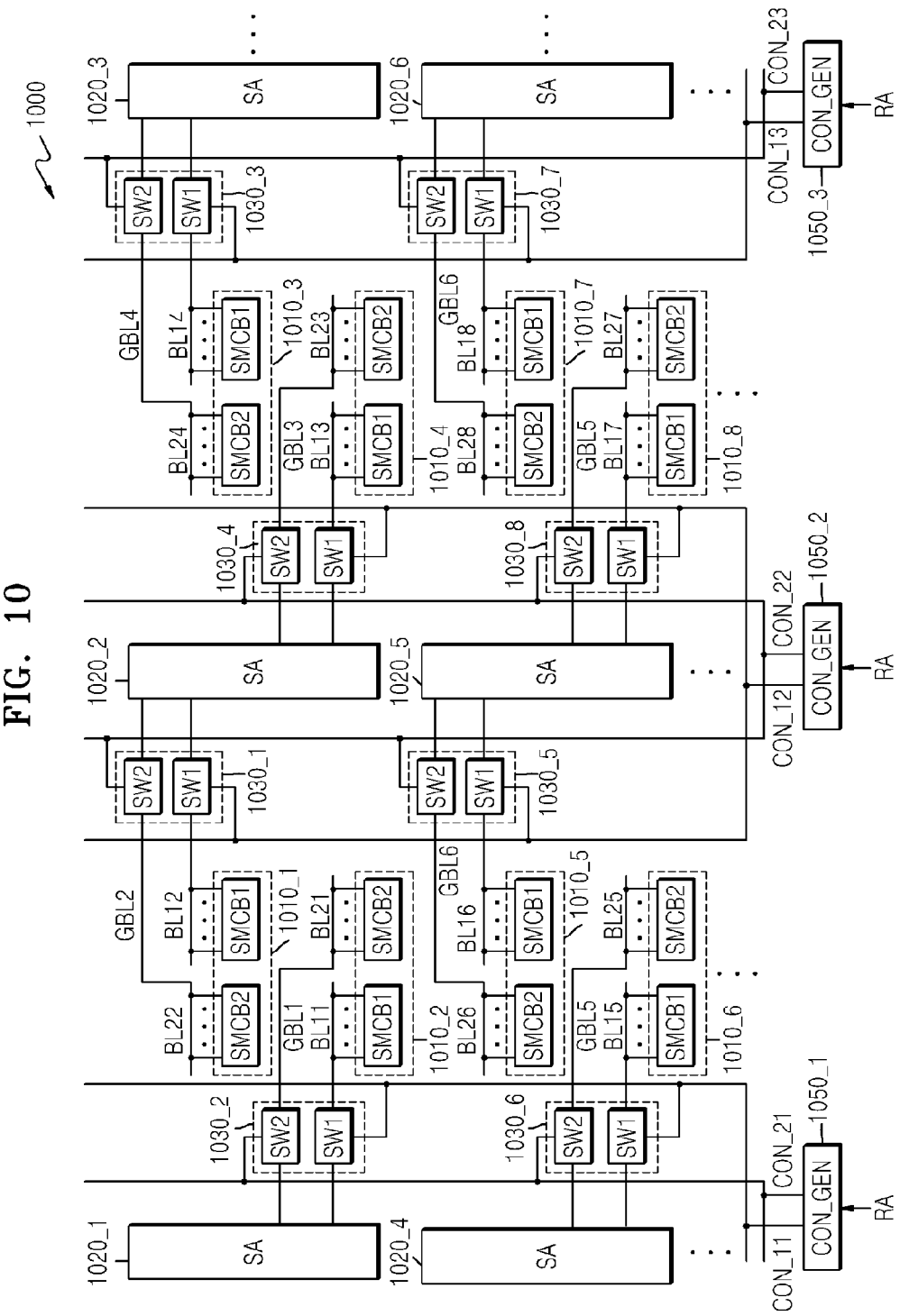
FIG. 10 is a block diagram of a semiconductor memory device according to another example embodiment of inventive concepts.

FIG. 10 is a block diagram of a semiconductor memory device 1000 according to another example embodiment of inventive concepts.

Referring to FIG. 10, the semiconductor memory device 1000 may include a plurality of memory cell blocks 1010_1, 1010_2, 1010_3, 1010_4, 1010_5, 1010_6, 1010_7, 1010_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 1020_1, 1020_2, 1020_3, 1020_4, 1020_5, 1020_6, . . . , a plurality of connection units 1030_1, 1030_2, 1030_3, 1030_4, 1030_5, 1030_6, 1030_7, 1030_8, . . . , and a plurality of control signal generation units 1050_1, 1050_2, 1050_3, . . . .

FIG. 10 illustrates an example embodiment of the semiconductor memory device 1000 having a folded bit line architecture, which is different from the example embodiment shown in FIG. 7, which illustrates the semiconductor memory device 700 having an open bit line architecture.

Each of the plurality of memory cell blocks 1010_1, 1010_2, 1010_3, 1010_4, 1010_5, 1010_6, 1010_7, 1010_8, . . . may include a first region SMCB1 in which a plurality of first memory cells are arranged, and a second region SMCB2 in which a plurality of second memory cells are arranged, similar to the memory cell blocks 710_1, 710_2, 710_3, 710_4, 710_5, 710_6, 710_7, 710_8, . . . of FIG. 7. The structures of the plurality of memory cell blocks 1010_1, 1010_2, 1010_3, 1010_4, 1010_5, 1010_6, 1010_7, 1010_8, . . . are the same as or similar to those of the plurality of memory cell blocks 710_1, 710_2, 710_3, 710_4, 710_5, 710_6, 710_7, 710_8, . . . of FIG. 7, and thus, will not be described again here.

Each of the bit line sense amplifiers 1020_1, 1020_2, 1020_3, 1020_4, 1020_5, 1020_6, . . . may be connected to the first or second region SMCB1 or SMCB2 of a corresponding memory cell block from among the plurality of memory cell blocks 1010_1, 1010_2, 1010_3, 1010_4, 1010_5, 1010_6, 1010_7, 1010_8, . . . . In this example, each of the plurality of bit line sense amplifiers 1020_1, 1020_2, 1020_3, 1020_4, 1020_5, 1020_6, . . . may sense and amplify data stored in the first or second memory cells of the corresponding memory cell block.

The semiconductor memory device 1000 has a folded bit line architecture. Thus, each of the plurality of bit line sense amplifiers 1020_1, 1020_2, 1020_3, 1020_4, 1020_5, 1020_6, . . . may include an input terminal connected to one of the first and second regions SMCB1 and SMCB2 of an adjacent memory cell block, and an inversion input terminal connected to the other first or second region SMCB1 or SMCB2 of the adjacent memory cell block. For example, the first bit line BL13 may be connected to the input terminal of the bit line sense amplifier 1020_2, or the second bit line BL23 may be connected to the inversion input terminal of the bit line sense amplifier 1020_2 via the global bit line GBL3. Otherwise, the first bit line BL13 may be connected to the inversion input terminal of the bit line sense amplifier 1020_2, or the second bit line BL23 may be connected to the input terminal of the bit line sense amplifier 1020_2 via the global bit line GBL3. Similarly, the input terminal of each of the other bit line sense amplifiers 1020_1, 1020_3, 1020_4, 1020_5, 1020_6, . . . may be connected to the first or second bit line connected to the adjacent memory cell, and the inversion input terminal thereof may be connected to the other bit line.

Each of the plurality of connection units 1030_1, 1030_2, 1030_3, 1030_4, 1030_5, 1030_6, 1030_7, 1030_8, . . . may connect a corresponding first bit line to a corresponding bit line sense amplifier in response to a corresponding first control signal from among a plurality of first control signals CON_11, CON_12, CON_13, . . . , or may connect a corresponding second bit line to the corresponding bit line sense amplifier via a corresponding global bit line in response to a corresponding second control signal from among a plurality of second control signals CON_21, CON_22, CON_23, . . . . Each of the plurality of connection units 1030_1, 1030_2, 1030_3, 1030_4, 1030_5, 1030_6, 1030_7, 1030_8, . . . may include a first switch unit SW1 and a second switch unit SW2. The first switch unit SW1 may selectively connect a corresponding first bit line to a corresponding bit line sense amplifier in response to a corresponding first control signal. The second switch unit SW2 may selectively connect a corresponding second bit line to a global bit line connected to the corresponding bit line sense amplifier, in response to a corresponding second control signal. The structures and operations of the plurality of the connection units 1030_1, 1030_2, 1030_3, 1030_4, 1030_5, 1030_6, 1030_7, 1030_8, . . . are the same as or similar to those of the plurality of connection units 730_1, 730_2, 730_3, 730_4, 730_5, 730_6, 730_7, 730_8, . . . of FIG. 7, and thus, will not be described again here.

Each of the plurality of control signal generation units 1050_1, 1050_2, 1050_3, . . . may generate a corresponding first control signal and second control signal based on a row address RA. The structures and operations of the plurality of control signal generation units 1050_1, 1050_2, 1050_3, . . . are the same as or similar to those of the plurality of control signal generation units 750_1, 750_2, 750_3, . . . of FIG. 7, and thus, will not be described again here.

The plurality of global bit lines GBL1, GBL2, GBL3, GBL4, GBL5, GBL6, GBL7, GBL8, . . . may be poly lines or metal lines. Each of the plurality of global bit lines GBL1, GBL2, GBL3, GBL4, GBL5, GBL6, GBL7, GBL8, . . . may be disposed on a layer different from a layer where the first and second bit lines are disposed, and may be disposed at a location of the different layer, which corresponds to a location between a corresponding first bit line and a corresponding second bit line. The pitches between the global bit lines GBL1, GBL2, GBL3, GBL4, GBL5, GBL6, GBL7, GBL8, . . . may be equal or substantially equal to the pitches between the first bit lines BL11, BL12, BL13, BL14, BL15, BL16, BL17, . . . or between the second bit lines BL21, BL22, BL23, BL24, BL25, BL26, BL27, . . . . The global bit lines GBL1, GBL2, GBL3, GBL4, GBL5, GBL6, GBL7, GBL8, . . . are the same as or similar to those described above with reference to FIG. 1, and thus, will not be described again here.

Figure 11:
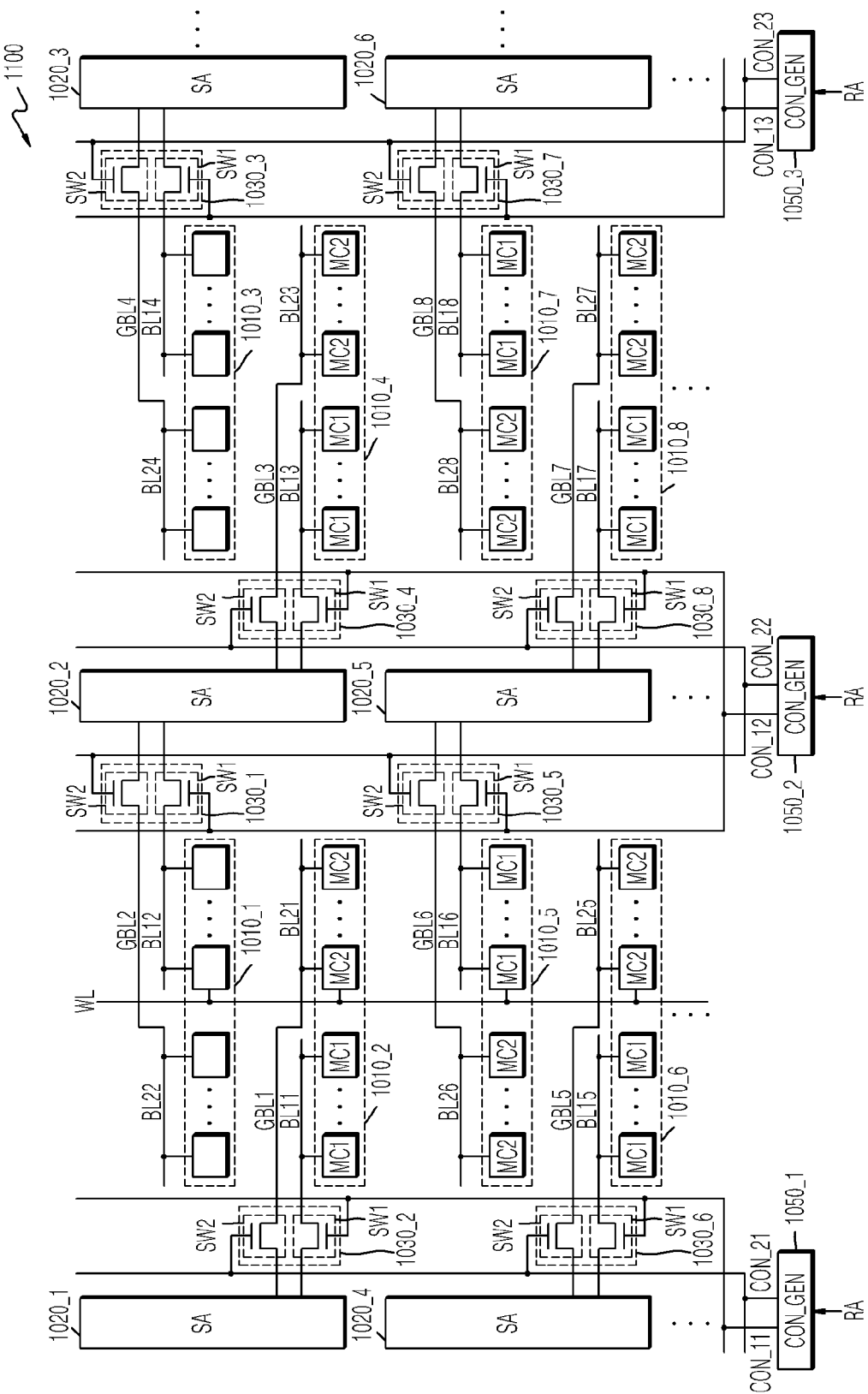
FIG. 11 is a circuit diagram of a semiconductor memory device, such as the semiconductor memory device of FIG. 10, according to another example embodiment of inventive concepts.

FIG. 11 is a circuit diagram of a semiconductor memory device 1100, such as the semiconductor memory device 1000 of FIG. 10, according to another example embodiment of inventive concepts.

Referring to FIG. 11, the semiconductor memory device 1100 may include a plurality of memory cell blocks 1010_1, 1010_2, 1010_3, 1010_4, 1010_5, 1010_6, 1010_7, 1010_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 1020_1, 1020_2, 1020_3, 1020_4, 1020_5, 1020_6, . . . , a plurality of connection units 1030_1, 1030_2, 1030_3, 1030_4, 1030_5, 1030_6, 1030_7, 1030_8, . . . , and a plurality of control signal generation units 1050_1, 1050_2, 1050_3, . . . . In FIGS. 10 and 11, the same reference numerals denote the same elements.

Each of the plurality of memory cell blocks 1010_1, 1010_2, 1010_3, 1010_4, 1010_5, 1010_6, 1010_7, 1010_8, . . . may include a plurality of first memory cells MC1 and a plurality of second memory cells MC2. The first region SMCB1 and the second region SMCB2 of FIG. 10 may include the first memory cells MC1 and the second memory cells MC2 of FIG. 11, respectively. For example, the first memory cells MC1 of the memory cell block 1010_1 may be included in the first region SMCB1 of the memory cell block 1010_1 of FIG. 10, and the second memory cells MC2 of the memory cell block 1010_1 may be included in the second region SMCB2 of the memory cell block 1010_1 of FIG. 10. The first memory cells MC1 may be connected to a corresponding first bit line from among the plurality of first bit lines BL11, BL12, BL13, BL14, BL15, BL16, BL17, . . . , and the second memory cells MC2 may be connected to a corresponding second bit line from among the plurality of second bit lines BL21, BL22, BL23, BL24, BL25, BL26, BL27, . . . . For example, the first memory cells MC1 and the second memory cells MC2 of the memory cell block 1010_1 may be connected to the first bit line BL12 and the second bit line BL22, respectively.

The first memory cell MC1 or the second memory cell MC2 may include one transistor and one capacitor. The structures of the first memory cell MC1 and the second memory cell MC2 are as described above with reference to FIG. 2, and thus, will not be described again here. The structures and connections of the memory cell blocks 1010_1, 1010_2, 1010_3, 1010_4, 1010_5, 1010_6, 1010_7, 1010_8, . . . are the same as or similar to those described above with reference to FIG. 10, and thus, will not be described again here.

Each of the plurality of bit line sense amplifiers 1020_1, 1020_2, 1020_3, 1020_4, 1020_5, 1020_6, . . . may be connected to the first or second memory cells MC1 or MC2 of a corresponding memory cell block from among the plurality of memory cell blocks 1010_1, 1010_2, 1010_3, 1010_4, 1010_5, 1010_6, 1010_7, 1010_8, . . . . In this example, each of the plurality of bit line sense amplifiers 1020_1, 1020_2, 1020_3, 1020_4, 1020_5, 1020_6, . . . may sense and amplify data stored in the first or second memory cells MC1 or MC2 of a corresponding memory cell block. For example, the bit line sense amplifier 1020_2 may be connected to the first memory cells MC1 of the memory cell block 1010_1 via the first bit line BL12, or may be connected to the second memory cells MC2 of the memory cell block 1010_2 via the second bit line BL22 and the global bit line GBL2. Also, the bit line sense amplifier 1020_2 may be connected to the first memory cells MC1 of the memory cell block 1010_4 via the first bit line BL13, or may be connected to the second memory cells MC2 of the memory cell block 1010_4 via the second bit line BL23 and the global bit line GBL3. The connections of the bit line sense amplifiers 1020_1, 1020_2, 1020_3, 1020_4, 1020_5, 1020_6, . . . are the same as or similar to those described above with reference to FIG. 7.

Each of the plurality of connection units 1030_1, 1030_2, 1030_3, 1030_4, 1030_5, 1030_6, 1030_7, 1030_8, . . . may connect a corresponding first bit line to a corresponding bit line sense amplifier in response to a corresponding first control signal from among a plurality of first control signals CON_11, CON_12, CON_13, . . . , or may connect a corresponding second bit line to the corresponding bit line sense amplifier via a corresponding global bit line in response to a corresponding second control signal from among a plurality of second control signals CON_21, CON_22, CON_23, . . . .

Each of the plurality of connection units 1030_1, 1030_2, 1030_3, 1030_4, 1030_5, 1030_6, 1030_7, 1030_8, . . . may include a first switch unit SW1 and a second switch unit SW2, as described above with reference to FIG. 10. As described above with reference to FIG. 10, the first switch unit SW1 may selectively connect a corresponding first bit line to a corresponding bit line sense amplifier in response to a corresponding first control signal, and the second switch unit SW2 may selectively connect a global bit line, which is connected to a corresponding second bit line, to the corresponding bit line sense amplifier in response to a corresponding second control signal.

FIG. 11 illustrates an example in which the first switch unit SW1 and the second switch unit SW2 of FIG. 10 are NMOS transistors. An example where the first switch unit SW1 and the second switch unit SW2 are NMOS transistors has been described above in detail with reference to FIG. 8. Also, as described above with reference to FIG. 8, example embodiments are not limited to examples where the first switch unit SW1 and the second switch unit SW2 are NMOS transistors, and other devices may be embodied as the first switch unit SW1 and the second switch unit SW2 as long as the other devices are capable of operating in the same or a similar manner as the first switch unit SW1 and the second switch unit SW2 described above. For example, the first switch unit SW1 and the second switch unit SW2 may be PMOS transistors. In this example, logic states of the plurality of first control signals CON_11, CON_12, CON_13, . . . and the plurality of second control signals CON_21, CON_22, CON_23, . . . may be opposite to when the first switch unit SW1 and the second switch unit SW2 are NMOS transistors.

Each of the plurality of control signal generation units 1050_1, 1050_2, 1050_3, . . . may generate a corresponding first control signal and second control signal based on a row address RA. The structures and operations of the plurality of control signal generation units 1050_1, 1050_2, 1050_3, . . . are the same as or similar to those described above with reference to FIG. 10.

The semiconductor memory device 1000 of FIG. 10 and the semiconductor memory device 1100 of FIG. 11 operate in the same or a similar manner to the semiconductor memory device 400 of FIG. 4 and the semiconductor memory device 500 of FIG. 5, except that the locations of the second switch units SW2 are different. Thus, the operations of the semiconductor memory device 1000 and the semiconductor memory device 1100 will not be described again here.

Figure 12:
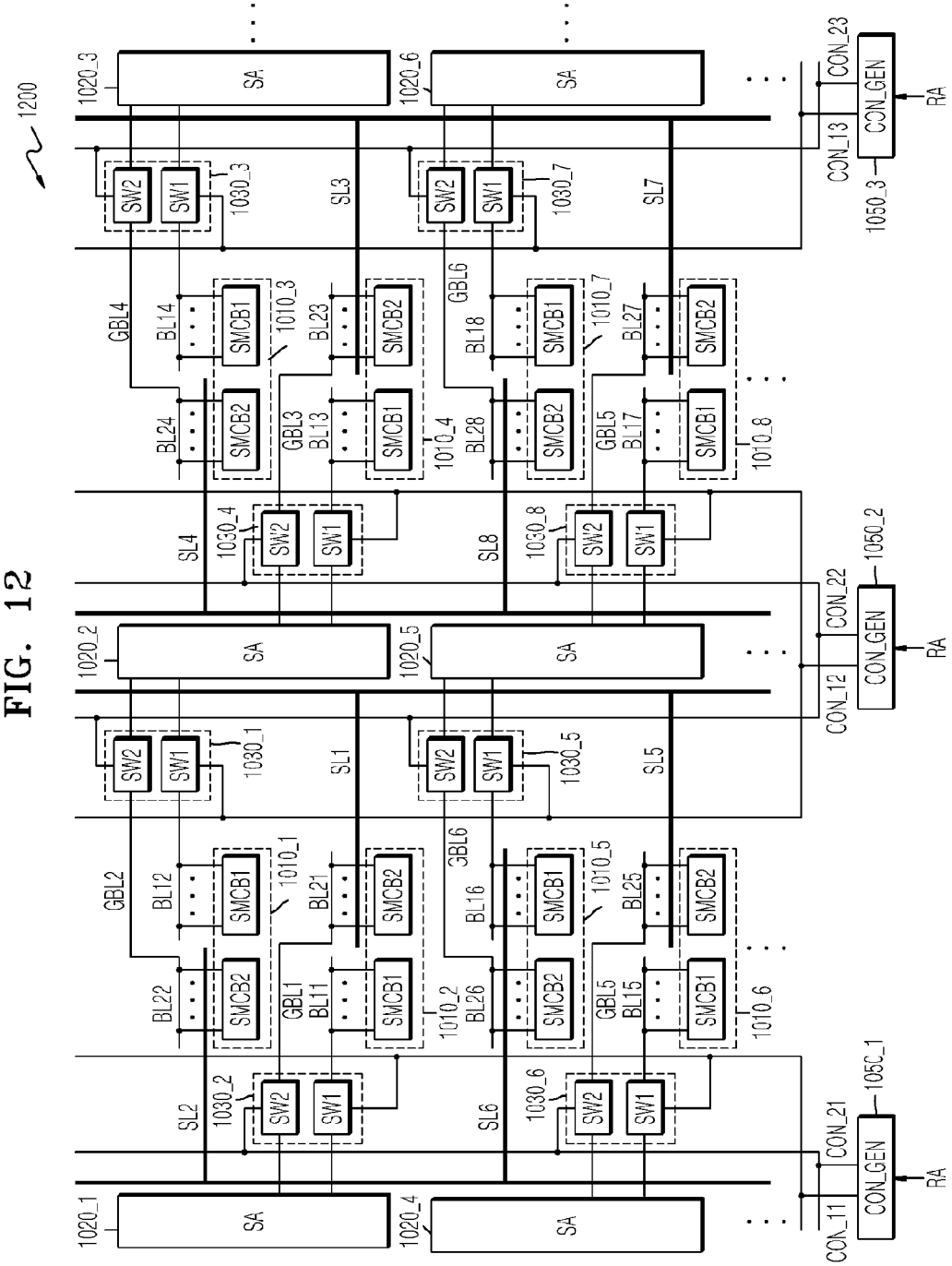
FIG. 12 is a block diagram of a semiconductor memory device according to another example embodiment of inventive concepts.

FIG. 12 is a block diagram of a semiconductor memory device 1200 according to another example embodiment of inventive concepts.

Referring to FIG. 12, the semiconductor memory device 1200 may include a plurality of memory cell blocks 1010_1, 1010_2, 1010_3, 1010_4, 1010_5, 1010_6, 1010_7, 1010_8, . . . , a plurality of first bit lines BL11, BL12, BL13, BL14, BL15, BL16, BL17, . . . , a plurality of second bit lines BL21, BL22, BL23, BL24, BL25, BL26, BL27, . . . , a plurality of global bit lines GBL1, GBL2, GBL3, GBL4, GBL5, GBL6, GBL7, GBL8, . . . , a plurality of bit line sense amplifiers 1020_1, 1020_2, 1020_3, 1020_4, 1020_5, 1020_6, . . . , a plurality of connection units 1030_1, 1030_2, 1030_3, 1030_4, 1030_5, 1030_6, 1030_7, 1030_8, . . . , a plurality of control signal generation units 1050_1, 1050_2, 1050_3, . . . , and a plurality of shield lines SL1, SL2, SL3, SL4, SL5, SL6, SL7, SL8, . . . .

In FIGS. 10 to 12, the same reference numerals denote the same elements. Thus, in FIG. 12, the plurality of memory cell blocks 1010_1, 1010_2, 1010_3, 1010_4, 1010_5, 1010_6, 1010_7, 1010_8, . . . , the plurality of first bit lines BL11, BL12, BL13, BL14, BL15, BL16, BL17, . . . , the plurality of second bit lines BL21, BL22, BL23, BL24, BL25, BL26, BL27, . . . , the plurality of global bit lines GBL1, GBL2, GBL3, GBL4, GBL5, GBL6, GBL7, GBL8, . . . , the plurality of bit line sense amplifiers 1020_1, 1020_2, 1020_3, 1020_4, 1020_5, 1020_6, . . . , the plurality of connection units 1030_1, 1030_2, 1030_3, 1030_4, 1030_5, 1030_6, 1030_7, 1030_8, . . . , and the plurality of control signal generation units 1050_1, 1050_2, 1050_3, . . . are the same as or similar to those described above with reference to FIG. 10. Also, in FIG. 12, the memory cell blocks 1010_1, 1010_2, 1010_3, 1010_4, 1010_5, 1010_6, 1010_7, 1010_8, . . . and the plurality of connection units 1030_1, 1030_2, 1030_3, 1030_4, 1030_5, 1030_6, 1030_7, 1030_8, . . . may be embodied as described above with reference to FIG. 11, and thus, will not be described again here.

Each of the plurality of shield lines SL1, SL2, SL3, SL4, SL5, SL6, SL7, SL8, . . . may be disposed on the same layer as the plurality of global bit lines GBL1, GBL2, GBL3, GBL4, GBL5, GBL6, GBL7, GBL8, . . . , and between adjacent global bit lines. In this example, the shield line SL1 may be disposed between the global bit line GBL2 and the global bit line GBL6, and the shield line SL6 may be disposed between the global bit line GBL1 and the global bit line GBL5. Each of the shield lines SL1, SL2, SL3, SL4, SL5, SL6, SL7, SL8, . . . may be maintained at a constant or substantially constant voltage level. For example, each of the shield lines SL1, SL2, SL3, SL4, SL5, SL6, SL7, SL8, . . . may be maintained at a ground voltage level. Thus, each of the shield lines SL1, SL2, SL3, SL4, SL5, SL6, SL7, SL8, . . . may compensate for coupling between a corresponding global bit line and a global bit line adjacent to the corresponding global bit line in a first direction. The shield lines SL1, SL2, SL3, SL4, SL5, SL6, SL7, SL8, . . . are the same as or similar to those described above with reference to FIG. 9, and thus, will not be described again here.

In the semiconductor memory devices 100 to 1200 according to the above-described example embodiments, the lengths of the first and second bit lines are shorter than in conventional semiconductor memory devices, and each of the second bit lines is connected to a corresponding bit line sense amplifier via a corresponding global bit line. Accordingly, capacitance components in the first and second bit lines and capacitance components between adjacent bit lines may be reduced, thereby reducing coupling noise between adjacent bit lines.

Figure 13:
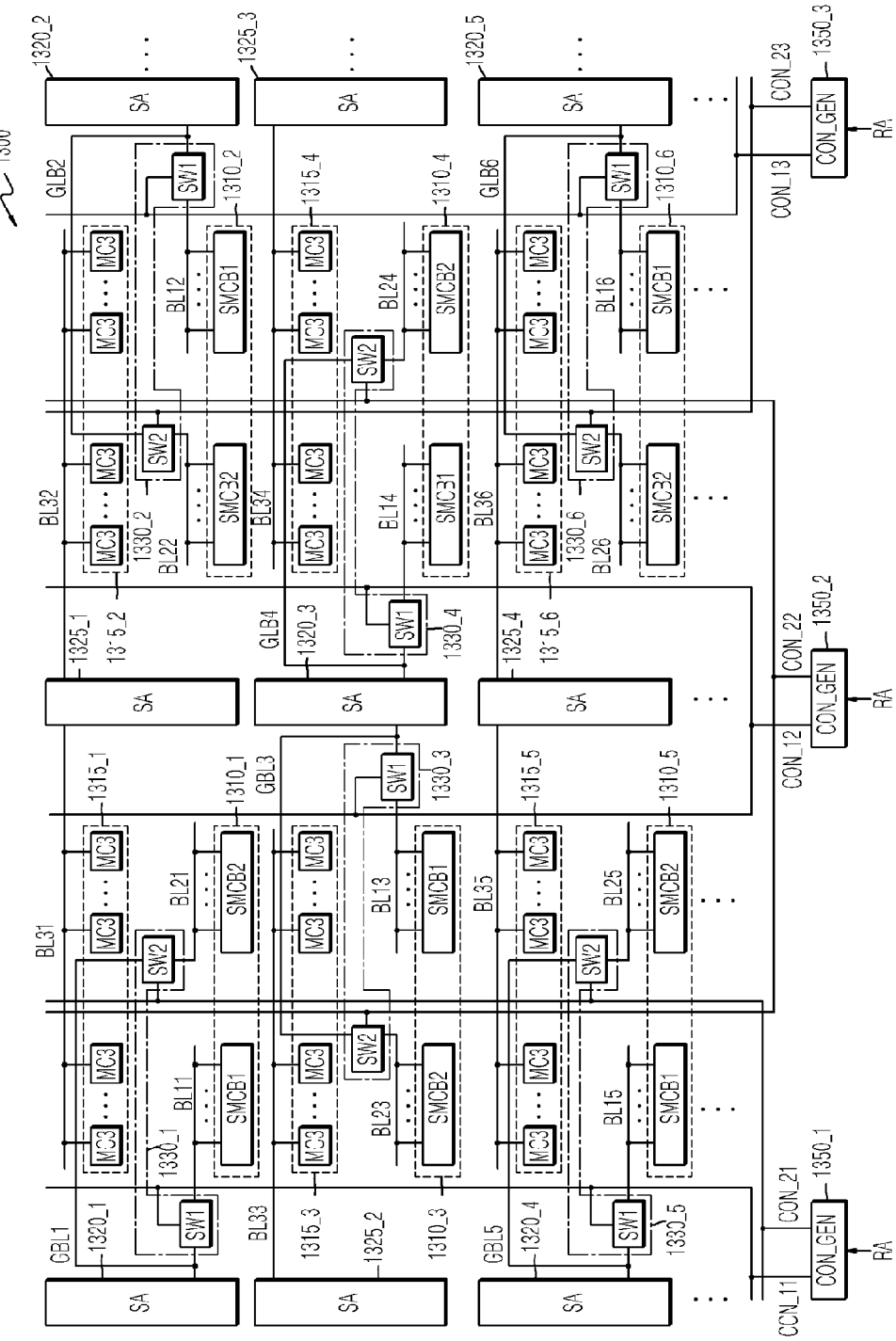
FIG. 13 is a block diagram of a semiconductor memory device according to another example embodiment of inventive concepts.

FIG. 13 is a block diagram of a semiconductor memory device 1300 according to another example embodiment of inventive concepts.

Referring to FIG. 13, the semiconductor memory device 1300 may include a plurality of first memory cell blocks 1310_1, 1310_2, 1310_3, 1310_4, 1310_5, 1310_6, . . . , a plurality of second memory cell blocks 1315_1, 1315_2, 1315_3, 1315_4, 1315_5, 1315_6, . . . , a plurality of first bit lines BL11, BL12, BL13, BL14, BL15, BL16, . . . , a plurality of second bit lines BL21, BL22, BL23, BL24, BL25, BL26, . . . , a plurality of third bit lines BL31, BL32, BL33, BL34, BL35, BL36, . . . , a plurality of global bit lines GBL1, GBL2, GBL3, GBL4, GBL5, GBL6, . . . , a plurality of first bit line sense amplifiers 1320_1, 1320_2, 1320_3, 1320_4, 1320_5, . . . , a plurality of second bit line sense amplifiers 1325_1, 1325_2, 1325_3, 1325_4, . . . , a plurality of connection units 1330_1, 1330_2, 1330_3, 1330_4, 1330_5, 1330_6, . . . , and a plurality of control signal generation units 1350_1, 1350_2, 1350_3, . . . .

Each of the plurality of first memory cell blocks 1310_1, 1310_2, 1310_3, 1310_4, 1310_5, 1310_6, . . . may include a first region SMCB1 in which a plurality of first memory cells are arranged, and a second region SMCB2 in which a plurality of second memory cells are arranged. Each of the plurality of second memory cell blocks 1315_1, 1315_2, 1315_3, 1315_4, 1315_5, 1315_6, . . . may include a plurality of third memory cells MC3. Each of the first bit lines BL11, BL12, BL13, BL14, BL15, BL16, . . . may be connected to the first memory cells in the first region SMCB1 of a corresponding first memory cell block from among the plurality of first memory cell blocks 1310_1, 1310_2, 1310_3, 1310_4, 1310_5, 1310_6, . . . . Each of the second bit lines BL21, BL22, BL23, BL24, BL25, BL26, . . . may be connected to the second memory cells in the second region SMCB2 of a corresponding first memory cell block from among the plurality of first memory cell blocks 1310_1, 1310_2, 1310_3, 1310_4, 1310_5, 1310_6, . . . . Each of the second bit lines BL21, BL22, BL23, BL24, BL25, BL26, . . . may be connected to a corresponding global bit line from among the plurality of global bit lines GBL1, GBL2, GBL3, GBL4, GBL5, GBL6, . . . . Each of the third bit lines BL31, BL32, BL33, BL34, BL35, BL36, . . . may be connected to the third memory cells MC3 of a corresponding second memory cell block from among the plurality of second memory cell blocks 1315_1, 1315_2, 1315_3, 1315_4, 1315_5, 1315_6, . . . . The semiconductor memory device 1300 according to at least this example embodiment may have both the hierarchical bit line architecture and a general bit line architecture.

For example, in the first region SMCB1 of the first memory cell block 1310_1, the first memory cells connected to the first bit line BL11 may be arranged. In the second region SMCB2 of the first memory cell block 1310_1, the second memory cells connected to the second bit line BL21 may be arranged.

Figure 14:
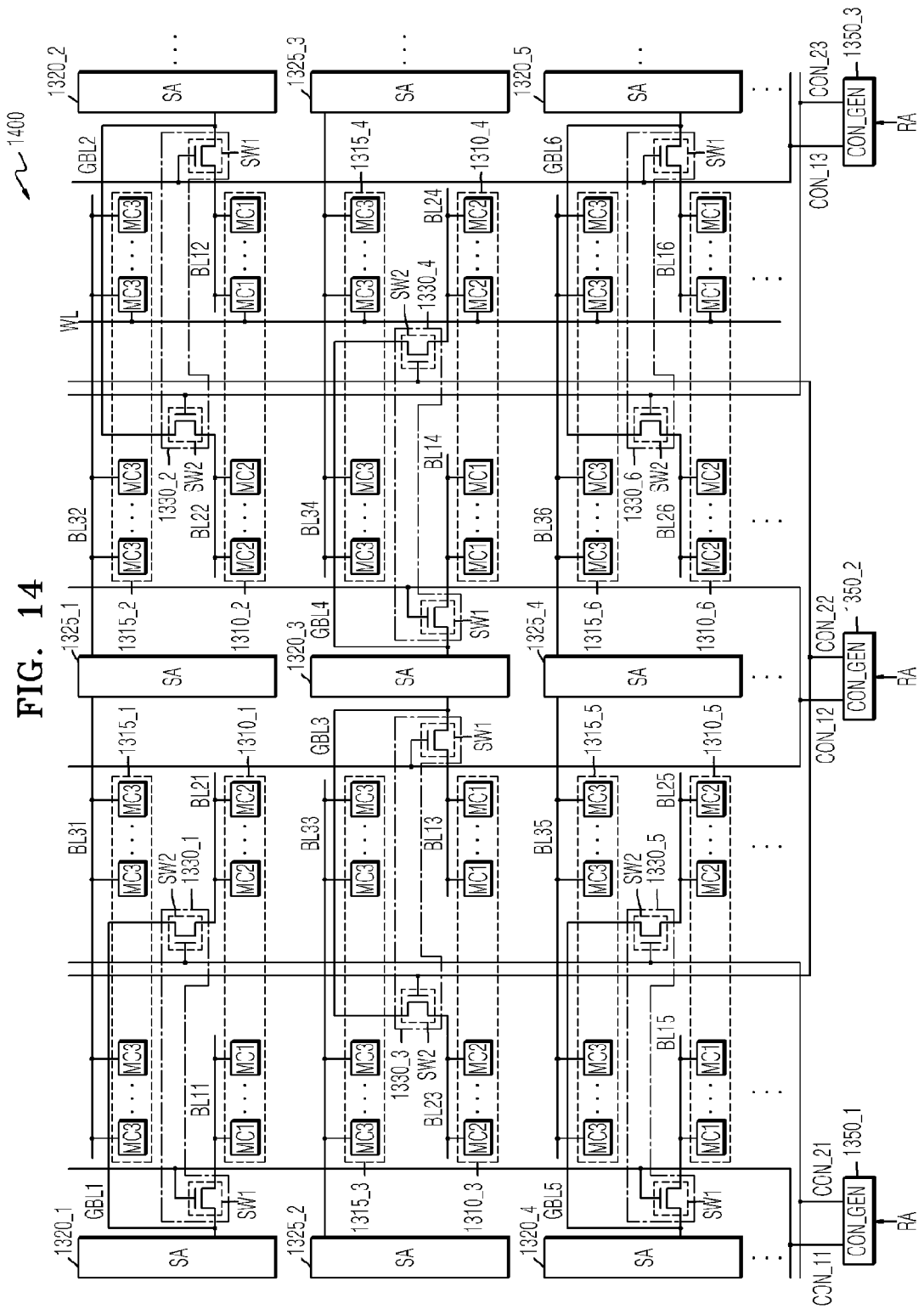
FIG. 14 is a circuit diagram of a semiconductor memory device, such as the semiconductor memory device of FIG. 13, according to another example embodiment of inventive concepts.

FIG. 14 illustrates the first memory cells arranged in the first region SMCB1 and the second memory cells arranged in the second region SMCB2.

According to at least one example embodiment of inventive concepts, each of the plurality of first memory cell blocks 1310_1, 1310_2, 1310_3, 1310_4, 1310_5, 1310_6, . . . may be divided into two equal parts: the first and second regions SMCB1 and SMCB2. However, example embodiments are not limited thereto, and the sizes of the first and second regions SMCB1 and SMCB2 may be different from each other.

In at least the example embodiment shown in FIG. 13, the plurality of first memory cell blocks 1310_1, 1310_2, 1310_3, 1310_4, 1310_5, 1310_6, . . . and the plurality of second memory cell blocks 1315_1, 1315_2, 1315_3, 1315_4, 1315_5, 1315_6, . . . cross each other in a first direction. However, example embodiments are not limited thereto, and a different number of first memory cell blocks and at least one second memory cell block may cross each other in the first direction.

In at least the example embodiment of FIG. 13, the first memory cell block 1310_2 and the second memory cell block 1315_2 or 1315_4 may be arranged in the first direction. Also, the first memory cell block 1310_1, and the second memory cell block 1315_1 or 1315_3 may be arranged in the first direction. The first region SMCB1 and the second region SMCB2 of each of the plurality of first memory cell blocks 1310_1, 1310_2, 1310_3, 1310_4, 1310_5, 1310_6, . . . may be arranged adjacent to each other in a second direction. For example, the first region SMCB1 and the second region SMCB2 included in one first memory cell block may be arranged adjacent to each other in the second direction. For example, the first region SMCB1 and the second region SMCB2 included in the first memory cell block 1310_2 may be arranged adjacent to each other in the second direction. The second direction may not be parallel to the first direction or may be perpendicular to the first direction. For example, the first direction may be a column-wise direction, and the second direction may be a row-wise direction.

Each of the plurality of first bit line sense amplifiers 1320_1, 1320_2, 1320_3, 1320_4, 1320_5, . . . may be connected to the first or second region SMCB1 or SMCB2 of a corresponding first memory cell block from among the plurality of first memory cell blocks 1310_1, 1310_2, 1310_3, 1310_4, 1310_5, 1310_6, . . . . For example, the first bit line sense amplifier 1320_3 may be connected to the first region SMCB1 of the first memory cell block 1310_3 via the first bit line BL13, or may be connected to the second region SMCB2 of the first memory cell block 1310_3 via the second bit line BL23 and the global bit line GBL3.

Each of the plurality of second bit line sense amplifiers 1325_1, 1325_2, 1325_3, 1325_4, . . . may be connected to the third memory cells MC3 of a corresponding second memory cell block from among the plurality of second memory cell blocks 1315_1, 1315_2, 1315_3, 1315_4, 1315_5, 1315_6, . . . . For example, the second bit line sense amplifier 1325_1 may be connected to the third memory cells MC3 of the second memory cell block 1315_1 via the third bit line BL31, or may be connected to the third memory cells MC3 of the second memory cell block 1315_2 via the third bit line BL32.

The semiconductor memory device 1300 may have the open bit line architecture as illustrated in FIG. 13. In the example embodiment of FIG. 13, each of the plurality of first bit line sense amplifiers 1320_1, 1320_2, 1320_3, 1320_4, 1320_5, . . . may include an input terminal via which data stored in the memory cells in the first or second region SMCB1 or SMCB2 of an adjacent first memory cell block in a direction is received, and an inversion input terminal via which data stored in the memory cells in the first or second region SMCB1 or SMCB2 of an adjacent first memory cell block in the opposite direction is received. For example, the input terminal of the first bit line sense amplifier 1320_3 may be connected to the first bit line BL13 or may be connected to the second bit line BL23 via the global bit line GBL3, and the inversion input terminal of the first bit line sense amplifier 1320_3 may be connected to the first bit line BL14 or may be connected to the second bit line BL24 via the global bit line GBL4. Otherwise, the inversion input terminal of the first bit line sense amplifier 1320_3 may be connected to the first bit line BL13 or may be connected to the second bit line BL23 via the global bit line GBL3, and the input terminal of the first bit line sense amplifier 1320_2 may be connected to the first bit line BL14 or may be connected to the second bit line BL24 via the global bit line GBL4.

Each of the plurality of second bit line sense amplifiers 1325_1, 1325_2, 1325_3, 1325_4, . . . may include an input terminal via which data stored in the third memory cells MC3 of a second memory cell block adjacent in one direction is received, and an inversion input terminal via which data stored in the third memory cells MC3 of a second memory cell block adjacent in the opposite direction is received. For example, the third bit line BL31 may be connected to the input terminal of the second bit line sense amplifier 1325_1, or the third bit line BL32 may be connected to the inversion input terminal of the second bit line sense amplifier 1325_1. Otherwise, the third bit line BL31 may be connected to the inversion input terminal of the second bit line sense amplifier 1325_1, or the third bit line BL32 may be connected to the input terminal of the second bit line sense amplifier 1325_1.

Each of the plurality of connection units 1330_1, 1330_2, 1330_3, 1330_4, 1330_5, 1330_6, . . . may connect a corresponding first bit line to a corresponding first bit line sense amplifier in response to a corresponding first control signal from among a plurality of first control signals CON_11, CON_12, CON_13, . . . , or may connect a corresponding second bit line to the corresponding first bit line sense amplifier via a corresponding global bit line in response to a corresponding second control signal from among a plurality of second control signals CON_21, CON_22, CON_23, . . . . For example, the connection unit 1330_3 may connect the first bit line BL13 to the first bit line sense amplifier 1320_3 in response to the first control signal CON_12, or may connect the second bit line BL23 to the first bit line sense amplifier 1320_3 via the global bit line GBL3 in response to the second control signal CON_22.

Each of the plurality of connection units 1330_1, 1330_2, 1330_3, 1330_4, 1330_5, 1330_6, . . . may include a first switch unit SW1 and a second switch unit SW2. The first switch unit SW1 may selectively connect a corresponding first bit line to a corresponding first bit line sense amplifier in response to a corresponding first control signal. The second switch unit SW2 may selectively connect a corresponding second bit line to a global bit line, which is connected to the corresponding first bit line sense amplifier, in response to a corresponding second control signal.

For example, the first switch unit SW1 of the connection unit 1330_4 may selectively connect the first bit line BL14 to the first bit line sense amplifier 1320_3 in response to the first control signal CON_12. The second switch unit SW2 of the connection unit 1330_4 may selectively connect the global bit line GBL4, which is connected to the first bit line sense amplifier 1320_3, to the second bit line BL24 in response to the second control signal CON_22.

One of the first and second switch units SW1 and SW2 included in each of the plurality of connection units 1330_1, 1330_2, 1330_3, 1330_4, 1330_5, 1330_6, . . . may be enabled, or both of them may be disabled. If the first switch unit SW1 is disabled in response to a first control signal, then the second switch unit SW2 may be enabled or disabled in response to a corresponding second control signal. If the second switch unit SW2 is disabled in response to a second control signal, then the first switch unit SW1 may be enabled or disabled in response to a corresponding first control signal. If the first switch unit SW1 is enabled, then the first switch unit SW1 connects a corresponding first bit line to a corresponding first bit line sense amplifier. If the first switch unit SW1 is disabled, then the first switch unit SW1 disconnects the corresponding first bit line from the corresponding first bit line sense amplifier. If the second switch unit SW2 is enabled, then the second switch unit SW2 connects a corresponding second bit line to a corresponding global bit line. If the second switch unit SW2 is disabled, then the second switch unit SW2 disconnects the corresponding second bit line from the corresponding global bit line.

For example, if a word line connected to one of the first memory cells in the first region SMCB1 of the first memory cell block 1310_1 is enabled, then the first switch unit SW1 of the connection unit 1330_1 may connect the first bit line BL11 to the first bit line sense amplifier 1320_1 in response to the first control signal CON_11, and the second switch unit SW2 of the connection unit 1330_1 may disconnect the second bit line BL21 from the global bit line GBL1 in response to the second control signal CON_21.

The first switch unit SW1 may be disposed between the corresponding first bit line sense amplifier and the corresponding memory cell block. The second switch unit SW2 may be disposed at a location corresponding to a center of the corresponding memory cell block. In this example, the first switch unit SW1 may be disposed at an edge of the corresponding memory cell block. For example, the first switch unit SW1 of the connection unit 1330_1 may be disposed between the first bit line sense amplifier 1320_1 and the first memory cell block 1310_1, and the second switch unit SW2 may be disposed at a location corresponding to a center of the first memory cell block 1310_1.

Each of the second bit lines BL21, BL22, BL23, BL24, BL25, BL26, . . . may be selectively connected to a corresponding global bit line from among the plurality of global bit lines GBL1, GBL2, GBL3, GBL4, . . . , via the second switch unit SW2 of a corresponding connection unit from among the plurality of connection units 1330_1, 1330_2 1330_3, 1330_4, 1330_5, 1330_6, . . . . For example, the second bit line BL22 may be selectively connected to the global bit line GBL2 via the second switch unit SW2 of the connection unit 1330_2.

The plurality of global bit lines GBL1, GBL2, GBL3, GBL4, GBL5, GBL6, . . . may be poly lines or metal lines. The plurality of global bit lines GBL1, GBL2, GBL3, GBL4, GBL5, GBL6, . . . may be disposed on a layer that is different from a layer on which the plurality of first bit lines BL11, BL12, BL13, BL14, BL15, BL16, . . . the plurality of second bit lines BL21, BL22, BL23, BL24, BL25, BL26 . . . , and the plurality of third bit lines BL31, BL32, BL33, BL34, BL35, BL36, . . . are disposed. In this example, the plurality of first bit lines BL11, BL12, BL13, BL14, BL15, BL16, . . . the plurality of second bit lines BL21, BL22, BL23, BL24, BL25, BL26 . . . , and the plurality of third bit lines BL31, BL32, BL33, BL34, BL35, BL36, . . . may be disposed on a first layer, whereas the plurality of global bit lines GBL1, GBL2, GBL3, GBL4, GBL5, GBL6, . . . may be formed on a second layer that is different from the first layer. Each of the plurality of global bit lines GBL1, GBL2, GBL3, GBL4, GBL5, GBL6, . . . may be disposed at a location of the second layer, which corresponds to a location between a corresponding first bit line and a corresponding third bit line. For example, the global bit line GBL1 may be disposed at a location of the second layer corresponding to the location of the first or third bit line BL11 or BL31. Otherwise, the global bit line GBL1 may be disposed at a location of the second layer corresponding to a given, desired or predetermined location between the first and third bit lines BL11 and BL31. If the global bit line GBL1 is disposed at a location of the second layer corresponding to the location of the third bit line BL31, then the global bit line GBL5 is disposed at a location of the second layer corresponding to the location of the third bit line BL35, and the other global bit lines GBL2, GBL3, GBL4, GBL6, . . . may be disposed at locations of the second layer corresponding to the locations of the corresponding third lines from among the other third bit lines BL32, BL33, BL34, BL36, . . . , respectively. The plurality of global bit lines GBL1, GBL2, GBL3, GBL4, GBL5, GBL6, . . . may be formed on the second layer at regular intervals.

If the first bit lines BL11, BL12, BL13, BL14, BL15, BL16, . . . , the second bit lines BL21, BL22, BL23, BL24, BL25, BL26, . . . , and the third bit lines BL31, BL32, BL33, BL34, BL35, BL36, . . . are referred to as local bit lines, then the pitches between the plurality of global bit lines GBL1, GBL2, GBL3, GBL4, GBL5, GBL6, . . . may be about four times the pitches between the local bit lines.

Each of the plurality of control signal generation units 1350_1, 1350_2, 1350_3, . . . may generate a corresponding first control signal and second control signal based on a row address RA. For example, the control signal generation unit 1350_1 may generate the first control signal CON_11 and the second control signal CON_21 based on the row address RA. The control signal generation unit 1350_2 may generate the first control signal CON_12 and the second control signal CON_22 based on the row address RA, and the control signal generation unit 1350_3 may generate the first control signal CON_13 and the second control signal CON_23 based on the row address RA.

It is assumed that a word line connected to the third memory cells MC3 of the second memory cell block 1315_1, the second memory cells in the second region SMCB2 of the first memory cell block 1310_1, the third memory cells MC3 of the second memory cell block 1315_3, the first memory cells in the first region SMCB1 of the first memory cell block 1310_3, the third memory cells MC3 of the second memory cell block 1315_5, and the second memory cells in the second region SMCB2 of the first memory cell block 1310_5, is enabled. Also, it is assumed that the first switch unit SW1 is enabled when the corresponding first control signal from among the plurality of first control signals CON_11, CON_12, CON_13, . . . has a first voltage, but is disabled when the corresponding first control signal has a second voltage. Also, it is assumed that the second switch unit SW2 is enabled when the corresponding second control signal from among the plurality of second control signals CON_21, CON_22, CON_23, . . . has the first voltage, but is disabled when the corresponding second control signal has the second voltage.

In this case, the control signal generation unit 1350_1 generates the first control signal CON_11 having the second voltage, and the second control signal CON_21 having the first voltage, according to the row address RA. The control signal generation unit 1350_2 generates the first control signal CON_12 having the first voltage, and the second control signal CON_22 having the second voltage, according to the row address RA. The other control signal generation units 1350_3, . . . may generate the first control signals CON_13, . . . and the second control signals CON_23, . . . that each have the second voltage, according to the row address RA. Thus, the first switches SW1 of the connection units 1330_3, 1330_4, . . . to which the first control signal CON_12 is supplied, and the second switches SW2 of the connection units 130_1, . . . to which the second control signal CON_21 is supplied, are enabled. The other first and second switches SW1 and SW2 are disabled.

Thus, the first bit line sense amplifier 1320_1 may sense and amplify data stored in a second memory cell connected to the enabled word line from among the second memory cells in the second region SMCB2 of the first memory cell block 1310_1. The first bit line sense amplifier 1320_3 may sense and amplify data stored in a first memory cell connected to the enabled word line from among the first memory cells in the first region SMCB1 of the first memory cell block 1310_3. The first bit line sense amplifier 1320_4 may sense and amplify data stored in a second memory cell connected to the enabled word line from among the second memory cells in the second region SMCB2 of the first memory cell block 1310_5. Also, the second bit line sense amplifier 1325_1 may sense and amplify data stored in a third memory cell MC3 connected to the enabled word line from among the third memory cells MC3 of the second memory cell block 1315_1. The second bit line sense amplifier 1325_2 may sense and amplify data stored in a third memory cell MC3 connected to the enabled word line from among the third memory cells MC3 of the second memory cell block 1315_3. Also, the second bit line sense amplifier 1325_4 may sense and amplify data stored in a third memory cell MC3 connected to the enabled word line from among the third memory cells MC3 of the second memory cell block 1315_5.

According to at least this example embodiment of inventive concepts, only one of the plurality of first control signals CON_11, CON_12, CON_13, . . . has the first voltage, and the other first control signals have the second voltage. Also, only one of the plurality of second control signals CON_21, CON_22, CON_23, . . . has the first voltage, and the other second control signals have the second voltage. Here, only the one first control signal and only the one second control signal that have the first voltage may be selected according to the address of a word line to be enabled.

If the semiconductor memory device 1300 performs the precharging operation, then the plurality of control signal generation units 1350_1, 1350_2, 1350_3, . . . may generate the plurality of first control signals CON_11, CON_12, CON_13, . . . and the plurality of second control signals CON_21, CON_22, CON_23, . . . each having a third voltage. If all of the first control signals CON_11, CON_12, CON_13, . . . and the second control signals CON_21, CON_22, CON_23, . . . have the third voltage, then all of the first switch units SW1 and the second switches SW2 may be enabled.

FIG. 14 is a circuit diagram of a semiconductor memory device 1400, such as the semiconductor memory device 1300 of FIG. 13, according to another example embodiment of inventive concepts.

Referring to FIG. 14, the semiconductor memory device 1400 may include a plurality of first memory cell blocks 1310_1, 1310_2, 1310_3, 1310_4, 1310_5, 1310_6, . . . , a plurality of second memory cell blocks 1315_1, 1315_2, 1315_3, 1315_4, 1315_5, 1315_6, . . . , a plurality of first bit lines BL11, BL12, BL13, BL14, BL15, BL16, . . . , a plurality of second bit lines BL21, BL22, BL23, BL24, BL25, BL26, . . . , a plurality of third bit lines BL31, BL32, BL33, BL34, BL35, BL36, . . . , a plurality of global bit lines GBL1, GBL2, GBL3, GBL4, GBL5, GBL6, . . . , a plurality of first bit line sense amplifiers 1320_1, 1320_2, 1320_3, 1320_4, 1320_5, . . . , a plurality of second bit line sense amplifiers 1325_1, 1325_2, 1325_3, 1325_4, . . . , a plurality of connection units 1330_1, 1330_2, 1330_3, 1330_4, 1330_5, 1330_6, . . . , and a plurality of control signal generation units 1350_1, 1350_2, 1350_3, . . . . In FIGS. 13 and 14, the same reference numerals denote the same elements.

Each of the plurality of first memory cell blocks 1310_1, 1310_2, 1310_3, 1310_4, 1310_5, 1310_6, . . . may include a plurality of first memory cells MC1 and a plurality of second memory cells MC2. The first region SMCB1 and the second region SMCB2 of FIG. 13 may include the first memory cells MC1 and the second memory cells MC2 of FIG. 14, respectively. For example, in FIG. 14, the first memory cells MC1 of the first memory cell block 1310_1 may be included in the first region SMCB1 of the first memory cell block 1310_1 of FIG. 13, and the second memory cells MC2 of the first memory cell block 1310_1 may be included in the second region SMCB2 of the first memory cell block 1310_1 of FIG. 13. The first memory cells MC1 may be connected to a corresponding first bit line from among the plurality of first bit lines BL11, BL12, BL13, BL14, BL15, BL16, . . . , and the second memory cells MC2 may be connected to a corresponding second bit line from among the plurality of second bit lines BL21, BL22, BL23, BL24, BL25, BL26, . . . . For example, the first memory cells MC1 and the second memory cells MC2 of the first memory cell block 1310_1 may be connected to the first bit line BL11 and the second bit line BL21, respectively.

The first memory cell MC1, the second memory cell MC2, and/or a third memory cell MC3 may include one transistor and one capacitor. A gate and first terminal of the transistor of the first memory cell MC1 may be connected to a corresponding word line and a corresponding second bit line, respectively. The capacitor of the first memory cell MC1 may be connected between a second terminal of the transistor and a ground voltage source. A gate and first terminal of the transistor of the second memory cell MC2 may be connected to the corresponding word line and a corresponding second bit line, respectively. The capacitor of the second memory cell MC2 may be connected between a second terminal of the transistor and the ground voltage source. A gate and first terminal of the transistor of the third memory cell MC3 may be connected to the corresponding word line and a corresponding third bit line, respectively. The capacitor of the third memory cell MC3 may be connected between a second terminal of the transistor and the ground voltage source.

The structures and connections of the first memory cell blocks 1310_1, 1310_2, 1310_3, 1310_4, 1310_5, 1310_6, . . . and the second memory cell blocks 1315_1, 1315_2, 1315_3, 1315_4, 1315_5, 1315_6, . . . are the same as or similar to those described above with reference to FIG. 13, and thus, will not be described again here.

Each of the plurality of first bit line sense amplifiers 1320_1, 1320_2, 1320_3, 1320_4, 1320_5, . . . may be connected to the first or second cells MC1 or MC2 of a corresponding first memory cell block from among the plurality of first memory cell blocks 1310_1, 1310_2, 1310_3, 1310_4, 1310_5, 1310_6, . . . . In this example, each of the plurality of first bit line sense amplifiers 1320_1, 1320_2, 1320_3, 1320_4, 1320_5, . . . may sense and amplify data stored in the first or second memory cells MC1 or MC2 of a corresponding first memory cell block. For example, the first bit line sense amplifier 1320_3 may be connected to the first memory cells MC1 of the first memory cell block 1310_3 via the first bit line BL13, or may be connected to the second memory cells MC2 of the first memory cell block 1310_3 via the second bit line BL23 and the global bit line GBL3. The connections of the first bit line sense amplifiers 1320_1, 1320_2, 1320_3, 1320_4, 1320_5, . . . and the second bit line sense amplifiers 1315_1, 1325_2, 1325_3, 1325_4, . . . are the same as or similar to those described above with reference to FIG. 13, and thus, will not be described again here.

Each of the plurality of connection units 1330_1, 1330_2, 1330_3, 1330_4, 1330_5, 1330_6, . . . may connect a corresponding first bit line to a corresponding first bit line sense amplifier in response to a corresponding first control signal from among a plurality of first control signals CON_11, CON_12, CON_13, . . . , or may connect a corresponding second bit line to the corresponding first bit line sense amplifier via a corresponding global bit line in response to a corresponding second control signal from among a plurality of second control signals CON_21, CON_22, CON_23, . . . .

Each of the plurality of connection units 1330_1, 1330_2, 1330_3, 1330_4, 1330_5, 1330_6, . . . may include a first switch unit SW1 and a second switch unit SW2, as illustrated in FIG. 13. As described above with reference to FIG. 13, the first switch unit SW1 may selectively connect a corresponding first bit line to a corresponding first bit line sense amplifier in response to a corresponding first control signal, and the second switch unit SW2 may selectively connect a corresponding second bit line to a global bit line, which is connected to the corresponding first bit line sense amplifier, in response to a corresponding second control signal.

FIG. 14 illustrates an example embodiment where the first switch unit SW1 and the second switch unit SW2 of FIG. 13 are NMOS transistors. For example, the first switch unit SW1 of the connection unit 1330_1 may be an NMOS transistor that selectively connects the first bit line BL11 to the first bit line sense amplifier 1320_1, in response to the first control signal CON_11. The second switch unit SW2 of the connection unit 1330_1 may be an NMOS transistor that selectively connects the second bit line BL21 to the global bit line GBL1 connected to the first bit line sense amplifier 1320_1, in response to the second control signal CON_21.

In at least the example embodiment of FIG. 14, if the first switch unit SW1 is an NMOS transistor, then the first switch unit SW1 may be enabled to connect a corresponding first bit line to a corresponding bit line sense amplifier when the corresponding first control signal is logic high, but may be disabled to disconnect the corresponding first bit line from the corresponding bit line sense amplifier when the corresponding first control signal is logic low. If the second switch unit SW2 is an NMOS transistor, then the second switch unit SW2 may be enabled to connect a corresponding second bit line to the corresponding bit line sense amplifier when a corresponding second control signal is logic high, but may be disabled to disconnect the corresponding second bit line from the corresponding bit line sense amplifier when the corresponding second control signal is logic low.

Although FIG. 14 illustrates a case where the first switch unit SW1 and the second switch unit SW2 are NMOS transistors, example embodiments are not limited thereto, and other devices may be embodied as the first switch unit SW1 and the second switch unit SW2, as long as the other devices are capable of operating in the same or a similar manner as the first switch unit SW1 and the second switch unit SW2 described above. For example, the first switch unit SW1 and the second switch unit SW2 may be PMOS transistors. In this example, logic states of the plurality of first control signals CON_11, CON_12, CON_13, . . . and the plurality of second control signals CON_21, CON_22, CON_23, . . . may be opposite to when the first switch unit SW1 and the second switch unit SW2 are NMOS transistors.

Each of the plurality of control signal generation units 1350_1, 1350_2, 1350_3, . . . may generate a corresponding first control signal and second control signal based on a row address RA. The structures and operations of the plurality of control signal generation units 1350_1, 1350_2, 1350_3, . . . are the same as or similar to those described above with reference to FIG. 13.

An example operation of the semiconductor memory device 1300 or 1400 according to an example embodiment of inventive concepts will now be described with reference to FIGS. 13 and 14.

Each of the plurality of first memory cells MC1 and the plurality of second memory cells MC2 may be connected to a corresponding word line. A case where one of a plurality of word lines is enabled will now be described. For convenience of explanation, it is assumed that a word line connected to one of the third memory cells MC3 of the second memory cell block 1315_2, one of the first memory cells MC1 of the first memory cell block 1310_2, one of the third memory cells MC3 of the second memory cell block 1315_4, one of the second memory cells MC2 of the first memory cell block 1310_4, one of the third memory cells MC3 of the second memory cell block 1315_6, and one of the first memory cells MC1 in the first memory cell block 1310_6, is enabled. However, example embodiments are not limited to the above case, and the semiconductor memory device 1300 or 1400 may operate according to the location of the enabled word line, as described below. Also, it is assumed that the transistors of corresponding first switch units SW1 are turned on when the first control signals CON_11, CON_12, CON_13, . . . each have the first voltage, but are turned off when the first control signals CON_11, CON_12, CON_13, . . . each have the second voltage. Also, it is assumed that the transistors of corresponding second switch units SW1 are turned on when the second control signals CON_21, CON_22, CON_23, . . . each have the first voltage, but are turned off when the second control signals CON_21, CON_22, CON_23, . . . each have the second voltage. For example, if the first switch units SW1 and the second switch units SW2 are NMOS transistors as illustrated in FIG. 14, then the first voltage may be a high voltage and the second voltage may be a low voltage.

Each of the plurality of control signal generation units 1350_1, 1350_2, 1350_3, . . . may generate a corresponding first control signal and a corresponding second control signal based on an address of an enabled word line WL. In this example, the control signal generation unit 1350_1 may generate the first control signal CON_11 having the second voltage and the second control signal CON_21 having the second voltage based on the address of the enabled word line WL. The control signal generation unit 1350_2 may generate the first control signal CON_12 having the second voltage and the second control signal CON_22 having the first voltage based on the address of the enabled word line WL. The control signal generation unit 1350_3 may generate the first control signal CON_13 having the first voltage and the second control signal CON_23 having the second voltage based on the address of the enabled word line WL. In this example, the first control signal CON_13 that controls the first switch units SW1 connected to the first memory cells MC1 connected to the enabled word line WL, may have the first voltage. The second control signal CON_22 that controls the second switch units SW2 connected to the second memory cells MC2 connected to the enabled word line WL, may have the first voltage.

According to operations of the control signal generation units 1350_1, 1350_2, 1350_3, . . . described above, only the first control signal CON_13 and the second control signal CON_22 have the first voltage, and the other first control signals CON_11, CON_12, . . . and the other second control signals CON_21, CON_23, . . . have the second voltage. Thus, the transistors of the first switches SW1 of the connection units 1330_2, 1330_6, . . . to which the first control signal CON_13 is supplied, and the transistors of the second switches SW2 of the connection units 1330_3, 1330_4, . . . to which the second control signal CON_22 is supplied, are turned on. The transistors of the other first and second switches SW1 and SW2 are turned off. Thus, the first bit line sense amplifier 1320_2 is connected to the first bit line BL12, the first bit line sense amplifier 1320_3 is connected to the second bit line BL24 and the second bit line BL23, and the first bit line sense amplifier 1320_5 is connected to the first bit line BL16.

The second bit line sense amplifier 1325_1 may receive data from the third memory cells MC3 of the second memory cell block 1315_2 connected to the enabled word line WL, via the third bit line BL32, and then may sense and amplify the data. The first bit line sense amplifier 1320_2 may receive data from the first memory cells MC1 of the first memory cell block 1310_2 connected to the enabled word line WL, via the first bit line BL12, and then may sense and amplify the data. The second bit line sense amplifier 1325_3 may receive data from the third memory cells MC3 of the second memory cell block 1315_4 connected to the enabled word line WL, via the third bit line BL34, and then may sense and amplify the data. The first bit line sense amplifier 1320_3 may receive data from the second memory cells MC2 of the first memory cell block 1310_4 connected to the enabled word line WL, via the second bit line BL24 and the global bit line GBL4, and then may sense and amplify the data. The second bit line sense amplifier 1325_4 may receive data from the third memory cells MC3 of the second memory cell block 1315_6 connected to the enabled word line WL, via the third bit line BL36, and then may sense and amplify the data. The first bit line sense amplifier 1320_5 may receive data from the first memory cells MC1 of the first memory cell block 1310_6 connected to the enabled word line WL, via the first bit line BL16, and then may sense and amplify the data.

The second switches SW2 of the connection units 1330_3, . . . are enabled, but the second memory cells MC2 connected to the second bit lines BL23, . . . are not connected to the enabled word line WL. Thus, the first bit line sense amplifiers 1320_3, . . . do not sense and amplify the data stored in the second memory cells MC2 of the first memory cell blocks 1310_3, . . . , respectively.

If the semiconductor memory device 1300 or 1400 performs the precharging operation, then the plurality of control signal generation units 1350_1, 1350_2, 1350_3, . . . may generate the plurality of first control signals CON_11, CON_12, CON_13, . . . and the plurality of second control signals CON_21, CON_22, CON_23, . . . each having the third voltage. If all of the first control signals CON_11, CON_12, CON_13, . . . and the second control signals CON_21, CON_22, CON_23, . . . have the third voltage, then all of the first switch units SW1 and the second switches SW2 may be enabled, and the semiconductor memory device 1300 or 1400 may perform the precharging operation. If the first switch unit SW1 and the second switch unit SW2 are NMOS transistors as described above with reference to FIG. 14, then the first voltage may be higher than the second voltage and the third voltage, and the third voltage may be higher than the second voltage. If the first switch unit SW1 and the second switch unit SW2 are PMOS transistors, then the first voltage may be lower than the second voltage and the third voltage, and the third voltage may be lower than the second voltage.

Figure 15:
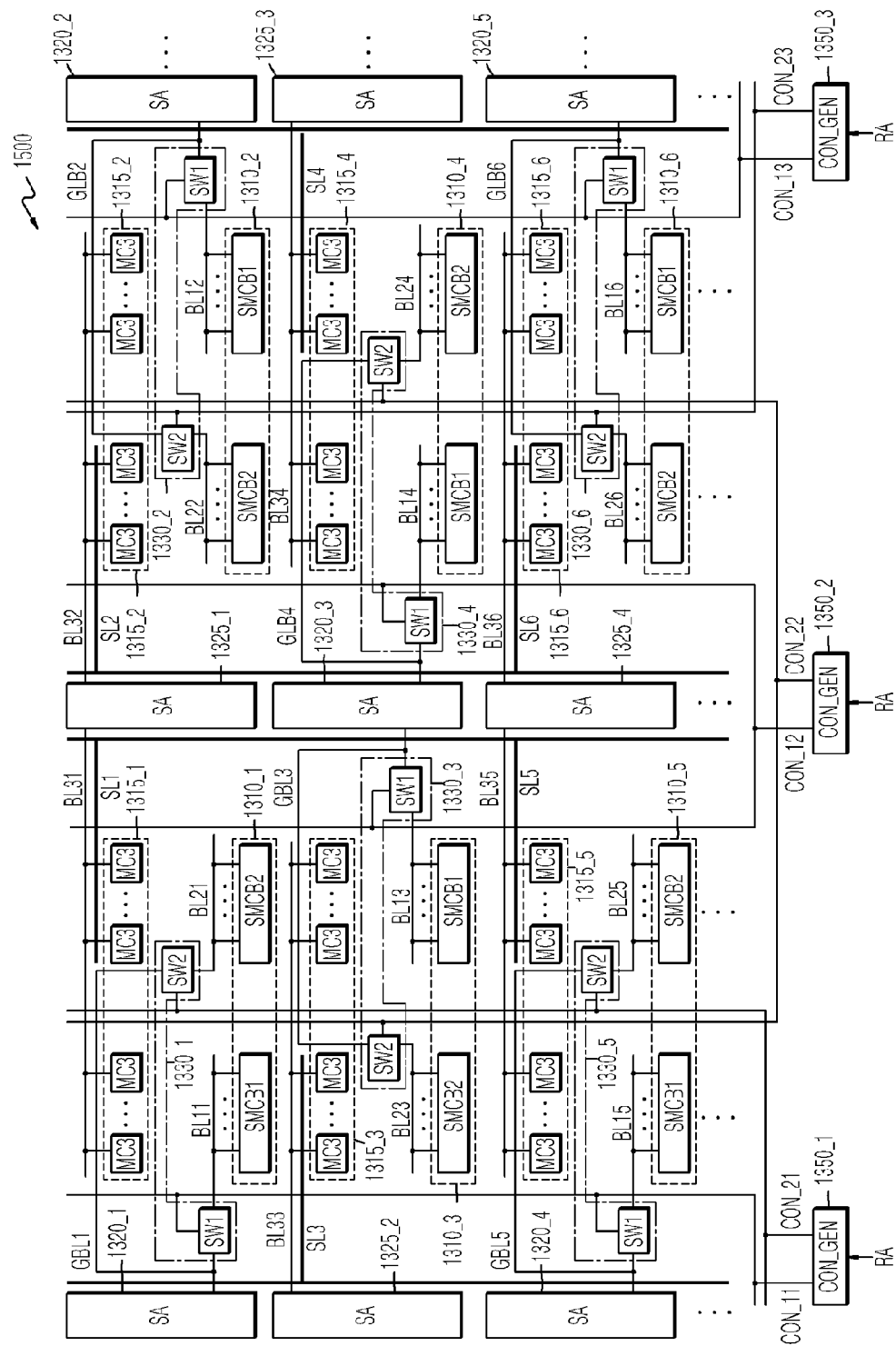
FIG. 15 is a block diagram of a semiconductor memory device according to another example embodiment of inventive concepts.

FIG. 15 is a block diagram of a semiconductor memory device 1500 according to another example embodiment of inventive concepts.

Referring to FIG. 15, the semiconductor memory device 1500 may include a plurality of first memory cell blocks 1310_1, 1310_2, 1310_3, 1310_4, 1310_5, 1310_6, . . . , a plurality of second memory cell blocks 1315_1, 1315_2, 1315_3, 1315_4, 1315_5, 1315_6, . . . , a plurality of first bit lines BL11, BL12, BL13, BL14, BL15, BL16, . . . , a plurality of second bit lines BL21, BL22, BL23, BL24, BL25, BL26, . . . , a plurality of third bit lines BL31, BL32, BL33, BL34, BL35, BL36, . . . , a plurality of global bit lines GBL1, GBL2, GBL3, GBL4, GBL5, GBL6, . . . , a plurality of first bit line sense amplifiers 1320_1, 1320_2, 1320_3, 1320_4, 1320_5, . . . , a plurality of second bit line sense amplifiers

1325_1, 1325_2, 1325_3, 1325_4, . . . , a plurality of connection units 1330_1, 1330_2, 1330_3, 1330_4, 1330_5, 1330_6, . . . , a plurality of control signal generation units 1350_1, 1350_2, 1350_3, . . . , and a plurality of shield lines SL1, SL2, SL3, SL4, SL5, SL6, . . . .

In FIGS. 13 to 15, the same reference numerals denote the same elements. In this example, in FIG. 15, the plurality of first memory cell blocks 1310_1, 1310_2, 1310_3, 1310_4, 1310_5, 1310_6, . . . , the plurality of second memory cell blocks 1315_1, 1315_2, 1315_3, 1315_4, 1315_5, 1315_6, . . . , the plurality of first bit lines BL11, BL12, BL13, BL14, BL15, BL16, . . . , the plurality of second bit lines BL21, BL22, BL23, BL24, BL25, BL26, . . . , the plurality of third bit lines BL31, BL32, BL33, BL34, BL35, BL36, . . . , the plurality of global bit lines GBL1, GBL2, GBL3, GBL4, GBL5, GBL6, . . . , the plurality of first bit line sense amplifiers 1320_1, 1320_2, 1320_3, 1320_4, 1320_5, . . . , the plurality of second bit line sense amplifiers 1325_1, 1325_2, 1325_3, 1325_4, . . . , the plurality of connection units 1330_1, 1330_2, 1330_3, 1330_4, 1330_5, 1330_6, . . . , and the plurality of control signal generation units 1350_1, 1350_2, 1350_3, . . . are the same as or similar to those described above with reference to FIG. 13. Also, the plurality of first memory cell blocks 1310_1, 1310_2, 1310_3, 1310_4, 1310_5, 1310_6, . . . and the plurality of connection units 1330_1, 1330_2, 1330_3, 1330_4, 1330_5, 1330_6, . . . may be embodied as described above with reference to FIG. 14, and thus, will not be described again here.

Each of the plurality of shield lines SL1, SL2, SL3, SL4, SL5, SL6, . . . may be disposed on the same layer as the plurality of global bit lines GBL1, GBL2, GBL3, GBL4, GBL5, GBL6, . . . , and between adjacent global bit lines. For example, the shield line SL3 may be disposed between the global bit line GBL1 and the global bit line GBL5, and the shield line SL4 may be disposed between the global bit line GBL2 and the global bit line GBL6. Each of the other shield lines SL1, SL2, SL5, SL6, . . . may be disposed between a corresponding global bit line and a global bit line adjacent to the corresponding global bit line in the first direction.

Each of the shield lines SL1, SL2, SL3, SL4, SL5, SL6, . . . may be maintained at a constant or substantially constant voltage level. For example, each of the shield lines SL1, SL2, SL3, SL4, SL5, SL6, . . . may be maintained at a ground voltage level. Thus, each of the shield lines SL1, SL2, SL3, SL4, SL5, SL6, . . . may compensate for coupling between the corresponding global bit line and the global bit line adjacent to the corresponding global bit line in the first direction. For example, the shield line SL3 may compensate for coupling between the global bit line GBL1 and the global bit line GBL5, and the shield line SL4 may compensate for coupling between the global bit line GBL2 and the global bit line GBL6. Each of the other shield lines SL1, SL2, SL5, SL6, . . . may be disposed between a corresponding global bit line and a global bit line adjacent to the corresponding global bit line in the first direction.

The semiconductor memory devices 1300 to 1500 illustrated in FIGS. 13 to 15 have an open bit line architecture. However, example embodiments are not limited thereto, and the semiconductor memory devices 1300 to 1500 may have a folded bit line architecture. For example, an input terminal of each of the plurality of first bit line sense amplifiers 1320_1, 1320_2, 1320_3, 1320_4, 1320_5, . . . may be connected to one of corresponding first and second bit lines, and an inversion input terminal thereof may be connected to the other bit line. Also, an input terminal and inversion input terminal of each of the plurality of second bit line sense amplifiers 1325_1, 1325_2, 1325_3, 1325_4, . . . may be connected to a corresponding third bit line and another corresponding third bit line, respectively.

Figure 16:
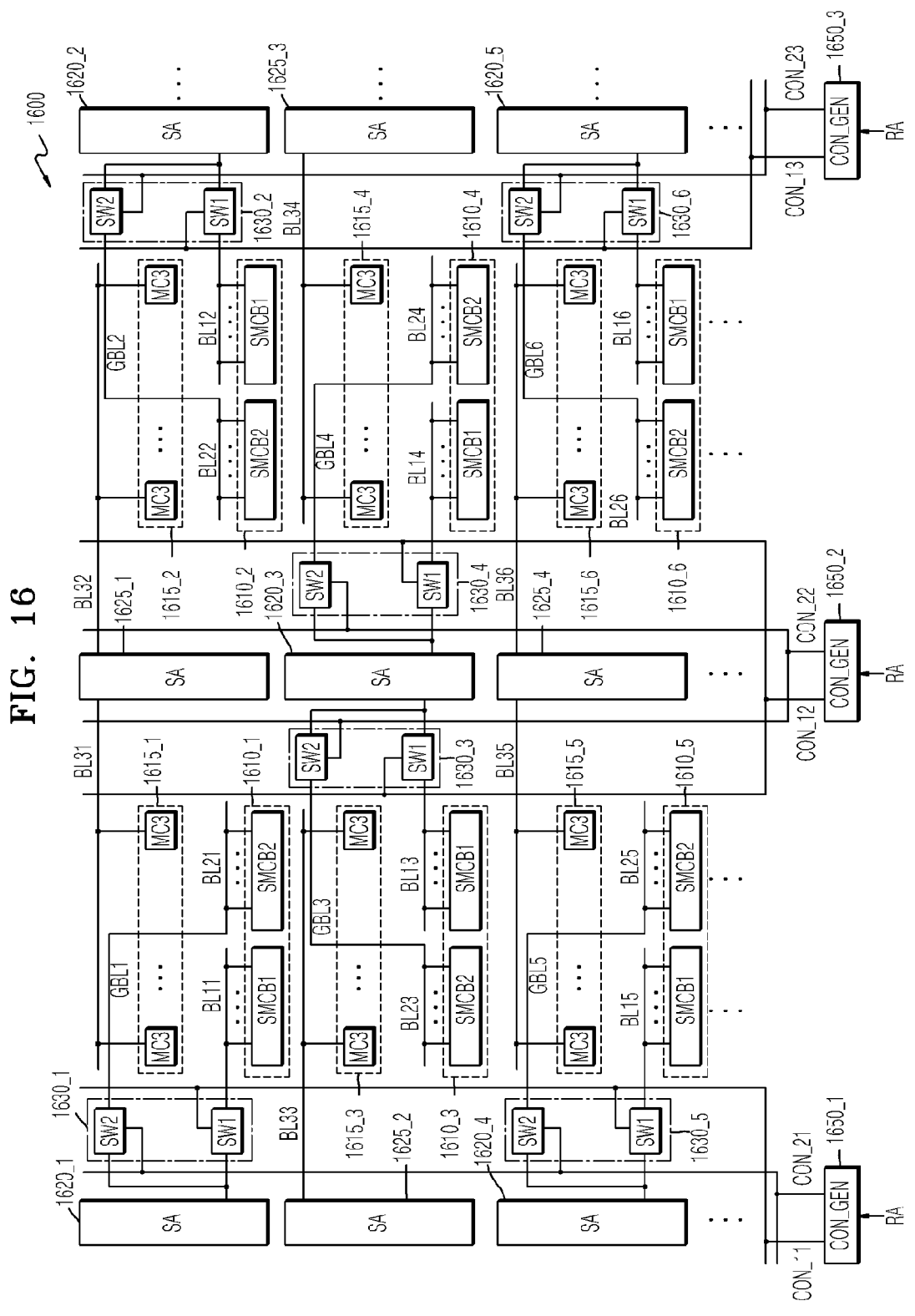

FIG. 16 is a block diagram of a semiconductor memory device 1600 according to another example embodiment of inventive concepts.

Referring to FIG. 16, the semiconductor memory device 1600 may include a plurality of first memory cell blocks 1610_1, 1610_2, 1610_3, 1610_4, 1610_5, 1610_6, . . . , a plurality of second memory cell blocks 1615_1, 1615_2, 1615_3, 1615_4, 1615_5, 1615_6, . . . , a plurality of first bit lines BL11, BL12, BL13, BL14, BL15, BL16, . . . , a plurality of second bit lines BL21, BL22, BL23, BL24, BL25, BL26, . . . , a plurality of third bit lines BL31, BL32, BL33, BL34, BL35, BL36, . . . , a plurality of global bit lines GBL1, GBL2, GBL3, GBL4, GBL5, GBL6, . . . , a plurality of first bit line sense amplifiers 1620_1, 1620_2, 1620_3, 1620_4, 1620_5, . . . , a plurality of second bit line sense amplifiers 1625_1, 1625_2, 1625_3, 1625_4, . . . , a plurality of connection units 1630_1, 1630_2, 1630_3, 1630_4, 1630_5, 1630_6, . . . , and a plurality of control signal generation units 1650_1, 1650_2, 1650_3, . . . .

The semiconductor memory device 1600 is the same as or similar to the semiconductor memory device 1300 of FIG. 13, except for locations of the plurality of connection units 1630_1, 1630_2, 1630_3, 1630_4, 1630_5, 1630_6, . . . . More specifically, locations of second switch units SW2 of the semiconductor memory device 1600 are different from the locations of the second switch units SW2 of the semiconductor memory device 1300. Hereinafter, the semiconductor memory device 1600 will be described focusing on the differences between the semiconductor memory device 1600 and the semiconductor memory device 1300 due to the different locations of the connection units 1630_1, 1630_2, 1630_3, 1630_4, 1630_5, 1630_6, . . . .

Each of the plurality of connection units 1630_1, 1630_2, 1630_3, 1630_4, 1630_5, 1630_6, . . . may connect a corresponding first bit line to a corresponding first bit line sense amplifier in response to a corresponding first control signal from among a plurality of first control signals CON_11, CON_12, CON_13, . . . , or may connect a corresponding second bit line to the corresponding first bit line sense amplifier via a corresponding global bit line in response to a corresponding second control signal from among a plurality of second control signals CON_21, CON_22, CON_23, . . . .

Each of the plurality of connection units 1630_1, 1630_2, 1630_3, 1630_4, 1630_5, 1630_6, . . . may include a first switch unit SW1 and a second switch unit SW2. The first switch unit SW1 may selectively connect a corresponding first bit line to a corresponding first bit line sense amplifier in response to a corresponding first control signal. The second switch unit SW2 may selectively connect the corresponding first bit line sense amplifier to a global bit line, which is connected to a corresponding second bit line, in response to a corresponding second control signal. For example, the first switch unit SW1 of the connection unit 1630_1 may selectively connect the first bit line BL11 to the first bit line sense amplifier 1620_1 in response to the first control signal CON_11. The second switch unit SW2 of the connection unit 1630_1 may selectively connect the bit line sense amplifier 1620_1 to the global bit line GBL1, which is connected to the second bit line BL21, in response to the second control signal CON_21.

One of the first and second switch units SW1 and SW2 included in each of the plurality of connection units 1630_1, 1630_2, 1630_3, 1630_4, 1630_5, 1630_6, . . . may be enabled, or both of them may be disabled. If the first switch unit SW1 is disabled in response to a first control signal, then the second switch unit SW2 may be enabled or disabled in response to a corresponding second control signal. If the second switch unit SW2 is disabled in response to a second control signal, then the first switch unit SW1 may be enabled or disabled in response to a corresponding first control signal. If the first switch unit SW1 is enabled, then the first switch unit SW1 connects a corresponding first bit line to a corresponding first bit line sense amplifier. If the first switch unit SW1 is disabled, then the first switch unit SW1 disconnects the corresponding first bit line from the corresponding first bit line sense amplifier. If the second switch unit SW2 is enabled, then the second switch unit SW2 connects the corresponding bit line sense amplifier to a corresponding global bit line. If the second switch unit SW2 is disabled, then the second switch unit SW2 disconnects the corresponding bit line sense amplifier from the corresponding global bit line.

In this example, if a word line connected to one of the first memory cells in the first region SMCB1 of the first memory cell block 1610_3 is enabled, then the first switch unit SW1 of the connection unit 1630_3 may connect the first bit line BL13 to the first bit line sense amplifier 1620_3 in response to the first control signal CON_12, and the second switch unit SW2 of the connection unit 1630_3 may disconnect the first bit line sense amplifier 1620_3 from the global bit line GBL3 in response to the second control signal CON_22.

The first switch unit SW1 and the second switch SW2 may be disposed between a corresponding first bit line sense amplifier and a corresponding first memory cell block. In this example, the first switch unit SW1 and the second switch unit SW2 may be disposed at an edge of the corresponding first memory cell block. FIG. 13 illustrates an example case where each second switch unit SW2 is disposed at a location corresponding to a center of a corresponding memory cell block, whereas FIG. 16 illustrates a case where each second switch unit SW2 is disposed at an edge of a corresponding memory cell block. For example, the first switch unit SW1 and the second switch SW2 of the connection unit 1630_3 may be disposed between the first bit line sense amplifier 1620_3 and the first memory cell block 1610_3. In another example, the first switch unit SW1 and the second switch unit SW2 of the connection unit 1630_4 may be disposed between the first bit line sense amplifier 1620_3 and the first memory cell block 1610_4.

Each of the plurality of global bit lines GBL1, GBL2, GBL3, GBL4, GBL5, GBL6, GBL7, GBL8, . . . that are connected to the plurality of second bit lines BL21, BL22, BL23, BL24, BL25, BL26, BL27, BL28, . . . , respectively, may be selectively connected to a corresponding bit line sense amplifier from among the plurality of first bit line sense amplifiers 1620_1, 1620_2, 1620_3, 1620_4, 1620_5, . . . via the second switch unit SW2 of a corresponding connection unit from among the plurality of connection units 1630_1, 1630_2, 1630_3, 1630_4, 1630_5, 1630_6, . . . . For example, the global bit line GBL1 connected to the second bit line BL21 may be selectively connected to the first bit line sense amplifier 1620_1 via the second switch unit SW2 of the connection unit 1630_1.

Figure 17:
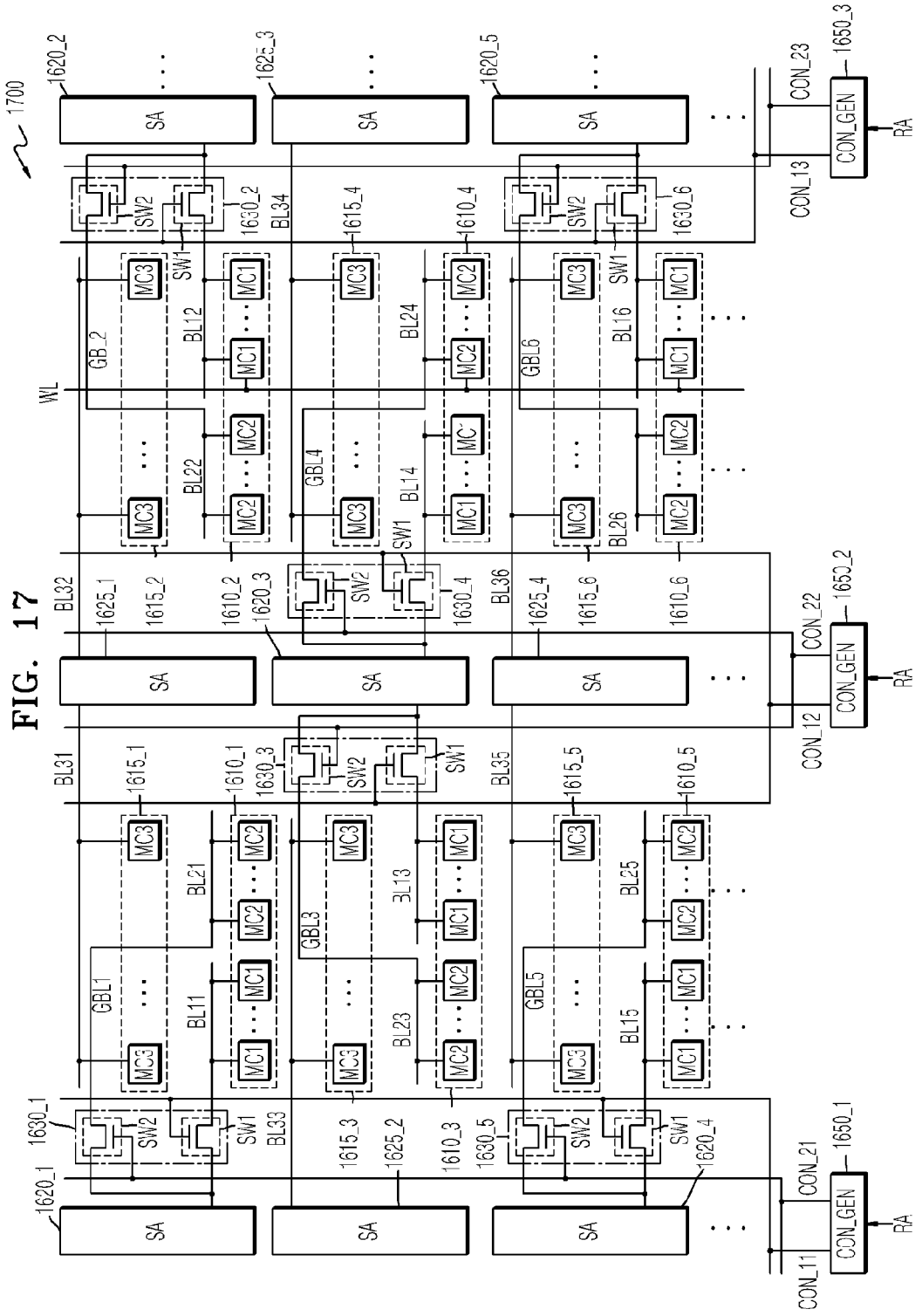
FIG. 17 is a circuit diagram of a semiconductor memory device, such as the semiconductor memory device of FIG. 16, according to another example embodiment of inventive concepts.

FIG. 17 is a circuit diagram of a semiconductor memory device 1700, such as the semiconductor memory device 1600 of FIG. 16, according to another example embodiment of inventive concepts.

Referring to FIG. 17, the semiconductor memory device 1700 may include a plurality of first memory cell blocks 1610_1, 1610_2, 1610_3, 1610_4, 1610_5, 1610_6, . . . , a plurality of second memory cell blocks 1615_1, 1615_2, 1615_3, 1615_4, 1615_5, 1615_6, . . . , a plurality of first bit lines BL11, BL12, BL13, BL14, BL15, BL16, . . . , a plurality of second bit lines BL21, BL22, BL23, BL24, BL25, BL26, . . . , a plurality of third bit lines BL31, BL32, BL33, BL34, BL35, BL36, . . . , a plurality of global bit lines GBL1, GBL2, GBL3, GBL4, GBL5, GBL6, . . . , a plurality of first bit line sense amplifiers 1620_1, 1620_2, 1620_3, 1620_4, 1620_5, . . . , a plurality of second bit line sense amplifiers 1625_1, 1625_2, 1625_3, 1625_4, . . . , a plurality of connection units 1630_1, 1630_2, 1630_3, 1630_4, 1630_5, 1630_6, . . . , and a plurality of control signal generation units 1650_1, 1650_2, 1650_3, . . . . In FIGS. 16 and 17, the same reference numerals denote the same elements.

Each of the plurality of first memory cell blocks 1610_1, 1610_2, 1610_3, 1610_4, 1610_5, 1610_6, . . . may include a plurality of first memory cells MC1 and a plurality of second memory cells MC2. The first region SMCB1 and the second region SMCB2 of FIG. 16 may include the first memory cells MC1 and the second memory cells MC2 of FIG. 17, respectively. For example, in FIG. 17, the first memory cells MC1 of the first memory cell block 1610_1 may be included in the first region SMCB1 of the first memory cell block 1610_1 of FIG. 16, and the second memory cells MC2 of the first memory cell block 1610_1 may be included in the second region SMCB2 of the first memory cell block 1610_1 of FIG. 16. The first memory cells MC1 may be connected to a corresponding first bit line from among the plurality of first bit lines BL11, BL12, BL13, BL14, BL15, BL16, . . . , and the second memory cells MC2 may be connected to a corresponding second bit line from among the plurality of second bit lines BL21, BL22, BL23, BL24, BL25, BL26, . . . . For example, the first memory cells MC1 and the second memory cells MC2 of the first memory cell block 1610_1 may be connected to the first bit line BL11 and the second bit line BL21, respectively.

The first memory cell MC1, the second memory cell MC2, and/or a third memory cell MC3 may include one transistor and one capacitor. The structures of the first memory cell MC1, the second memory cell MC2, and the third memory cell MC3 are the same as or similar to those described above with reference to FIG. 14, and thus, will not be described again here. The structures and connections of the first memory cell blocks 1610_1, 1610_2, 1610_3, 1610_4, 1610_5, 1610_6, . . . and the second memory cell blocks 1615_1, 1615_2, 1615_3, 1615_4, 1615_5, 1615_6, . . . are the same as or similar to those described above with reference to FIG. 16, and thus, will not be described again here.

Each of the plurality of first bit line sense amplifiers 1620_1, 1620_2, 1620_3, 1620_4, 1620_5, . . . may be connected to the first or second cells MC1 or MC2 of a corresponding first memory cell block from among the plurality of first memory cell blocks 1610_1, 1610_2, 1610_3, 1610_4, 1610_5, 1610_6, . . . . Each of the plurality of second bit line sense amplifiers 1625_1, 1625_2, 1625_3, 1625_4, . . . may be connected to third memory cells MC3 of a corresponding second memory cell block from among the plurality of second memory cell blocks 1615_1, 1615_2, 1615_3, 1615_4, 1615_5, 1615_6, . . . . The connections of the first bit line sense amplifiers 1620_1, 1620_2, 1620_3, 1620_4, 1620_5, . . . and the second bit line sense amplifiers 1625_1, 1625_2, 1625_3, 1625_4, . . . are the same as or similar to those described above with reference to FIG. 16, and thus, will not be described again here.

Each of the plurality of connection units 1630_1, 1630_2, 1630_3, 1630_4, 1630_5, 1630_6, . . . may connect a corresponding first bit line to a corresponding first bit line sense amplifier in response to a corresponding first control signal from among a plurality of first control signals CON_11, CON_12, CON_13, . . . , or may connect a corresponding second bit line to the corresponding first bit line sense amplifier via a corresponding global bit line in response to a corresponding second control signal from among a plurality of second control signals CON_21, CON_22, CON_23, . . . .

Each of the plurality of connection units 1630_1, 1630_2, 1630_3, 1630_4, 1630_5, 1630_6, . . . may include a first switch unit SW1 and a second switch unit SW2 as illustrated in FIG. 16. As described above with reference to FIG. 16, the first switch unit SW1 may selectively connect a corresponding first bit line to a corresponding first bit line sense amplifier in response to a corresponding first control signal, and the second switch unit SW2 may selectively connect the corresponding first bit line sense amplifier to a global bit line, which is connected to a corresponding second bit line, in response to a corresponding second control signal.

FIG. 17 illustrates an example case where the first switch unit SW1 and the second switch unit SW2 of FIG. 16 are NMOS transistors. For example, the first switch unit SW1 of the connection unit 1630_1 may be an NMOS transistor that selectively connects the first bit line BL11 to the first bit line sense amplifier 1620_1 in response to the first control signal CON_12. The second switch unit SW2 of the connection unit 1630_1 may selectively connect the global bit line GBL1, which is connected to the second bit line BL21 to the first bit line sense amplifier 1620_2, in response to the second control signal CON_21.

In at least the example embodiment of FIG. 17, if the first switch unit SW1 is an NMOS transistor, then the first switch unit SW1 may be enabled to connect a corresponding first bit line to a corresponding bit line sense amplifier when the corresponding first control signal is logic high, but may be disabled to disconnect the corresponding first bit line from the corresponding bit line sense amplifier when the corresponding first control signal is logic low. If the second switch unit SW2 is an NMOS transistor, then the second switch unit SW2 may be enabled to connect a corresponding second bit line to the corresponding bit line sense amplifier when a corresponding second control signal is logic high, but may be disabled to disconnect the corresponding second bit line from the corresponding bit line sense amplifier when the corresponding second control signal is logic low.

Although FIG. 17 illustrates a case where the first switch unit SW1 and the second switch unit SW2 are NMOS transistors, example embodiments are not limited thereto, and other devices may be embodied as the first switch unit SW1 and the second switch unit SW2 as long as the other devices are capable of operating in the same or a similar manner as the first switch unit SW1 and the second switch unit SW2 described above. For example, the first switch unit SW1 and the second switch unit SW2 may be PMOS transistors. In this example, logic states of the plurality of first control signals CON_11, CON_12, CON_13, . . . and the plurality of second control signals CON_21, CON_22, CON_23, . . . may be opposite to when the first switch unit SW1 and the second switch unit SW2 are NMOS transistors.

Each of the plurality of control signal generation units 1650_1, 1650_2, 1650_3, . . . may generate a corresponding first control signal and second control signal based on a row address RA. The structures and operations of the plurality of control signal generation units 1650_1, 1650_2, 1650_3, . . . are the same as or similar to those described above with reference to FIG. 13.

The semiconductor memory device 1600 of FIG. 16 and the semiconductor memory device 1700 of FIG. 17 operate in the same or a similar manner as the semiconductor memory device 1300 of FIG. 13 and the semiconductor memory device 1400 of FIG. 14, except that the locations of the second switch units SW2 are different. Thus, the operations of the semiconductor memory device 1600 and the semiconductor memory device 1700 will not be described again here.

Figure 18:
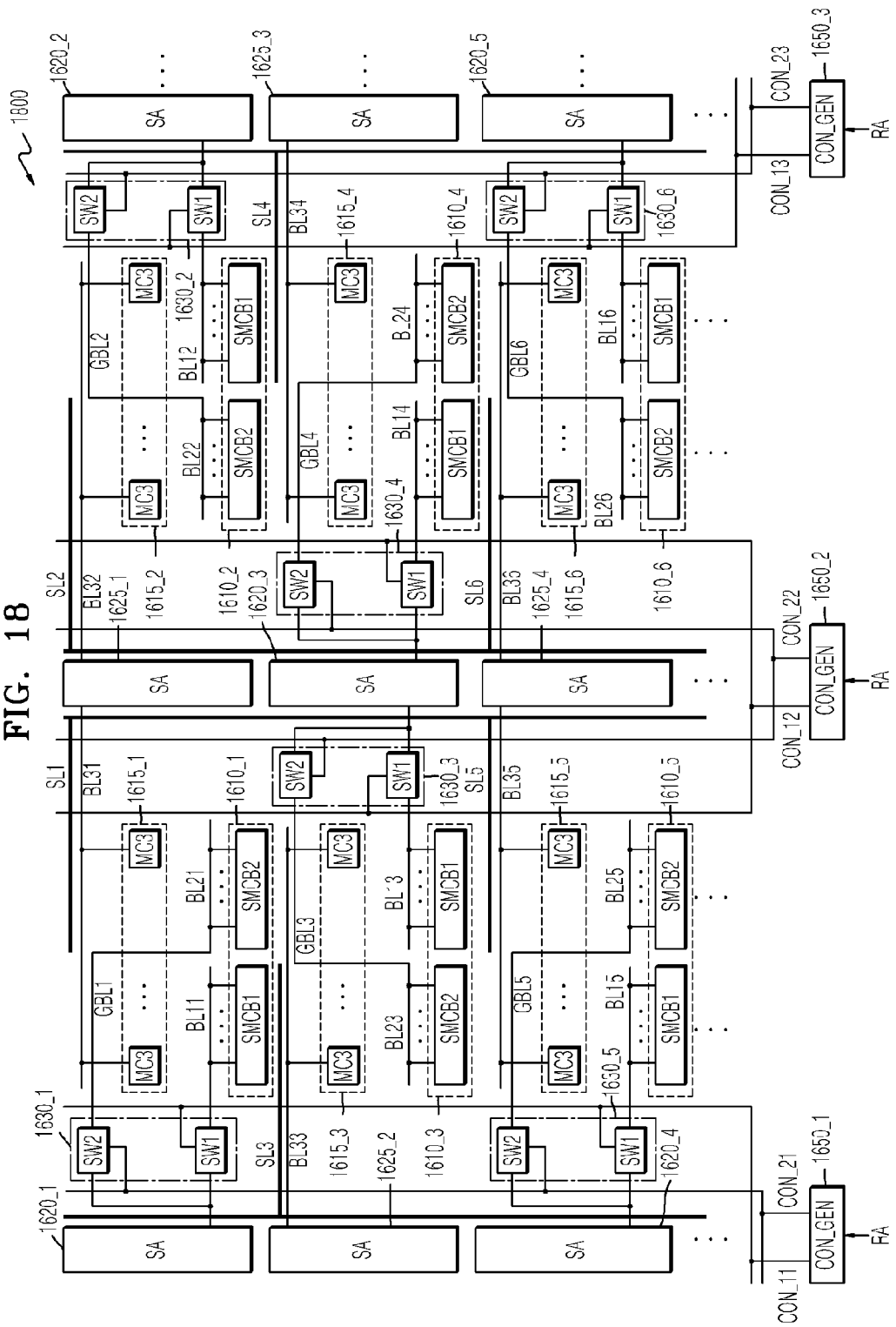
FIG. 18 is a block diagram of a semiconductor memory device according to another example embodiment of inventive concepts.

FIG. 18 is a block diagram of a semiconductor memory device 1800 according to another example embodiment of inventive concepts.

Referring to FIG. 18, the semiconductor memory device 1800 may include a plurality of first memory cell blocks 1610_1, 1610_2, 1610_3, 1610_4, 1610_5, 1610_6, . . . , a plurality of second memory cell blocks 1615_1, 1615_2, 1615_3, 1615_4, 1615_5, 1615_6, . . . , a plurality of first bit lines BL11, BL12, BL13, BL14, BL15, BL16, . . . , a plurality of second bit lines BL21, BL22, BL23, BL24, BL25, BL26, . . . , a plurality of third bit lines BL31, BL32, BL33, BL34, BL35, BL36, . . . , a plurality of global bit lines GBL1, GBL2, GBL3, GBL4, GBL5, GBL6, . . . , a plurality of first bit line sense amplifiers 1620_1, 1620_2, 1620_3, 1620_4, 1620_5, . . . , a plurality of second bit line sense amplifiers 1625_1, 1625_2, 1625_3, 1625_4, . . . , a plurality of connection units 1630_1, 1630_2, 1630_3, 1630_4, 1630_5, 1630_6, . . . , a plurality of control signal generation units 1650_1, 1650_2, 1650_3, . . . , and a plurality of shield lines SL1, SL2, SL3, SL4, SL5, SL6, . . . . In FIGS. 16 to 18, the same reference numerals denote the same elements.

In FIG. 18, the plurality of first memory cell blocks 1610_1, 1610_2, 1610_3, 1610_4, 1610_5, 1610_6, . . . , the plurality of second memory cell blocks 1615_1, 1615_2, 1615_3, 1615_4, 1615_5, 1615_6, . . . , the plurality of first bit lines BL11, BL12, BL13, BL14, BL15, BL16, . . . , the plurality of second bit lines BL21, BL22, BL23, BL24, BL25, BL26, . . . , the plurality of third bit lines BL31, BL32, BL33, BL34, BL35, BL36, . . . , the plurality of global bit lines GBL1, GBL2, GBL3, GBL4, GBL5, GBL6, . . . , the plurality of first bit line sense amplifiers 1620_1, 1620_2, 1620_3, 1620_4, 1620_5, . . . , the plurality of second bit line sense amplifiers 1625_1, 1625_2, 1625_3, 1625_4, . . . , the plurality of connection units 1630_1, 1630_2, 1630_3, 1630_4, 1630_5, 1630_6, . . . , and the plurality of control signal generation units 1650_1, 1650_2, 1650_3, . . . are the same as or similar to those described above with reference to FIG. 16. Also, the plurality of first memory cell blocks 1610_1, 1610_2, 1610_3, 1610_4, 1610_5, 1610_6, . . . and the plurality of connection units 1630_1, 1630_2, 1630_3, 1630_4, 1630_5, 1630_6, . . . may be embodied in the same or a similar manner as described above with reference to FIG. 17, and thus, will not be described again here.

Each of the plurality of shield lines SL1, SL2, SL3, SL4, SL5, SL6, . . . may be disposed on the same layer as the plurality of global bit lines GBL1, GBL2, GBL3, GBL4, GBL5, GBL6, . . . , and between adjacent global bit lines. For example, the shield line SL3 may be disposed between the global bit line GBL1 and the global bit line GBL5, and the shield line SL4 may be disposed between the global bit line GBL2 and the global bit line GBL6. Each of the other shield lines SL1, SL2, SL5, SL6, . . . may be disposed between a corresponding global bit line and a global bit line adjacent to the corresponding global bit line in the first direction.

Each of the shield lines SL1, SL2, SL3, SL4, SL5, SL6, . . . may be maintained at a constant or substantially constant voltage level. For example, each of the shield lines SL1, SL2, SL3, SL4, SL5, SL6, . . . may be maintained at a ground voltage level. Thus, each of the shield lines SL1, SL2, SL3, SL4, SL5, SL6, . . . may compensate for coupling between the corresponding global bit line and the global bit line adjacent to the corresponding global bit line in the first direction. The shield lines SL1, SL2, SL3, SL4, SL5, SL6, . .

. are the same as or similar to those described above with reference to FIG. 15, and thus, will not be described again here.

The semiconductor memory devices 1600 to 1800 illustrated in FIGS. 16 to 18 have an open bit line architecture. However, example embodiments are not limited thereto, and the semiconductor memory devices 1600 to 1800 may have a folded bit line architecture. For example, an input terminal of each of the plurality of first bit line sense amplifiers 1620_1, 1620_2, 1620_3, 1620_4, 1620_5, . . . may be connected to one of corresponding first and second bit lines, and an inversion input terminal thereof may be connected to the other bit line. Also, an input terminal and inversion input terminal of each of the plurality of second bit line sense amplifiers 1625_1, 1625_2, 1625_3, 1625_4, . . . may be connected to a corresponding third bit line and another corresponding third bit line, respectively.

Figure 19:
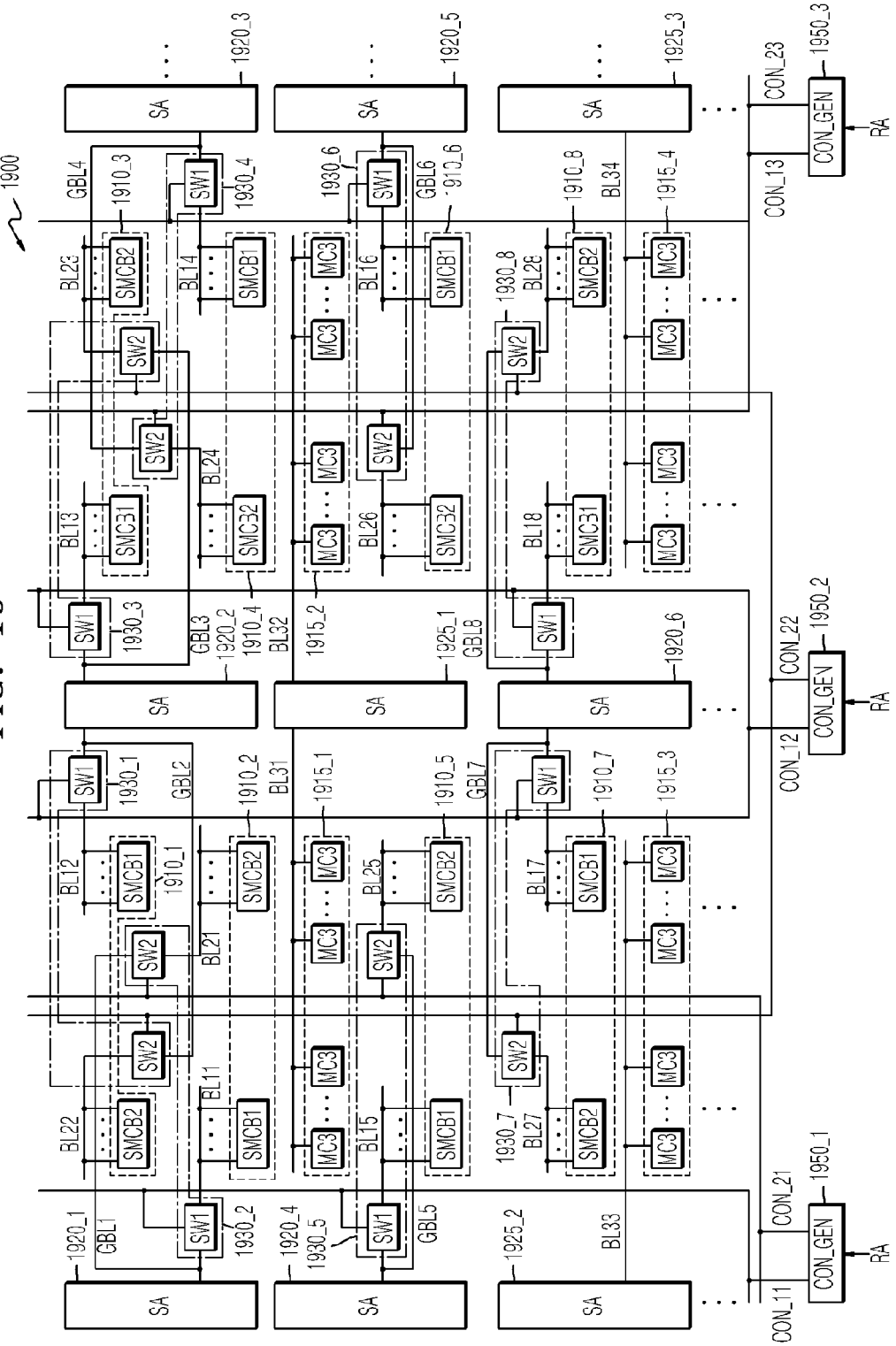
FIG. 19 is a block diagram of a semiconductor memory device according to another example embodiment of inventive concepts.

FIG. 19 is a block diagram of a semiconductor memory device 1900 according to another example embodiment of inventive concepts.

Referring to FIG. 19, the semiconductor memory device 1900 may include a plurality of first memory cell blocks 1910_1, 1910_2, 1910_3, 1910_4, 1910_5, 1910_6, 1910_7, 1910_8, . . . , a plurality of second memory cell blocks 1915_1, 1915_2, 1915_3, 1915_4, . . . , a plurality of first bit lines BL11, BL12, BL13, BL14, BL15, BL16, BL17, BL18, . . . , a plurality of second bit lines BL21, BL22, BL23, BL24, BL25, BL26, BL27, BL28, . . . , a plurality of third bit lines BL31, BL32, BL33, BL34, . . . , a plurality of global bit lines GBL1, GBL2, GBL3, GBL4, GBL5, GBL6, GBL7, GBL8, . . . , a plurality of first bit line sense amplifiers 1920_1, 1920_2, 1920_3, 1920_4, 1920_5, 1920_6, . . . , a plurality of second bit line sense amplifiers 1925_1, 1925_2, 1925_3, . . . , a plurality of connection units 1930_1, 1930_2, 1930_3, 1930_4, 1930_5, 1930_6, 1930_7, 1930_8, . . . , and a plurality of control signal generation units 1950_1, 1950_2, 1950_3, . . . .

Each of the plurality of first memory cell blocks 1910_1, 1910_2, 1910_3, 1910_4, 1910_5, 1910_6, 1910_7, 1910_8, . . . may include a first region SMCB1 in which a plurality of first memory cells are arranged, and a second region SMCB2 in which a plurality of second memory cells are arranged. Each of the plurality of second memory cell blocks 1915_1, 1915_2, 1915_3, 1915_4, . . . may include a plurality of third memory cells MC3. Each of the first bit lines BL11, BL12, BL13, BL14, BL15, BL16, BL17, BL18, . . . may be connected to the first memory cells in the first region SMCB1 of a corresponding first memory cell block from among the plurality of first memory cell blocks 1910_1, 1910_2, 1910_3, 1910_4, 1910_5, 1910_6, 1910_7, 1910_8, . . . . Each of the second bit lines BL21, BL22, BL23, BL24, BL25, BL26, BL27, BL28, . . . may be connected to the second memory cells in the second region SMCB2 of a corresponding first memory cell block from among the plurality of first memory cell blocks 1910_1, 1910_2, 1910_3, 1910_4, 1910_5, 1910_6, 1910_7, 1910_8, . . . . Also, each of the second bit lines BL21, BL22, BL23, BL24, BL25, BL26, BL27, BL28, . . . may be connected to a corresponding global bit line from among the plurality of global bit lines GBL1, GBL2, GBL3, GBL4, GBL5, GBL6, GBL7, GBL8, . . . . Each of the third bit lines BL31, BL32, BL33, BL34, . . . may be connected to the third memory cells MC3 of a corresponding second memory cell block from among the plurality of second memory cell blocks 1915_1, 1915_2, 1915_3, 1915_4, . . . . In this example embodiment, the semiconductor memory device 1900 may have both a hierarchical bit line architecture and a general bit line architecture.

For example, in the first region SMCB1 of the first memory cell block 1910_1, the first memory cells connected to the first bit line BL12 may be arranged. In the second region SMCB2 of the first memory cell block 1910_1, the second memory cells connected to the second bit line BL22 may be arranged.

Figure 20:
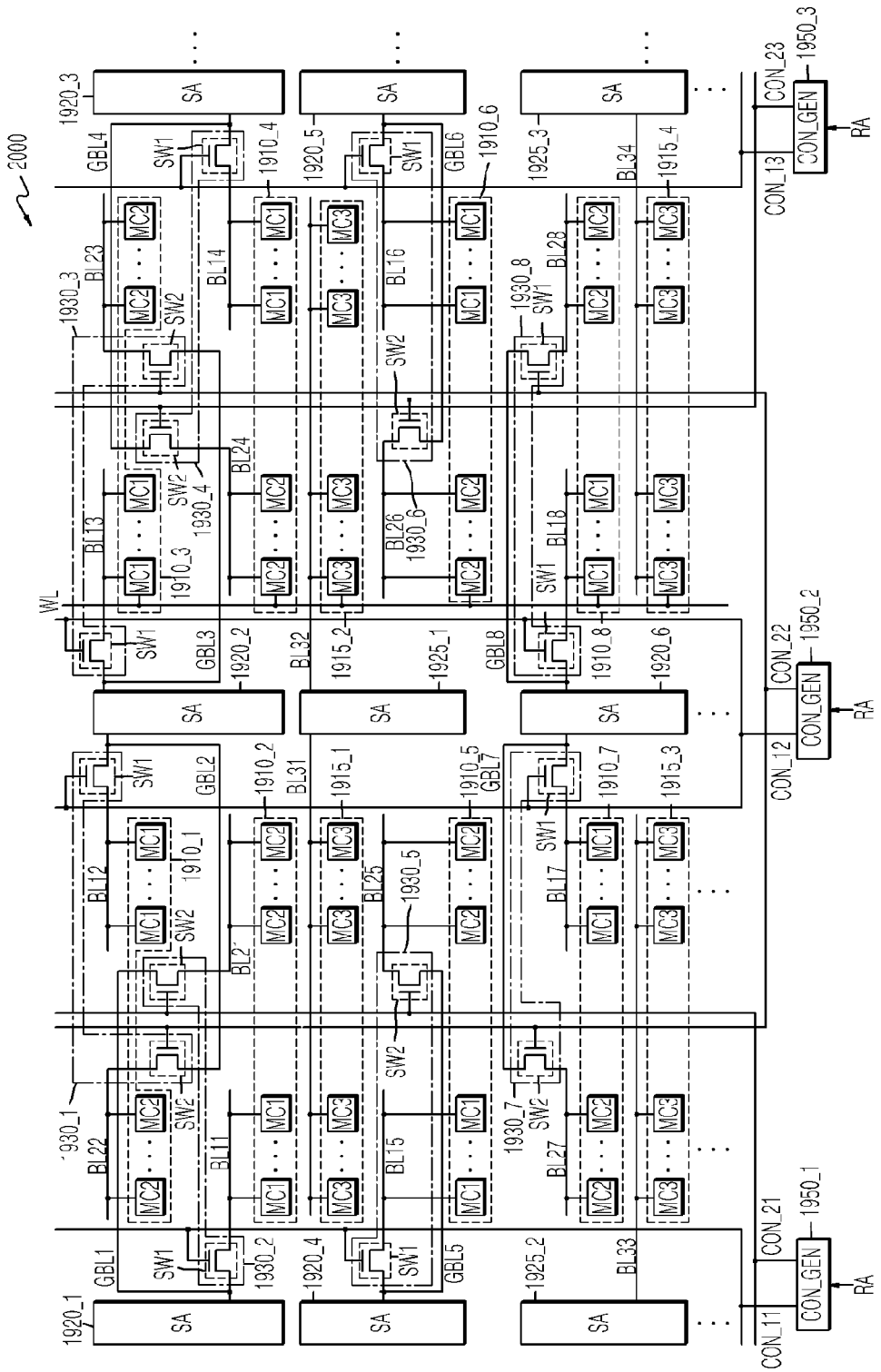
FIG. 20 is a circuit diagram of a semiconductor memory device, such as the semiconductor memory device of FIG. 19, according to another example embodiment of inventive concepts.

FIG. 20 illustrates an example embodiment of the first memory cells arranged in the first region SMCB1 and the second memory cells arranged in the second region SMCB2.

According to at least one example embodiment of inventive concepts, each of the plurality of first memory cell blocks 1910_1, 1910_2, 1910_3, 1910_4, 1910_5, 1910_6, 1910_7, 1910_8, . . . may be divided into two equal parts: the first and second regions SMCB1 and SMCB2. However, example embodiments are not limited thereto, and the sizes of the first and second regions SMCB1 and SMCB2 may be different from each other.

In at least the example embodiment of FIG. 19, two first memory cell blocks from among the plurality of first memory cell blocks 1910_1, 1910_2, 1910_3, 1910_4, 1910_5, 1910_6, 1910_7, 1910_8, . . . and one second memory cell block from among the plurality of second memory cell blocks 1915_1, 1915_2, 1915_3, 1915_4, . . . cross one another in the first direction. However, example embodiments are not limited thereto, and at least one first memory cell block and at least one second memory cell block may cross each other in the first direction. In at least the example embodiment of FIG. 19, the first memory cell blocks 1910_1 and 1910_2 and the second memory cell block 1915_1 may be arranged in the first direction, and the second memory cell block 1915_1 and the first memory cell blocks 1910_5 and 1910_7 may be arranged in the first direction. Also, the first memory cell blocks 1910_3 and 1910_4 and the second memory cell block 1315_2 may be arranged in the first direction, and the second memory cell block 1315_2 and the first memory cell blocks 1910_6 and 1910_8 may be arranged in the first direction.

The first region SMCB1 and the second region SMCB2 of each of the plurality of first memory cell blocks 1910_1, 1910_2, 1910_3, 1910_4, 1910_5, 1910_6, 1910_7, 1910_8, . . . may be arranged adjacent to each other in a second direction. In at least this example embodiment, the first region SMCB1 and the second region SMCB2 included in one first memory cell block may be arranged adjacent to each other in the second direction. For example, the first region SMCB1 and the second region SMCB2 included in the first memory cell block 1310_2 may be arranged adjacent to each other in the second direction.

The second direction may not be parallel to the first direction or may be perpendicular to the first direction. For example, the first direction may be a column-wise direction, and the second direction may be a row-wise direction.

Each of the plurality of first bit line sense amplifiers 1920_1, 1920_2, 1920_3, 1920_4, 1920_5, 1920_6, . . . may be connected to the first or second region SMCB1 or SMCB2 of a corresponding first memory cell block from among the plurality of first memory cell blocks 1910_1, 1910_2, 1910_3, 1910_4, 1910_5, 1910_6, 1910_7, 1910_8, . . . . Each of the plurality of second bit line sense amplifiers 1925_1, 1925_2, 1925_3, . . . may be connected to third memory cells MC3 of a corresponding second memory cell block from among the plurality of second memory cell blocks 1915_1, 1915_2, 1915_3, 1915_4, . . . .

The semiconductor memory device 1900 may have an open bit line architecture as illustrated in FIG. 19. In at least the example embodiment of FIG. 19, each of the plurality of first bit line sense amplifiers 1920_1, 1920_2, 1920_3, 1920_4, 1920_5, 1920_6, . . . may include an input terminal via which data stored in the memory cells in the first or second region SMCB1 or SMCB2 of an adjacent first memory cell block in a given direction is received, and an inversion input terminal via which data stored in the memory cells in the first or second region SMCB1 or SMCB2 of an adjacent memory cell block in the opposite direction is received. For example, the input terminal of the first bit line sense amplifier 1920_2 may be connected to the first bit line BL12 or may be connected to the second bit line BL22 via the global bit line GBL2, and the inversion input terminal of the first bit line sense amplifier 1920_2 may be connected to the first bit line BL13 or may be connected to the second bit line BL23 via the global bit line GBL3. Otherwise, the inversion input terminal of the first bit line sense amplifier 1920_2 may be connected to the first bit line BL12 or may be connected to the second bit line BL22 via the global bit line GBL2, and the input terminal of the first bit line sense amplifier 1920_2 may be connected to the first bit line BL13 or may be connected to the second bit line BL23 via the global bit line GBL3.

Each of the plurality of second bit line sense amplifiers 1925_1, 1925_2, 1925_3, 1925_4, . . . may include an input terminal via which data stored in the third memory cells MC3 of a second memory cell block adjacent in one direction is received, and an inversion input terminal via which data stored in the third memory cells MC3 of a second memory cell block adjacent in the opposite direction is received. For example, the third bit line BL31 may be connected to the input terminal of the second bit line sense amplifier 1925_1, or the third bit line BL32 may be connected to the inversion input terminal of the second bit line sense amplifier 1925_1. Otherwise, the third bit line BL31 may be connected to the inversion input terminal of the second bit line sense amplifier 1925_1, or the third bit line BL32 may be connected to the input terminal of the second bit line sense amplifier 1925_1.

Each of the plurality of connection units 1930_1, 1930_2, 1930_3, 1930_4, 1930_5, 1930_6, 1930_7, 1930_8, . . . may connect a corresponding first bit line to a corresponding first bit line sense amplifier in response to a corresponding first control signal from among a plurality of first control signals CON_11, CON_12, CON_13, . . . , or may connect a corresponding second bit line to the corresponding first bit line sense amplifier via a corresponding global bit line in response to a corresponding second control signal from among a plurality of second control signals CON_21, CON_22, CON_23, . . . . For example, the connection unit 1930_5 may connect the first bit line BL15 to the first bit line sense amplifier 1920_4 in response to the first control signal CON_11, or may connect the second bit line BL25 to the first bit line sense amplifier 1920_4 via the global bit line GBL5 in response to the second control signal CON_21.

Each of the plurality of connection units 1930_1, 1930_2, 1930_3, 1930_4, 1930_5, 1930_6, 1930_7, 1930_8, . . . may include a first switch unit SW1 and a second switch unit SW2. The first switch unit SW1 may selectively connect a corresponding first bit line to a corresponding first bit line sense amplifier in response to a corresponding first control signal. The second switch unit SW2 may selectively connect a corresponding second bit line to a global bit line connected to the corresponding first bit line sense amplifier in response to a corresponding second control signal.

For example, the first switch unit SW1 of the connection unit 1930_5 may selectively connect the first bit line BL15 to the first bit line sense amplifier 1920_4 in response to the first control signal CON_11. The second switch unit SW2 of the connection unit 1930_5 may selectively connect the global bit line GBL5 connected to the first bit line sense amplifier 1920_4 to the second bit line BL25 in response to the second control signal CON_21.

One of the first and second switch units SW1 and SW2 included in each of the plurality of connection units 1930_1, 1930_2, 1930_3, 1930_4, 1930_5, 1930_6, 1930_7, 1930_8, . . . may be enabled, or both of them may be disabled. If the first switch unit SW1 is disabled in response to a first control signal, then the second switch unit SW2 may be enabled or disabled in response to a corresponding second control signal. If the second switch unit SW2 is disabled in response to a second control signal, then the first switch unit SW1 may be enabled or disabled in response to a corresponding first control signal. If the first switch unit SW1 is enabled, then the first switch unit SW1 connects a corresponding first bit line to a corresponding first bit line sense amplifier. If the first switch unit SW1 is disabled, then the first switch unit SW1 disconnects the corresponding first bit line from the corresponding first bit line sense amplifier. If the second switch unit SW2 is enabled, then the second switch unit SW2 connects a corresponding second bit line to a corresponding global bit line. If the second switch unit SW2 is disabled, then the second switch unit SW2 disconnects the corresponding second bit line from the corresponding global bit line.

For example, if a word line connected to one of the first memory cells in the first region SMCB1 of the memory cell block 1910_1 is enabled, then the first switch unit SW1 of the connection unit 1930_1 may connect the first bit line BL12 to the first bit line sense amplifier 1920_2 in response to the first control signal CON_12, and the second switch unit SW2 of the connection unit 1930_1 may disconnect the second bit line BL22 from the global bit line GBL2 in response to the second control signal CON_22.

The first switch unit SW1 may be disposed between the corresponding first bit line sense amplifier and the corresponding memory cell block. The second switch unit SW2 may be disposed at a location corresponding to a center of the corresponding memory cell block. In this example, the first switch unit SW1 may be disposed at an edge of the corresponding memory cell block. For example, the first switch unit SW1 of the connection unit 1930_1 may be disposed between the first bit line sense amplifier 1920_2 and the first memory cell block 1910_1, and the second switch unit SW2 may be disposed at a location corresponding to a center of the first memory cell block 1910_1.

Each of the second bit lines BL21, BL22, BL23, BL24, BL25, BL26, BL27, BL28, . . . may be selectively connected to a corresponding global bit line from among the plurality of global bit lines GBL1, GBL2, GBL3, GBL4, GBL5, GBL6, GBL7, GBL8, . . . , via the second switch unit SW2 of a corresponding connection unit from among the plurality of connection units 1930_1, 1930_2 1930_3, 1930_4, 1930_5, 1930_6, 1930_7, 1930_8, . . . . For example, the second bit line BL22 may be selectively connected to the global bit line GBL2 via the second switch unit SW2 of the connection unit 1930_1.

The plurality of global bit lines GBL1, GBL2, GBL3, GBL4, GBL5, GBL6, GBL7, GBL8, . . . may be poly lines or metal lines. The plurality of global bit lines GBL1, GBL2, GBL3, GBL4, GBL5, GBL6, GBL7, GBL8, . . . may be disposed on a layer that is different from a layer on which the plurality of first bit lines BL11, BL12, BL13, BL14, BL15, BL16, . . . the plurality of second bit lines BL21, BL22, BL23, BL24, BL25, BL26 . . . , and the plurality of third bit lines BL31, BL32, BL33, BL34, BL35, BL36, . . . are disposed. In at least this example embodiment, the plurality of first bit lines BL11, BL12, BL13, BL14, BL15, BL16, . . . the plurality of second bit lines BL21, BL22, BL23, BL24, BL25, BL26 . . . , and the plurality of third bit lines BL31, BL32, BL33, BL34, BL35, BL36, . . . may be disposed on a first layer, and the plurality of global bit lines GBL1, GBL2, GBL3, GBL4, GBL5, GBL6, . . . may be formed on a second layer that is different from the first layer. Each of the plurality of global bit lines GBL1, GBL2, GBL3, GBL4, GBL5, GBL6, GBL7, GBL8 . . . may be disposed at a location of the second layer, which corresponds to a location between a corresponding first bit line and a corresponding second bit line. For example, the global bit line GBL1 may be disposed at a location of the second layer corresponding to the location of the first or second bit line BL11 or BL22. Otherwise, the global bit line GBL1 may be disposed at a location of the second layer corresponding to a location between the first and second bit lines BL11 and BL22. If the global bit line GBL1 is disposed at a location of the second layer corresponding to the location of the second bit line BL22, then the global bit line GBL5 is disposed at a location of the second layer corresponding to the location of the first bit line BL15. If the global bit line GBL2 is disposed at a location of the second layer corresponding to the location of the second bit line BL21, then the global bit line GBL7 is disposed on a location of the second layer corresponding to the location of the first bit line BL17. The other global bit lines GBL3, GBL4, GBL6, GBL8, . . . may be formed on the second layer as described above.

If the first bit lines BL11, BL12, BL13, BL14, BL15, BL16, BL17, BL18, . . . , the second bit lines BL21, BL22, BL23, BL24, BL25, BL26, BL27, BL28, . . . , and the third bit lines BL31, BL32, BL33, BL34, . . . are referred to as local bit lines, then the pitches between the plurality of global bit lines GBL1, GBL2, GBL3, GBL4, GBL5, GBL6, GBL7, GBL8, . . . may be about three times the pitches between the local bit lines.

Each of the plurality of control signal generation units 1950_1, 1950_2, 1950_3, . . . may generate a corresponding first control signal and second control signal based on a row address RA. For example, the control signal generation unit 1950_1 may generate the first control signal CON_11 and the second control signal CON_21 based on the row address RA. The control signal generation unit 1950_2 may generate the first control signal CON_12 and the second control signal CON_22 based on the row address RA, and the control signal generation unit 1950_3 may generate the first control signal CON_13 and the second control signal CON_23 based on the row address RA.

It is assumed that a word line connected to one of the first memory cells in the first region SMCB1 of the first memory cell block 1910_1, one of the second memory cells in the second region SMCB2 of the first memory cell block 1910_2, one of the third memory cells MC3 of the second memory cell block 1915_1, one of the second memory cells in the second region SMCB2 of the first memory cell block 1910_5, one of the first memory cells in the first region SMCB1 of the first memory cell block 1910_7, and one of the third memory cells MC3 of the second memory cell block 1915_3, is enabled. Also, it is assumed that the first switch unit SW1 is enabled when the corresponding first control signal from among the plurality of first control signals CON_11, CON_12, CON_13, . . . has a first voltage, but is disabled when the corresponding first control signal has a second voltage. Also, it is assumed that the second switch unit SW2 is enabled when the corresponding second control signal from among the plurality of second control signals CON_21, CON_22, CON_23, . . . has the first voltage, but is disabled when the corresponding second control signal has the second voltage.

In this case, the control signal generation unit 1950_1 generates the first control signal CON_11 having the second voltage, and the second control signal CON_21 having the first voltage, according to the row address RA. The control signal generation unit 1950_2 generates the first control signal CON_12 having the first voltage, and the second control signal CON_22 having the second voltage, based on the row address RA. The other control signal generation units 1950_3, . . . may generate the first control signals CON_13, . . . and the second control signals CON_23, . . . that each have the second voltage according to the row address RA. Thus, the first switches SW1 of the connection units 1930_1, 1930_7, . . . to which the first control signal CON_12 is supplied, and the second switches SW2 of the connection units 1930_2, . . . to which the second control signal CON_21 is supplied, are enabled. The other first and second switches SW1 and SW2 are disabled.

Thus, the first bit line sense amplifier 1920_1 may sense and amplify data stored in a second memory cell connected to the enabled word line WL from among the second memory cells in the second region SMCB2 of the first memory cell block 1910_2. The first bit line sense amplifier 1920_2 may sense and amplify data stored in a first memory cell connected to the enabled word line WL from among the first memory cells in the first region SMCB1 of the first memory cell block 1910_1. The first bit line sense amplifier 1920_4 may sense and amplify data stored in a second memory cell connected to the enabled word line WL from among the second memory cells in the second region SMCB2 of the first memory cell block 1910_5. The first bit line sense amplifier 1920_6 may sense and amplify data stored in a first memory cell connected to the enabled word line WL from among the first memory cells in the first region SMCB1 of the first memory cell block 1910_7. The second bit line sense amplifier 1925_1 may sense and amplify data stored in a third memory cell connected to the enabled word line WL from among the third memory cells MC3 of the second memory cell block 1915_1. The second bit line sense amplifier 1925_2 may sense and amplify data stored in a third memory cell MC3 connected to the enabled word line WL from among the third memory cells MC3 of the second memory cell block 1915_3.

According to at least some example embodiments of inventive concepts, only one of the plurality of first control signals CON_11, CON_12, CON_13, . . . has the first voltage, whereas the other first control signals have the second voltage. Also, only one of the plurality of second control signals CON_21, CON_22, CON_23, . . . has the first voltage, whereas the other second control signals have the second voltage. Here, only the one first control signal and only the one second control signal that have the first voltage may be selected according to the address of the enabled word line.

If the semiconductor memory device 1900 performs the precharging operation, then the plurality of control signal generation units 1950_1, 1950_2, 1950_3, . . . may generate the plurality of first control signals CON_11, CON_12, CON_13, . . . and the plurality of second control signals CON_21, CON_22, CON_23, . . . each having a third voltage. If all of the first control signals CON_11, CON_12, CON_13, . . . and the second control signals CON_21, CON_22, CON_23, . . . have the third voltage, then all of the first switch units SW1 and the second switches SW2 may be enabled.

FIG. 20 is a circuit diagram of a semiconductor memory device 2000, such as the semiconductor memory device 1900 of FIG. 19, according to another example embodiment of inventive concepts.

Referring to FIG. 20, the semiconductor memory device 2000 may include a plurality of first memory cell blocks 1910_1, 1910_2, 1910_3, 1910_4, 1910_5, 1910_6, 1910_7, 1910_8, . . . , a plurality of second memory cell blocks 1915_1, 1915_2, 1915_3, 1915_4, . . . , a plurality of first bit lines BL11, BL12, BL13, BL14, BL15, BL16, BL17, BL18, . . . , a plurality of second bit lines BL21, BL22, BL23, BL24, BL25, BL26, BL27, BL28, . . . , a plurality of third bit lines BL31, BL32, BL33, BL34, . . . , a plurality of global bit lines GBL1, GBL2, GBL3, GBL4, GBL5, GBL6, GBL7, GBL8, . . . , a plurality of first bit line sense amplifiers 1920_1, 1920_2, 1920_3, 1920_4, 1920_5, 1920_6, . . . , a plurality of second bit line sense amplifiers 1925_1, 1925_2, 1925_3, . . . , a plurality of connection units 1930_1, 1930_2, 1930_3, 1930_4, 1930_5, 1930_6, 1930_7, 1930_8, . . . , and a plurality of control signal generation units 1950_1, 1950_2, 1950_3, . . . . In FIGS. 19 and 20, the same reference numerals denote the same elements.

Each of the plurality of first memory cell blocks 1910_1, 1910_2, 1910_3, 1910_4, 1910_5, 1910_6, 1910_7, 1910_8, . . . may include a plurality of first memory cells MC1 and a plurality of second memory cells MC2. The first region SMCB1 and the second region SMCB2 of FIG. 19 may include the first memory cells MC1 and the second memory cells MC2 of FIG. 20, respectively. For example, in FIG. 20, the first memory cells MC1 of the first memory cell block 1910_1 may be included in the first region SMCB1 of the first memory cell block 1910_1 of FIG. 19, and the second memory cells MC2 of the first memory cell block 1910_1 may be included in the second region SMCB2 of the first memory cell block 1910_1 of FIG. 19. The first memory cells MC1 may be connected to a corresponding first bit line from among the plurality of first bit lines BL11, BL12, BL13, BL14, BL15, BL16, BL17, BL18, . . . , and the second memory cells MC2 may be connected to a corresponding second bit line from among the plurality of second bit lines BL21, BL22, BL23, BL24, BL25, BL26, BL27, BL28, . . . . For example, the first memory cells MC1 and the second memory cells MC2 of the first memory cell block 1910_1 may be connected to the first bit line BL12 and the second bit line BL22, respectively.

The first memory cell MC1, the second memory cell MC2, and/or a third memory cell MC3 may include one transistor and one capacitor. A gate and first terminal of the transistor of the first memory cell MC1 may be connected to a corresponding word line and a corresponding second bit line, respectively. The capacitor of the first memory cell MC1 may be connected between a second terminal of the transistor and a ground voltage source. A gate and first terminal of the transistor of the second memory cell MC2 may be connected to the corresponding word line and a corresponding second bit line, respectively. The capacitor of the second memory cell MC2 may be connected between a second terminal of the transistor and the ground voltage source. A gate and first terminal of the transistor of the third memory cell MC3 may be connected to the corresponding word line and a corresponding third bit line, respectively. The capacitor of the third memory cell MC3 may be connected between a second terminal of the transistor and the ground voltage source.

The structures and connections of the first memory cell blocks 1910_1, 1910_2, 1910_3, 1910_4, 1910_5, 1910_6, 1910_7, 1910_8, . . . and the second memory cell blocks 1915_1, 1915_2, 1915_3, 1915_4, . . . are the same as or similar to those described above with reference to FIG. 19, and thus, will not be described again here.

Each of the plurality of first bit line sense amplifiers 1920_1, 1920_2, 1920_3, 1920_4, 1920_5, 1920_6, . . . may be connected to the first or second memory cells MC1 or MC2 of a corresponding first memory cell block from among the plurality of first memory cell blocks 1910_1, 1910_2, 1910_3, 1910_4, 1910_5, 1910_6, 1910_7, 1910_8, . . . . In this example, each of the plurality of first bit line sense amplifiers 1920_1, 1920_2, 1920_3, 1920_4, 1920_5, 1910_6, . . . may sense and amplify data stored in the first or second memory cells MC1 or MC2 of a corresponding first memory cell block. For example, the first bit line sense amplifier 1920_2 may be connected to the first memory cells MC1 of the first memory cell block 1910_1 via the first bit line BL12, or may be connected to the second memory cells MC2 of the first memory cell block 1910_1 via the second bit line BL22 and the global bit line GBL2. The connections of the first bit line sense amplifiers 1920_1, 1920_2, 1920_3, 1920_4, 1920_5, 1920_6, . . . and the second bit line sense amplifiers 1925_1, 1925_2, 1925_3, 1925_4, 1925_5, 1925_6, 1925_7, 1925_8, . . . are the same as or similar to those described above with reference to FIG. 19, and thus, will not be described again here.

Each of the plurality of connection units 1930_1, 1930_2, 1930_3, 1930_4, 1930_5, 1930_6, 1930_7, 1930_8, . . . may connect a corresponding first bit line to a corresponding first bit line sense amplifier in response to a corresponding first control signal from among a plurality of first control signals CON_11, CON_12, CON_13, . . . , or may connect a corresponding second bit line to the corresponding first bit line sense amplifier via a corresponding global bit line in response to a corresponding second control signal from among a plurality of second control signals CON_21, CON_22, CON_23, . . . .

Each of the plurality of connection units 1930_1, 1930_2, 1930_3, 1930_4, 1930_5, 1930_6, 1930_7, 1930_8, . . . may include a first switch unit SW1 and a second switch unit SW2, as illustrated in FIG. 19. As described above with reference to FIG. 19, the first switch unit SW1 may selectively connect a corresponding first bit line to a corresponding first bit line sense amplifier in response to a corresponding first control signal, and the second switch unit SW2 may selectively connect a corresponding second bit line to a global bit line, which is connected to the corresponding first bit line sense amplifier, in response to a corresponding second control signal.

FIG. 20 illustrates a case where the first switch unit SW1 and the second switch unit SW2 of FIG. 19 are NMOS transistors. For example, the first switch unit SW1 of the connection unit 1930_1 may be an NMOS transistor that selectively connects the first bit line BL12 to the bit line sense amplifier 1920_2 in response to the first control signal CON_12. The second switch unit SW2 of the connection unit 1930_1 may be an NMOS transistor that selectively connects the second bit line BL22 to the global bit line GBL2, which is connected to the first bit line sense amplifier 1920_2, in response to the second control signal CON_22.

In at least the example embodiment of FIG. 20, if the first switch unit SW1 is an NMOS transistor, then the first switch unit SW1 may be enabled to connect a corresponding first bit line to a corresponding bit line sense amplifier when the corresponding first control signal is logic high, but may be disabled to disconnect the corresponding first bit line from the corresponding bit line sense amplifier when the corresponding first control signal is logic low. Also, if the second switch unit SW2 is an NMOS transistor, then the second switch unit SW2 may be enabled to connect a corresponding second bit line to the corresponding bit line sense amplifier when a corresponding second control signal is logic high, but may be disabled to disconnect the corresponding second bit line from the corresponding bit line sense amplifier when the corresponding second control signal is logic low.

Although FIG. 20 illustrates a case where the first switch unit SW1 and the second switch unit SW2 are NMOS transistors, example embodiments are not limited thereto, and other devices may be embodied as the first switch unit SW1 and the second switch unit SW2, as long as the other devices are capable of operating in the same or a similar manner as the first switch unit SW1 and the second switch unit SW2 described above. For example, the first switch unit SW1 and the second switch unit SW2 may be PMOS transistors. In this case, logic states of the plurality of first control signals CON_11, CON_12, CON_13, . . . and the plurality of second control signals CON_21, CON_22, CON_23, . . . may be opposite to when the first switch unit SW1 and the second switch unit SW2 are NMOS transistors.

Each of the plurality of control signal generation units 1950_1, 1950_2, 1950_3, . . . may generate a corresponding first control signal and second control signal based on a row address RA. The structures and operations of the plurality of control signal generation units 1950_1, 1950_2, 1950_3, . . . are the same as or similar to those described above with reference to FIG. 19.

An example operation of the semiconductor memory device 1900 or 2000 according to an example embodiment of inventive concepts will now be described with reference to FIGS. 19 and 20.

Each of the plurality of first memory cells MC1 and the plurality of second memory cells MC2 may be connected to a corresponding word line. A case where one of a plurality of word lines is enabled will now be described. For convenience of explanation, it is assumed that a word line connected to one of the first memory cells MC1 of the first memory cell block 1910_13, one of the second memory cells MC2 of the first memory cell block 1910_4, one of the third memory cells MC3 of the second memory cell block 1915_2, one of the second memory cells MC2 of the first memory cell block 1910_6, one of the first memory cells MC1 of the first memory cell block 1910_8, and one of the third memory cells MC3 of the second memory cell block 1915_4, is enabled. However, example embodiments are not limited to the above case, and the semiconductor memory device 1900 or 2000 may operate according to the location of the enabled word line, as described below. Also, it is assumed that the transistors of corresponding first switch units SW1 are turned on when the first control signals CON_11, CON_12, CON_13, . . . each have the first voltage, but are turned off when the first control signals CON_11, CON_12, CON_13, . . . each have the second voltage. Also, it is assumed that the transistors of corresponding second switch units SW2 are turned on when the second control signals CON_21, CON_22, CON_23, . . . each have the first voltage, but are turned off when the second control signals CON_21, CON_22, CON_23, . . . each have the second voltage. For example, if the first switch units SW1 and the second switch units SW2 are NMOS transistors as illustrated in FIG. 20, the first voltage may be a high voltage and the second voltage may be a low voltage.

Each of the plurality of control signal generation units 1950_1, 1950_2, 1950_3, . . . may generate a corresponding first control signal and second control signal based on an address of an enabled word line WL. In this example, the control signal generation unit 1950_1 may generate the first control signal CON_11 having the second voltage and the second control signal CON_21 having the second voltage based on the address of the enabled word line WL. The control signal generation unit 1950_2 may generate the first control signal CON_12 having the second voltage and the second control signal CON_22 having the first voltage based on the address of the enabled word line WL. The control signal generation unit 1950_3 may generate the first control signal CON_13 having the first voltage and the second control signal CON_23 having the second voltage based on the address of the enabled word line WL. In this example, the first control signal CON_12 that controls the first switch unites SW1 connected to the first memory cells MC1 connected to the enabled word line WL may have the first voltage. The second control signal CON_23 that controls the second switch units SW2 connected to the second memory cells MC2 connected to the enabled word line WL may have the first voltage.

According to the operations of the control signal generation units 1950_1, 1950_2, 1950_3, . . . described above, only the first control signal CON_12 and the second control signal CON_23 have the first voltage, and the other first control signals CON_11, CON_13, . . . and the other second control signals CON_21, CON_22, . . . have the second voltage. Thus, the transistors of the first switches SW1 of the connection units 1930_1, 1930_4, 1930_7, 1930_8, . . . to which the first control signal CON_12 is supplied, and the transistors of the second switches SW2 of the connection units 1930_4, 1930_6, . . . to which the second control signal CON_23 is supplied, are turned on. The transistors of the other first and second switches SW1 and SW2 are turned off. Thus, the first bit line sense amplifier 1920_2 is connected to the first bit line BL12 and the first bit line BL14, and the first bit line sense amplifier 1920_3 is connected to the second bit line BL23. The first bit line sense amplifier 1920_5 is connected to the second bit line BL26 and the first bit line sense amplifier 1920_6 is connected to the first bit line BL17 and the first bit line BL18.

The first bit line sense amplifier 1920_2 may receive data from the first memory cells MC1 of the first memory cell block 1910_3 connected to the enabled word line WL via the first bit line BL14, and then sense and amplify the data. The first bit line sense amplifier 1920_3 may receive data from the second memory cells MC2 of the first memory cell block 1910_4 connected to the enabled word line WL via the second bit line BL23 and the global bit line GBL4, and then may sense and amplify the data. The second bit line sense amplifier 1925_1 may receive data from the third memory cells MC3 of the second memory cell block 1915_2 connected to the enabled word line WL via the third bit line BL32, and then sense and amplify the data. The first bit line sense amplifier 1920_5 may receive data from the second memory cells MC2 of the first memory cell block 1910_6 connected to the enabled word line WL via the second bit line BL26 and the global bit line GBL6, and then sense and amplify the data. The first bit line sense amplifier 1920_6 may receive data from the first memory cells MC1 of the first memory cell block 1910_8 connected to the enabled word line WL via the first bit line BL18, and then sense and amplify the data. The second bit line sense amplifier 1925_3 may receive data from the third memory cells MC3 of the second memory cell block 1915_4 connected to the enabled word line WL via the third bit line BL34, and then sense and amplify the data.

The first switches SW1 of the connection units 1930_1, 1930_7, . . . are enabled, but the first memory cells MC1 connected to the first bit lines BL12, BL17, . . . are not connected to the enabled word line WL. Thus, the bit line sense amplifiers 1920_2, 1920_6, . . . do not sense and amplify the data stored in the first memory cells MC1 of the memory cell blocks 1910_1, 1910_7, . . . , respectively.

If the semiconductor memory device 1900 or 2000 performs the precharging operation, then the plurality of control signal generation units 1950_1, 1950_2, 1950_3, . . . may generate the plurality of first control signals CON_11, CON_12, CON_13, . . . and the plurality of second control signals CON_21, CON_22, CON_23, . . . each having the third voltage. If all of the first control signals CON_11, CON_12, CON_13, . . . and the second control signals CON_21, CON_22, CON_23, . . . have the third voltage, then all of the first switch units SW1 and the second switch units SW2 may be enabled, and the semiconductor memory device 1900 or 2000 may perform the precharging operation. If the first switch unit SW1 and the second switch unit SW2 are NMOS transistors as described above with reference to FIG. 20, then the first voltage may be higher than the second voltage and the third voltage, and the third voltage may be higher than the second voltage. If the first switch unit SW1 and the second switch unit SW2 are PMOS transistors, then the first voltage may be lower than the second voltage and the third voltage, and the third voltage may be lower than the second voltage.

Figure 21:
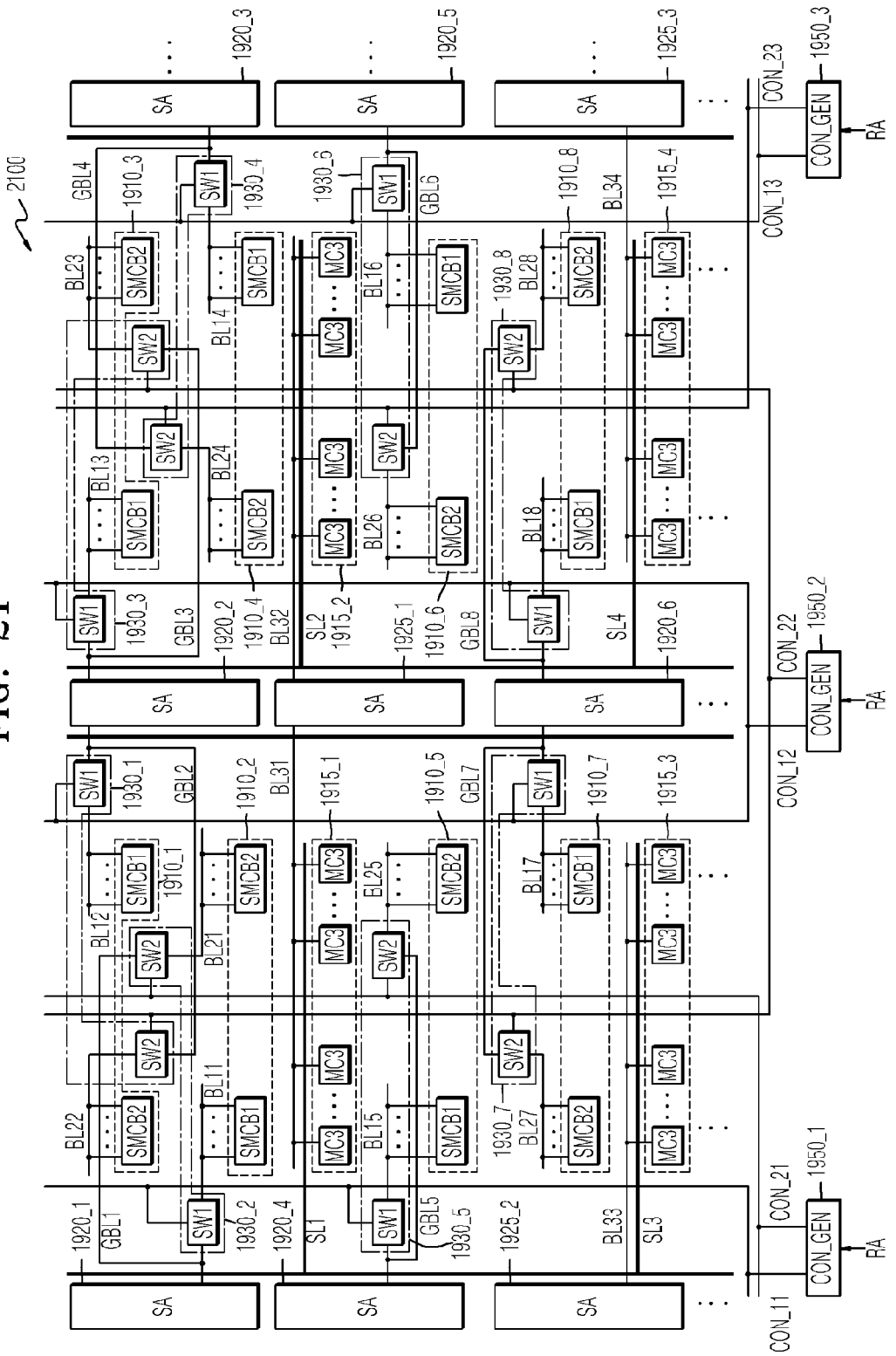
FIG. 21 is a block diagram of a semiconductor memory device according to another example embodiment of inventive concepts.

FIG. 21 is a block diagram of a semiconductor memory device 2100 according to another example embodiment of inventive concepts.

Referring to FIG. 21, the semiconductor memory device 2100 may include a plurality of first memory cell blocks 1910_1, 1910_2, 1910_3, 1910_4, 1910_5, 1910_6, 1910_7, 1910_8, . . . , a plurality of second memory cell blocks 1915_1, 1915_2, 1915_3, 1915_4, . . . , a plurality of first bit lines BL11, BL12, BL13, BL14, BL15, BL16, BL17, BL18, . . . , a plurality of second bit lines BL21, BL22, BL23, BL24, BL25, BL26, BL27, BL28, . . . , a plurality of third bit lines BL31, BL32, BL33, BL34, . . . , a plurality of global bit lines GBL1, GBL2, GBL3, GBL4, GBL5, GBL6, GBL7, GBL8, . . . , a plurality of first bit line sense amplifiers 1920_1, 1920_2, 1920_3, 1920_4, 1920_5, 1920_6, . . . , a plurality of second bit line sense amplifiers 1925_1, 1925_2, 1925_3, . . . , a plurality of connection units 1930_1, 1930_2, 1930_3, 1930_4, 1930_5, 1930_6, 1930_7, 1930_8, . . . , a plurality of control signal generation units 1950_1, 1950_2, 1950_3, . . . , and a plurality of shield lines SL1, SL2, SL3, . . . . In FIGS. 19 to 21, the same reference numerals denote the same elements.

In this example, the plurality of first memory cell blocks 1910_1, 1910_2, 1910_3, 1910_4, 1910_5, 1910_6, 1910_7, 1910_8, . . . , the plurality of second memory cell blocks 1915_1, 1915_2, 1915_3, 1915_4, . . . , the plurality of first bit lines BL11, BL12, BL13, BL14, BL15, BL16, BL17, BL18, . . . , the plurality of second bit lines BL21, BL22, BL23, BL24, BL25, BL26, BL27, BL28, . . . , the plurality of third bit lines BL31, BL32, BL33, BL34, . . . , the plurality of global bit lines GBL1, GBL2, GBL3, GBL4, GBL5, GBL6, GBL7, GBL8, . . . , the plurality of first bit line sense amplifiers 1920_1, 1920_2, 1920_3, 1920_4, 1920_5, 1920_6, . . . , the plurality of second bit line sense amplifiers 1925_1, 1925_2, 1925_3, . . . , the plurality of connection units 1930_1, 1930_2, 1930_3, 1930_4, 1930_5, 1930_6, 1930_7, 1930_8, . . . , and the plurality of control signal generation units 1950_1, 1950_2, 1950_3, . . . are the same as or similar to those described above with reference to FIG. 19. Also, the plurality of first memory cell blocks 1910_1, 1910_2, 1910_3, 1910_4, 1910_5, 1910_6, 1910_7, 1910_8, . . . and the plurality of connection units 1930_1, 1930_2, 1930_3, 1930_4, 1930_5, 1930_6, 1930_7, 1930_8, . . . may be embodied as described above with reference to FIG. 19, and thus, will not be described again here.

Each of the plurality of shield lines SL1, SL2, SL3, SL4, SL5, SL6, SL7, SL8, . . . may be disposed on the same layer as the plurality of global bit lines GBL1, GBL2, GBL3, GBL4, GBL5, GBL6, GBL7, GBL8, . . . , and between adjacent global bit lines. For example, the shield line SL1 may be disposed between the global bit line GBL1 and the global bit line GBL5 and between the global bit line GBL2 and the global bit line GBL7, and the shield line SL2 may be disposed between the global bit line GBL4 and the global bit line GBL6 and between the global bit line GBL3 and the global bit line GBL8. Each of the other shield lines SL3, SL4, . . . may be disposed between a corresponding global bit line and a global bit line adjacent to the corresponding global bit line in the first direction.

Each of the shield lines SL1, SL2, SL3, SL4, . . . may be maintained at a constant or substantially constant voltage level. For example, each of the shield lines SL1, SL2, SL3, SL4, . . . may be maintained at a ground voltage level. Thus, each of the shield lines SL1, SL2, SL3, SL4, . . . may compensate for coupling between the corresponding global bit line and the global bit line adjacent to the corresponding global bit line in the first direction. For example, the shield line SL1 may compensate for coupling between the global bit line GBL1 and the global bit line GBL5, and for a coupling between the global bit line GBL2 and the global bit line GBL7. The shield line SL2 may compensate for coupling between the global bit line GBL4 and the global bit line GBL6, and for a coupling between the global bit line GBL3 and the global bit line GBL8. Each of the other shield lines SL3, SL4, . . . may compensate for coupling between a corresponding global bit line and a global bit line adjacent to the corresponding global bit line in the first direction.

The semiconductor memory devices 1900 to 2100 illustrated in FIGS. 19 to 21 have an open bit line architecture. However, example embodiments of inventive concepts are not limited thereto, and the semiconductor memory devices 1900 to 2100 may have a folded bit line architecture. For example, an input terminal of each of the plurality of first bit line sense amplifiers 1920_1, 1920_2, 1920_3, 1920_4, 1920_5, 1920_6, . . . may be connected to one of corresponding first and second bit lines, and an inversion input terminal thereof may be connected to the other bit line. Also, an input terminal and inversion input terminal of each of the plurality of second bit line sense amplifiers 1925_1, 1925_2, 1925_3, 1925_4, 1925_5, 1925_6, 1925_7, 1925_8, . . . may be connected to a corresponding third bit line and another corresponding third bit line, respectively.

Figure 22:
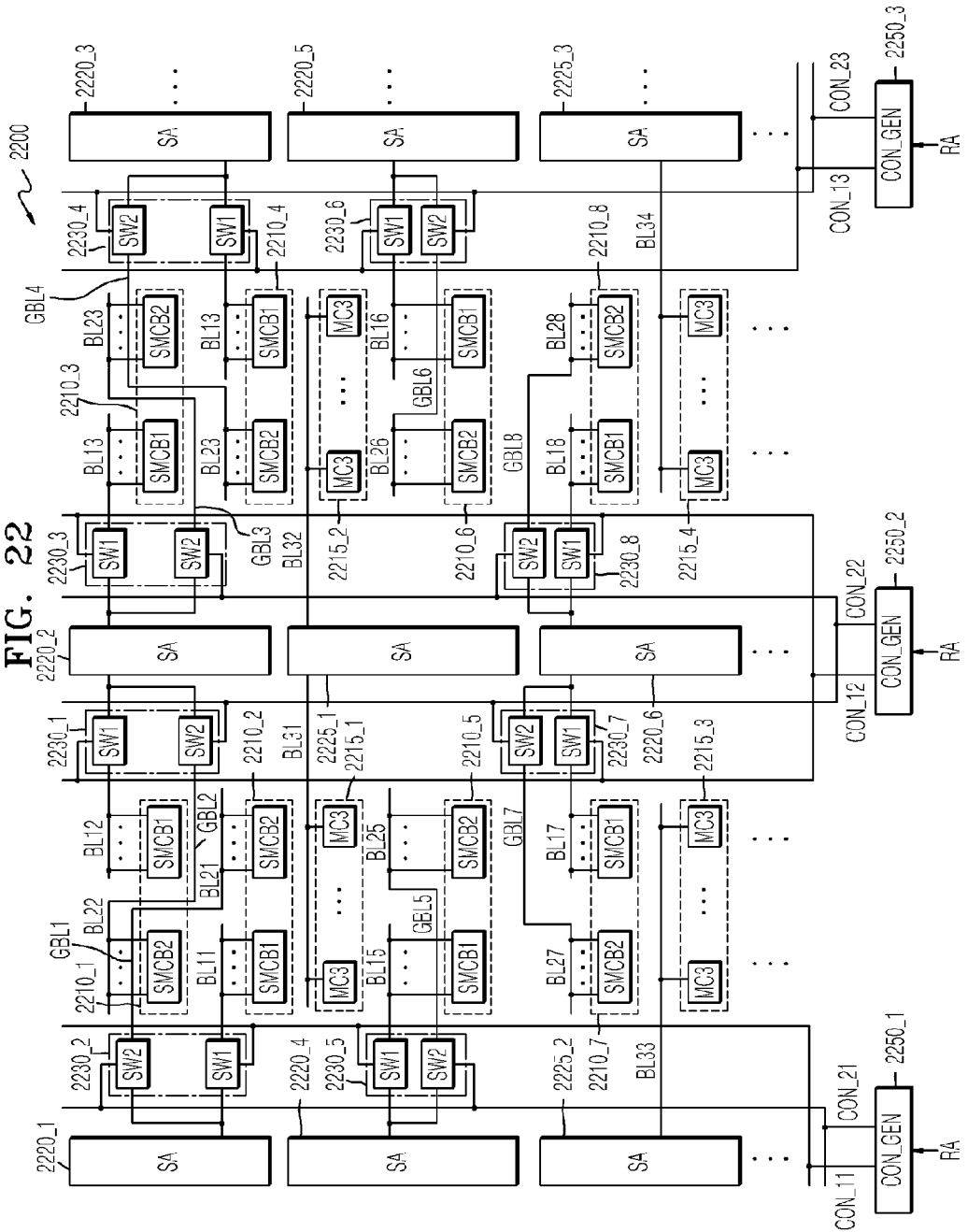
FIG. 22 is a block diagram of a semiconductor memory device according to another example embodiment of inventive concepts.

FIG. 22 is a block diagram of a semiconductor memory device 2200 according to another example embodiment of inventive concepts.

Referring to FIG. 22, the semiconductor memory device 2200 may include a plurality of first memory cell blocks 2210_1, 2210_2, 2210_3, 2210_4, 2210_5, 2210_6, 2210_7, 2210_8, . . . , a plurality of second memory cell blocks 2215_1, 2215_2, 2215_3, 2215_4, . . . , a plurality of first bit lines BL11, BL12, BL13, BL14, BL15, BL16, BL17, BL18, . . . , a plurality of second bit lines BL21, BL22, BL23, BL24, BL25, BL26, BL27, BL28, . . . , a plurality of third bit lines BL31, BL32, BL33, BL34, . . . , a plurality of global bit lines GBL1, GBL2, GBL3, GBL4, GBL5, GBL6, GBL7, GBL8, . . . , a plurality of first bit line sense amplifiers 2220_1, 2220_2, 2220_3, 2220_4, 2220_5, 2220_6, . . . , a plurality of second bit line sense amplifiers 2225_1, 2225_2, 2225_3, . . . , a plurality of connection units 2230_1, 2230_2, 2230_3, 2230_4, 2230_5, 2230_6, 2230_7, 2230_8, . . . , and a plurality of control signal generation units 2250_1, 2250_2, 2250_3, . . . .

The semiconductor memory device 2200 is the same as or similar to the semiconductor memory device 1900 of FIG. 19, except for locations of the plurality of connection units 2230_1, 2230_2, 2230_3, 2230_4, 2230_5, 2230_6, 2230_7, 2230_8, . . . . More specifically, for example, the locations of second switch units SW2 of the semiconductor memory device 2200 are different from those of the second switch units SW2 of the semiconductor memory device 1900. Hereinafter, the semiconductor memory device 2200 will be described focusing on the differences between the semiconductor memory device 2200 and the semiconductor memory device 1900 due to the different locations of the connection units 2230_1, 2230_2, 2230_3, 2230_4, 2230_5, 2230_6, 2230_7, 2230_8, . . . .

Each of the plurality of connection units 2230_1, 2230_2, 2230_3, 2230_4, 2230_5, 2230_6, 2230_7, 2230_8, . . . may connect a corresponding first bit line to a corresponding first bit line sense amplifier in response to a corresponding first control signal from among a plurality of first control signals CON_11, CON_12, CON_13, . . . , or may connect a corresponding second bit line to the corresponding first bit line sense amplifier via a corresponding global bit line in response to a corresponding second control signal from among a plurality of second control signals CON_21, CON_22, CON_23, . . . .

Each of the plurality of connection units 2230_1, 2230_2, 2230_3, 2230_4, 2230_5, 2230_6, 2230_7, 2230_8, . . . may include a first switch unit SW1 and a second switch unit SW2. The first switch unit SW1 may selectively connect a corresponding first bit line to a corresponding first bit line sense amplifier in response to a corresponding first control signal. The second switch unit SW2 may selectively connect the corresponding first bit line sense amplifier to a global bit line, which is connected to a corresponding second bit line, in response to a corresponding second control signal. For example, the first switch unit SW1 of the connection unit 2230_1 may selectively connect the first bit line BL12 to the first bit line sense amplifier 2220_2 in response to the first control signal CON_12. The second switch unit SW2 of the connection unit 2230_1 may selectively connect the first bit line sense amplifier 2220_2 to the global bit line GBL2, which is connected to the second bit line BL22, in response to the second control signal CON_21.

One of the first and second switch units SW1 and SW2 included in each of the plurality of connection units 2230_1, 2230_2, 2230_3, 2230_4, 2230_5, 2230_6, 2230_7, 2230_8, . . . may be enabled, or both of them may be disabled. If the first switch unit SW1 is disabled in response to a first control signal, then the second switch unit SW2 may be enabled or disabled in response to a corresponding second control signal. If the second switch unit SW2 is disabled in response to a second control signal, then the first switch unit SW1 may be enabled or disabled in response to a corresponding first control signal. If the first switch unit SW1 is enabled, then the first switch unit SW1 connects a corresponding first bit line to a corresponding first bit line sense amplifier. If the first switch unit SW1 is disabled, then the first switch unit SW1 disconnects the corresponding first bit line from the corresponding first bit line sense amplifier. If the second switch unit SW2 is enabled, then the second switch unit SW2 connects the first corresponding bit line sense amplifier to a corresponding global bit line. If the second switch unit SW2 is disabled, then the second switch unit SW2 disconnects the corresponding first bit line sense amplifier from the corresponding global bit line.

For example, if a word line connected to one of the first memory cells in the first region SMCB1 of the first memory cell block 2210_3 is enabled, then the first switch unit SW1 of the connection unit 2230_3 may connect the first bit line BL13 to the first bit line sense amplifier 2220_2 in response to the first control signal CON_12, and the second switch unit SW2 of the connection unit 2220_3 may disconnect the first bit line sense amplifier 2220_2 from the global bit line GBL3 in response to the second control signal CON_22.

The first switch unit SW1 and the second switch SW2 may be disposed between a corresponding first bit line sense amplifier and a corresponding first memory cell block. In this example, the first switch unit SW1 and the second switch unit SW2 may be disposed on an edge of the corresponding first memory cell block. FIG. 19 illustrates the semiconductor memory device 1900 in which each second switch unit SW2 is disposed at a location corresponding to a center of a corresponding memory cell block, whereas FIG. 22 illustrates the semiconductor memory device 2200 in which each second switch unit SW2 is disposed at an edge of a corresponding memory cell block. In this example, the first switch unit SW1 and the second switch SW2 of the connection unit 2230_3 may be disposed between the first bit line sense amplifier 2220_2 and the first memory cell block 2210_3. As another example, the first switch unit SW1 and the second switch SW2 of the connection unit 2230_4 may be disposed between the first bit line sense amplifier 2220_3 and the first memory cell block 2210_4.

Each of the plurality of global bit lines GBL1, GBL2, GBL3, GBL4, GBL5, GBL6, GBL7, GBL8, . . . that are connected to the plurality of second bit lines BL21, BL22, BL23, BL24, BL25, BL26, BL27, BL28, . . . , respectively, may be connected to or disconnected from a corresponding first bit line sense amplifier from among the plurality of first bit line sense amplifiers 2220_1, 2220_2, 2220_3, 2220_4, 2220_5, 2220_6, . . . via the second switch unit SW2 of a corresponding connection unit from among the plurality of connection units 2230_1, 2230_2, 2230_3, 2230_4, 2230_5, 2230_, . . . . For example, the global bit line GBL1 connected to the second bit line BL21 may be connected to or disconnected from the first bit line sense amplifier 2220_1 via the second switch unit SW2 of the connection unit 2230_2.

Figure 23:
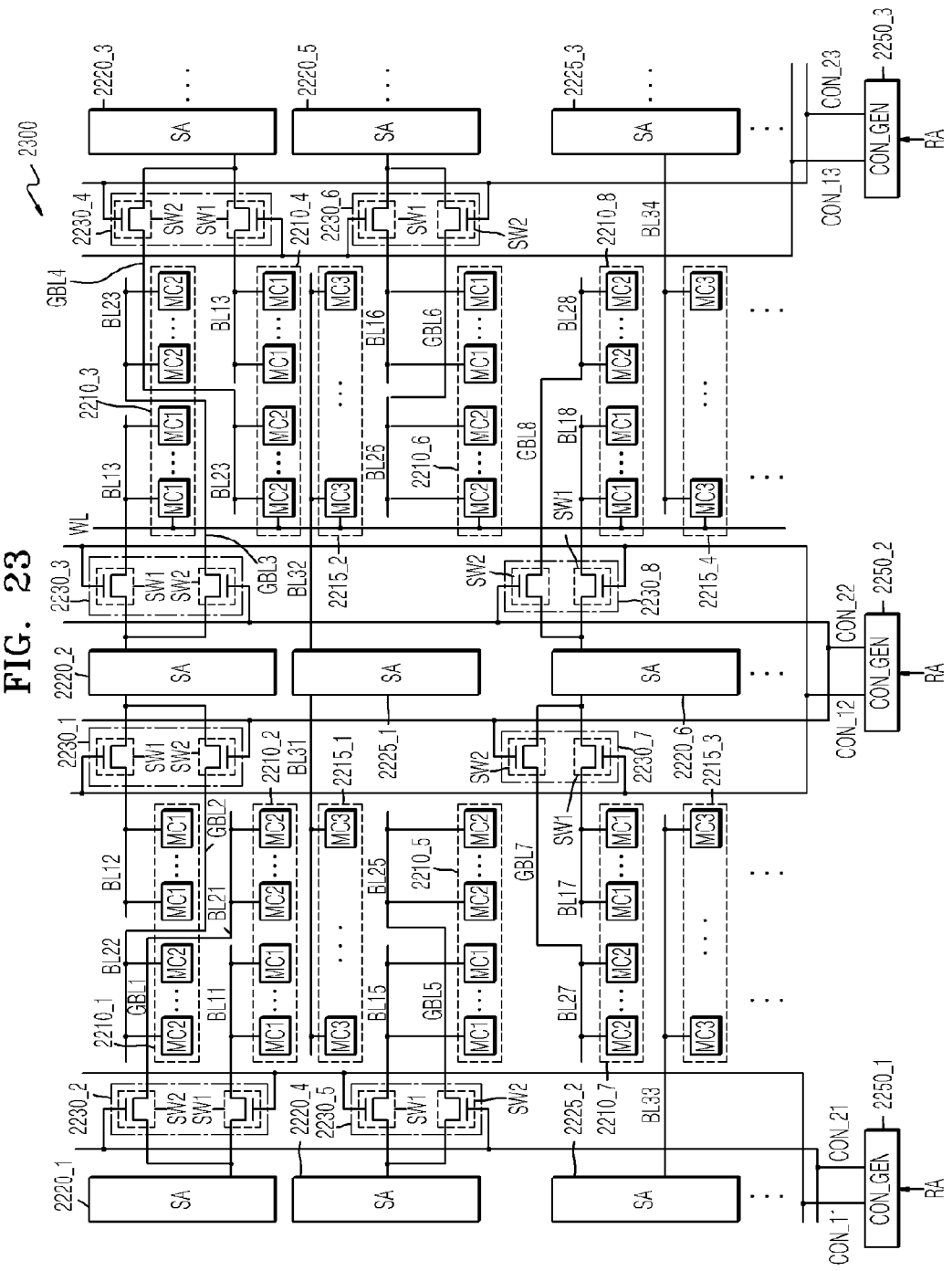
FIG. 23 is a circuit diagram of a semiconductor memory device, such as the semiconductor memory device of FIG. 22, according to another example embodiment of inventive concepts.

FIG. 23 is a circuit diagram of a semiconductor memory device 2300, such as the semiconductor memory device 2200 of FIG. 22, according to another example embodiment of inventive concepts.

Referring to FIG. 22, the semiconductor memory device 2300 may include a plurality of first memory cell blocks 2210_1, 2210_2, 2210_3, 2210_4, 2210_5, 2210_6, 2210_7, 2210_8, . . . , a plurality of second memory cell blocks 2215_1, 2215_2, 2215_3, 2215_4, . . . , a plurality of first bit lines BL11, BL12, BL13, BL14, BL15, BL16, BL17, BL18, . . . , a plurality of second bit lines BL21, BL22, BL23, BL24, BL25, BL26, BL27, BL28, . . . , a plurality of third bit lines BL31, BL32, BL33, BL34, . . . , a plurality of global bit lines GBL1, GBL2, GBL3, GBL4, GBL5, GBL6, GBL7, GBL8, . . . , a plurality of first bit line sense amplifiers 2220_1, 2220_2, 2220_3, 2220_4, 2220_5, 2220_6, . . . , a plurality of second bit line sense amplifiers 2225_1, 2225_2, 2225_3, . . . , a plurality of connection units 2230_1, 2230_2, 2230_3, 2230_4, 2230_5, 2230_6, 2230_7, 2230_8, . . . , and a plurality of control signal generation units 2250_1, 2250_2, 2250_3, . . . . In FIGS. 22 and 23, the same reference numerals denote the same elements.

Each of the plurality of first memory cell blocks 2210_1, 2210_2, 2210_3, 2210_4, 2210_5, 2210_6, 2210_7, 2210_8, . . . may include a plurality of first memory cells MC1 and a plurality of second memory cells MC2. The first region SMCB1 and the second region SMCB2 of FIG. 22 may include the first memory cells MC1 and the second memory cells MC2 of FIG. 23, respectively. For example, in FIG. 23, the first memory cells MC1 of the first memory cell block 2210_1 may be included in the first region SMCB1 of the first memory cell block 2210_1 of FIG. 22, and the second memory cells MC2 of the first memory cell block 2210_1 may be included in the second region SMCB2 of the first memory cell block 2210_1 of FIG. 22. The first memory cells MC1 may be connected to a corresponding first bit line from among the plurality of first bit lines BL11, BL12, BL13, BL14, BL15, BL16, BL17, BL18, . . . , and the second memory cells MC2 may be connected to a corresponding second bit line from among the plurality of second bit lines BL21, BL22, BL23, BL24, BL25, BL26, BL27, BL28, . . . . For example, the first memory cells MC1 and the second memory cells MC2 of the first memory cell block 2210_1 may be connected to the first bit line BL12 and the second bit line BL22, respectively.

The first memory cell MC1, the second memory cell MC2, or a third memory cell MC3 may include one transistor and one capacitor. The structures of the first memory cell MC1, the second memory cell MC2, and the third memory cell MC3 are the same as or similar to those described above with reference to FIG. 20, and thus, will not be described again here. The structures and connections of the first memory cell blocks 2210_1, 2210_2, 2210_3, 2210_4, 2210_5, 2210_6, 2210_7, 2210_8, . . . and the second memory cell blocks 2215_1, 2215_2, 2215_3, 2215_4, . . . are the same as or similar to those described above with reference to FIG. 21, and thus, will not be described again here.

Each of the plurality of first bit line sense amplifiers 2220_1, 2220_2, 2220_3, 2220_4, 2220_5, 2220_6, . . . may be connected to the first or second memory cells MC1 or MC2 of a corresponding first memory cell block from among the plurality of first memory cell blocks 2210_1, 2210_2, 2210_3, 2210_4, 2210_5, 2210_6, 2210_7, 2210_8, . . . . Each of the plurality of second bit line sense amplifiers 2225_1, 2225_2, 2225_3, . . . may be connected to third memory cells MC3 of a corresponding second memory cell block from among the plurality of second memory cell blocks 2215_1, 2215_2, 2215_3, 2215_4, . . . . The connections of the first bit line sense amplifiers 2220_1, 2220_2, 2220_3, 2220_4, 2220_5, 2220_6, . . . and the second bit line sense amplifiers 2225_1, 2225_2, 2225_3, . . . are the same as or similar to those described above with reference to FIG. 19, and thus, will not be described again here.

Each of the plurality of connection units 2230_1, 2230_2, 2230_3, 2230_4, 2230_5, 2230_6, 2230_7, 2230_8, . . . may connect a corresponding first bit line to a corresponding first bit line sense amplifier in response to a corresponding first control signal from among a plurality of first control signals CON_11, CON_12, CON_13, . . . , or may connect a corresponding second bit line to the corresponding first bit line sense amplifier via a corresponding global bit line in response to a corresponding second control signal from among a plurality of second control signals CON_21, CON_22, CON_23, . . . .

Each of the plurality of connection units 2230_1, 2230_2, 2230_3, 2230_4, 2230_5, 2230_6, 2230_7, 2230_8, . . . may include a first switch unit SW1 and a second switch unit SW2, as illustrated in FIG. 19. As described above with reference to FIG. 22, the first switch unit SW1 may selectively connect a corresponding first bit line to a corresponding first bit line sense amplifier in response to a corresponding first control signal, and the second switch unit SW2 may selectively connect the corresponding first bit line sense amplifier to a global bit line, which is connected to a corresponding second bit line, in response to a corresponding second control signal.

FIG. 23 illustrates a case where the first switch unit SW1 and the second switch unit SW2 of FIG. 22 are NMOS transistors. For example, the first switch unit SW1 of the connection unit 2230_1 may be an NMOS transistor that selectively connects the first bit line BL12 to the bit line sense amplifier 2220_2 in response to the first control signal CON_12. The second switch unit SW2 of the connection unit 2230_1 may selectively connect the global bit line GBL2, which is connected to the second bit line BL22, to the bit line sense amplifier 2220_2 in response to the second control signal CON_22.

In at least the example embodiment of FIG. 22, if the first switch unit SW1 is an NMOS transistor, then the first switch unit SW1 may be enabled to connect a corresponding first bit line to a corresponding bit line sense amplifier when the corresponding first control signal is logic high, but may be disabled to disconnect the corresponding first bit line from the corresponding bit line sense amplifier when the corresponding first control signal is logic low. Also, if the second switch unit SW2 is an NMOS transistor, then the second switch unit SW2 may be enabled to connect a corresponding second bit line to the corresponding bit line sense amplifier when a corresponding second control signal is logic high, but may be disabled to disconnect the corresponding second bit line from the corresponding bit line sense amplifier when the corresponding second control signal is logic low.

Although FIG. 22 illustrates a case where the first switch unit SW1 and the second switch unit SW2 are NMOS transistors, example embodiments are not limited thereto, and other devices may be embodied as the first switch unit SW1 and the second switch unit SW2 as long as the other devices are capable of operating in the same or a similar manner as the first switch unit SW1 and the second switch unit SW2 described above. For example, the first switch unit SW1 and the second switch unit SW2 may be PMOS transistors. In this case, logic states of the plurality of first control signals CON_11, CON_12, CON_13, . . . and the plurality of second control signals CON_21, CON_22, CON_23, . . . may be opposite to when the first switch unit SW1 and the second switch unit SW2 are NMOS transistors.

Each of the plurality of control signal generation units 2250_1, 2250_2, 2250_3, . . . may generate a corresponding first control signal and second control signal based on a row address RA. The structures and operations of the plurality of control signal generation units 2250_1, 2250_2, 2250_3, . . . are the same as or similar to those described above with reference to FIG. 19.

The semiconductor memory device 2200 of FIG. 22 and the semiconductor memory device 2300 of FIG. 23 operate in the same or a similar manner as the semiconductor memory device 1900 of FIG. 19 and the semiconductor memory device 2000 of FIG. 20, except that the locations of the second switch units SW2 are different. Thus, the operations of the semiconductor memory device 2200 and the semiconductor memory device 2300 will not be described again here.

Figure 24:
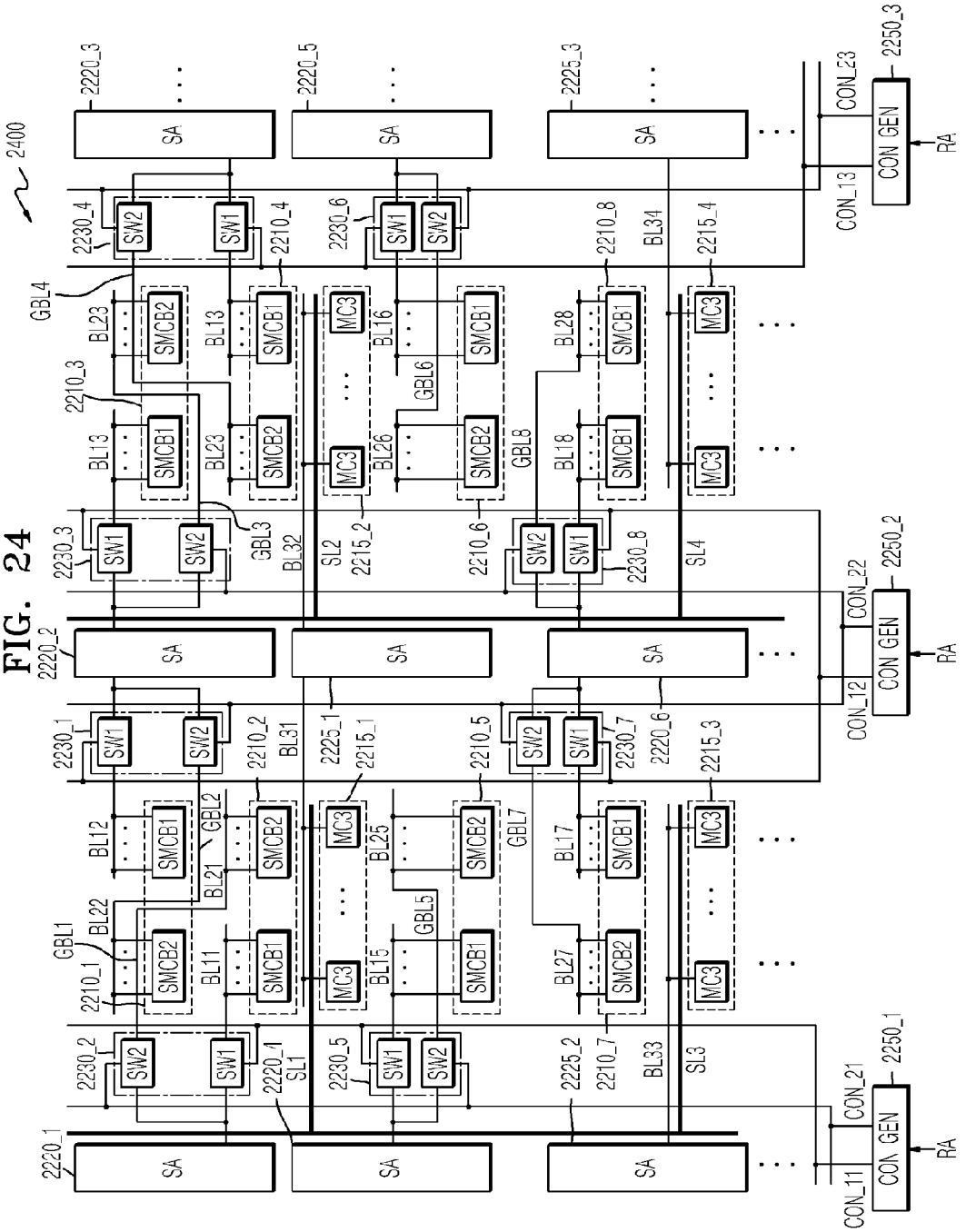
FIG. 24 is a block diagram of a semiconductor memory device according to another example embodiment of inventive concepts.

FIG. 24 is a block diagram of a semiconductor memory device 2400 according to another example embodiment of inventive concepts.

Referring to FIG. 24, the semiconductor memory device 2400 may include a plurality of first memory cell blocks 2210_1, 2210_2, 2210_3, 2210_4, 2210_5, 2210_6, 2210_7, 2210_8, . . . , a plurality of second memory cell blocks 2215_1, 2215_2, 2215_3, 2215_4, . . . , a plurality of first bit lines BL11, BL12, BL13, BL14, BL15, BL16, BL17, BL18, . . . , a plurality of second bit lines BL21, BL22, BL23, BL24, BL25, BL26, BL27, BL28, . . . , a plurality of third bit lines BL31, BL32, BL33, BL34, . . . , a plurality of global bit lines GBL1, GBL2, GBL3, GBL4, GBL5, GBL6, GBL7, GBL8, . . . , a plurality of first bit line sense amplifiers 2220_1, 2220_2, 2220_3, 2220_4, 2220_5, 2220_6, . . . , a plurality of second bit line sense amplifiers 2225_1, 2225_2, 2225_3, . . . , a plurality of connection units 2230_1, 2230_2, 2230_3, 2230_4, 2230_5, 2230_6, 2230_7, 2230_8, . . . , a plurality of control signal generation units 2250_1, 2250_2, 2250_3, . . . , and a plurality of shield lines SL1, SL2, SL3, SL4, . . . . In FIGS. 22 to 24, the same reference numerals denote the same elements.

In this example, the plurality of first memory cell blocks 2210_1, 2210_2, 2210_3, 2210_4, 2210_5, 2210_6, 2210_7, 2210_8, . . . , the plurality of second memory cell blocks 2215_1, 2215_2, 2215_3, 2215_4, . . . , the plurality of first bit lines BL11, BL12, BL13, BL14, BL15, BL16, BL17, BL18, . . . , the plurality of second bit lines BL21, BL22, BL23, BL24, BL25, BL26, BL27, BL28, . . . , the plurality of third bit lines BL31, BL32, BL33, BL34, . . . , the plurality of global bit lines GBL1, GBL2, GBL3, GBL4, GBL5, GBL6, GBL7, GBL8, . . . , the plurality of first bit line sense amplifiers 2220_1, 2220_2, 2220_3, 2220_4, 2220_5, 2220_6, . . . , the plurality of second bit line sense amplifiers 2225_1, 2225_2, 2225_3, . . . , the plurality of connection units 2230_1, 2230_2, 2230_3, 2230_4, 2230_5, 2230_6, 2230_7, 2230_8, . . . , and the plurality of control signal generation units 2250_1, 2250_2, 2250_3, . . . are the same as or similar to those described above with reference to FIG. 22. Also, in FIG. 24, the memory cell blocks 2210_1, 2210_2, 2210_3, 2210_4, 2210_5, 2210_6, 2210_7, 2210_8, . . . and the plurality of connection units 2230_1, 2230_2, 2230_3, 2230_4, 2230_5, 2230_6, 2230_7, 2230_8, . . . may be embodied as described above with reference to FIG. 23, and thus, will not be described again here.

Each of the plurality of shield lines SL1, SL2, SL3, SL4, . . . may be disposed on the same layer as the plurality of global bit lines GBL1, GBL2, GBL3, GBL4, GBL5, GBL6, GBL7, GBL8, . . . , and between adjacent global bit lines. For example, the shield line SL1 may be disposed between the global bit line GBL1 and the global bit line GBL5 and between the global bit line GBL2 and the global bit line GBL7, and the shield line SL2 may be disposed between the global bit line GBL4 and the global bit line GBL6 and between the global bit line GBL3 and the global bit line GBL8. Each of the other shield lines SL3, SL4, . . . may be disposed between a corresponding global bit line and a global bit line adjacent to the corresponding global bit line in the first direction.

Each of the shield lines SL1, SL2, SL3, SL4, . . . may be maintained at a constant or substantially constant voltage level. For example, each of the shield lines SL1, SL2, SL3, SL4, . . . may be maintained at a ground voltage level. Thus, each of the shield lines SL1, SL2, SL3, SL4, SL5, SL6, . . . may compensate for coupling between the corresponding global bit line and the global bit line adjacent to the corresponding global bit line in the first direction. The shield lines SL1, SL2, SL3, SL4, . . . are the same as or similar to those described above with reference to FIG. 21, and thus, will not be described again here.

The semiconductor memory devices 2200 to 2400 illustrated in FIGS. 22 to 24 have an open bit line architecture. However, example embodiments are not limited thereto, and the semiconductor memory devices 2200 to 2400 may have a folded bit line architecture. For example, an input terminal of each of the plurality of first bit line sense amplifiers 2220_1, 2220_2, 2220_3, 2220_4, 2220_5, 2220_6 . . . may be connected to one of corresponding first and second bit lines, and an inversion input terminal thereof may be connected to the other bit line. Also, an input terminal and inversion input terminal of each of the plurality of second bit line sense amplifiers 2225_1, 2225_2, 2225_3, . . . may be connected to a corresponding third bit line and another corresponding third bit line, respectively.

As described above, in the semiconductor memory devices 1300 to 2400 according to at least some example embodiments, the lengths of the first and second bit lines are shorter than in a conventional semiconductor memory device, thereby reducing capacitance components in the first and second bit lines. Also, in the semiconductor memory devices 1300 to 2400, for example, each of the second bit lines is connected to a corresponding bit line sense amplifier via a corresponding global bit line. Thus, capacitance components in the first and third bit lines and capacitance components between the first and third bit lines may be reduced, thereby reducing coupling noise between adjacent bit lines.

Figure 25:
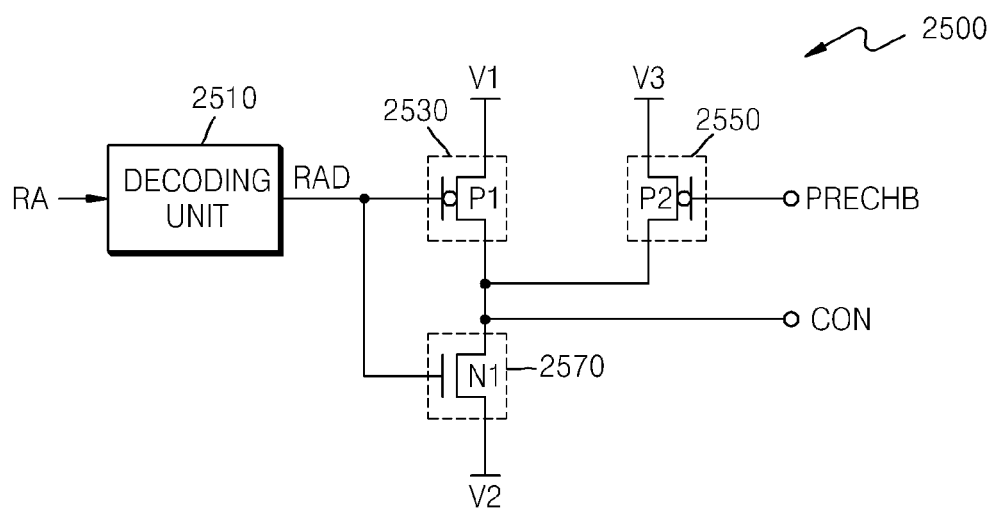
FIG. 25 is a circuit diagram of a signal generator that may be included in each of control signal generation units illustrated in FIGS. 1 to 24, according to an example embodiment of inventive concepts.

FIG. 25 is a circuit diagram of an example embodiment of a signal generator 2500 that may be included in each control signal generation unit illustrated in FIGS. 1 to 24.

Referring to FIGS. 1 to 25, each of the control signal generation units 150_1, 150_2, 150_3, . . . illustrated in FIGS. 1 to 3, each of the control signal generation units 450_1, 450_2, 450_3, . . . illustrated in FIGS. 4 to 6, each of the control signal generation units 750_1, 750_2, 750_3, . . . illustrated in FIGS. 7 to 9, each of the control signal generation units 1050_1, 1050_2, 1050_3, . . . illustrated in FIGS. 10 to 12, each of the control signal generation units 1350_1, 1350_2, 1350_3, . . . illustrated in FIGS. 13 to 15, each of the control signal generation units 1650_1, 1650_2, 1650_3, . . . illustrated in FIGS. 16 to 18, each of the control signal generation units 1950_1, 1950_2, 1950_3, . . . illustrated in FIGS. 19 to 21, and each of the control signal generation units 2250_1, 2250_2, 2250_3, . . . illustrated in FIGS. 22 to 24, may include at least one signal generator 2500 illustrated in FIG. 25. However, example embodiments are not limited to the at least one signal generator 2500, and another circuit/unit may be used as the at least one signal generator 2500, as long as the circuit/unit may generate a first or second control signal as described above.

As shown in FIG. 25, the at least one signal generator 2500 may include a decoding unit 2510, a first voltage controller 2530, a second voltage controller 2550, and a third voltage controller 2570. The decoding unit 2510 may generate a decoded row address RAD by decoding a row address RA. The row address RA may be an address of an enabled word line. In this example, the decoding unit 2510 may generate the decoded row address RAD in a first or second logic state according to the address of an enabled word line WL.

The first voltage controller 2530 may control a control signal CON to have a first voltage V1 by using the decoded row address RAD. The first voltage controller 2530 may be a transistor P1 having a gate to which the decoded row address RAD is provided, a first terminal to which the first voltage V1 is applied, and a second terminal connected to an output terminal OUT. Although FIG. 25 illustrates a case where the transistor P1 of the first voltage controller 2530 is a PMOS transistor, example embodiments are not limited thereto and other devices may be used as first voltage controller 2530 as long as the other devices may control the first voltage V1 to be applied to or not to be applied to the output terminal OUT.

The second voltage controller 2550 may control the control signal CON to have a second voltage Vs by using the decoded row address RAD. The second voltage controller 2550 may be a transistor N1 having a gate to which the decoded row address RAD is provided, a first terminal to which the second voltage V2 is applied, and a second terminal connected to the output terminal OUT.

Although FIG. 25 illustrates a case where the transistor N1 of the second voltage controller 2550 is an NMOS transistor, example embodiments are not limited thereto, and other devices may be used as the second voltage controller 2550 as long as the other devices are capable of controlling the second voltage V2 to be applied to or not to be applied to the output terminal OUT.

The third voltage controller 2570 may control the control signal CON to have a third voltage V3 by using a precharge enable signal PRECHB. The third voltage controller 2570 may be a transistor P2 having a gate to which the precharge enable signal PRECHB is supplied, a first terminal to which the third voltage V3 is applied, and a second terminal connected to the output terminal OUT. Although FIG. 25 illustrates a case where the transistor P2 of the third voltage controller 2570 is a PMOS transistor, example embodiments are not limited thereto, and other devices may be used as the third voltage controller 2570 as long as the other devices are capable of controlling the third voltage V3 to be applied to or not to be applied to the output terminal OUT. First, a case where the control signal CON of FIG. 25 is the first control signal CON_11 illustrated in FIGS. 1 to 24 will be described. However, example embodiments are not limited thereto, and the control signal CON may be one of the other first control signals CON_12, CON_13, ... illustrated in FIGS. 1 to 24.

For example, referring to FIGS. 1 to 24, if a word line connected to at least one of first memory cells connected to a first switch unit SW1 to which the first control signal CON_11 is supplied via a corresponding first bit line, is enabled, then the decoding unit 2510 may generate the decoded row address RAD in a logic low state based on the row address RA that is the address of the enabled word line. Because the decoded row address RAD is in the logic low state, the transistor P1 of the first voltage controller 2530 is turned on and the transistor N1 of the second voltage controller 2550 is turned off. Also, because a semiconductor memory device the includes the signal generator 2500 performs a normal operation rather than the precharging operation, the precharge enable signal PRECHB is in a logic high state, and the transistor P2 of the third voltage controller 2570 is turned off. Thus, the output terminal OUT of the signal generator 2500 has the first voltage V1, and the first control signal CON_11 also has the first voltage V1.

In another example, referring to FIGS. 1 to 24, if all word lines connected to the first memory cells connected to the first switch unit SW1 to which the first control signal CON_11 is supplied via the corresponding first bit line, are enabled, then the decoding unit 2510 may generate the decoded row address RAD in a logic high state based on the row address RA. Because the decoded row address RAD is in the logic high state, the transistor P1 of the first voltage controller 2530 is turned off and the transistor N1 of the second voltage controller 2550 is turned on. Also, because the semiconductor memory device including the signal generator 2500 performs a normal operation, rather than the precharging operation, the precharge enable signal PRECHB is in a logic high state, and the transistor P2 of the third voltage controller 2570 is turned off. Thus, the output terminal OUT of the signal generator 2500 has the second voltage V2, and the first control signal CON_11 also has the second voltage V2.

Next, a case where the control signal CON of FIG. 25 is the second control signal CON_21 illustrated in FIGS. 1 to 24 will be described. However, example embodiments are not limited to this case, and the control signal CON may be one of the other second controls signals CON_22, CON_23, ... illustrated in FIGS. 1 to 24.

For example, referring to FIGS. 1 to 24, if a word line connected to at least one of second memory cells connected to a second switch unit SW2 to which the second control signal CON_21 is supplied via a corresponding second bit line and a corresponding global bit line, is enabled, then the decoding unit 2510 may generate the decoded row address RAD in the logic low state based on the row address RA that is the address of the enabled word line. Because the decoded row address RAD is in the logic low state, the transistor P1 of the first voltage controller 2530 is turned on and the transistor N1 of the second voltage controller 2550 is turned off. Also, because the semiconductor memory device including the signal generator 2500 performs a normal operation other than the precharging operation, the precharge enable signal PRECHB is in the logic high state and the transistor P2 of the third voltage controller 2570 is turned off. Thus, the output terminal OUT of the signal generator 2500 has the first voltage V1 and the second control signal CON_21 also has the first voltage V1.

In yet another example, referring to FIGS. 1 to 24, if all word lines connected to the second memory cells connected to the second switch unit SW2 to which the second control signal CON_21 is supplied via the corresponding second bit line and the corresponding global bit line, are disabled, then the decoding unit 2510 may generate the decoded row address RAD in the logic high state based on the row address RA. Because the decoded row address RAD is in the logic high state, the transistor P1 of the first voltage controller 2530 is turned off and the transistor N1 of the second voltage controller 2550 is turned on. Also, because the semiconductor memory device including the signal generator 2500 performs a normal operation rather than the precharging operation, the precharge enable signal PRECHB is in the logic high state and the transistor P2 of the third voltage controller 2570 is turned off. Thus, the output terminal OUT of the signal generator 2500 has the second voltage V2 and the second control signal CON_21 also has the second voltage V2.

Lastly, a case where the semiconductor memory device that includes the signal generator 2500 performs the precharging operation will be described. Because the semiconductor memory device including the signal generator 2500 performs the precharging operation, the precharge enable signal PRECHB is in the logic high state and the transistor P2 of the third voltage controller 2570 is turned on. Also, because the semiconductor memory device performs the precharging operation, the decoded row address RAD is in the logic high state, the transistor P1 of the first voltage controller 2530 is turned off and the transistor N1 of the second voltage controller 2550 is turned on. Thus, the output terminal OUT of the signal generator 2500 has the third voltage V3, and the control signal CON also has the third voltage V3. While the precharging operation is performed, both the first control signal CON_11 and the second control signal CON_21 may have the third voltage V3. Thus, when the semiconductor memory device including the signal generator 2500 performs the precharging operation, the control signal CON may be one of the first control signals CON_11, CON_12, CON_13, ... illustrated in FIGS. 1 to 24, or one of the second control signals CON_21, CON_22, CON_23, ... illustrated in FIGS. 1 to 24.

The first voltage V1 and the third voltage V3 may enable the first and second switch units SW1 and SW2 illustrated in FIGS. 1 to 24. The second voltage V2 may disable the first and second switch units SW1 and SW2 illustrated in FIGS. 1 to 24. If the first and second switch units SW1 and SW2 are NMOS transistors, then the first voltage V1 may be higher than the second voltage V2 and the third voltage V3, the second voltage V2 may be equal or substantially equal to a ground voltage, and the third voltage V3 may be higher than the second voltage V2. If the first and second switch units SW1 and SW2 are PMOS transistors, then the first voltage V1 may be lower than the second voltage V2 and the third voltage V3, the second voltage V2 may be equal or substantially equal to a power supply voltage, and the third voltage V3 may be lower than the second voltage V2.

Figure 26:
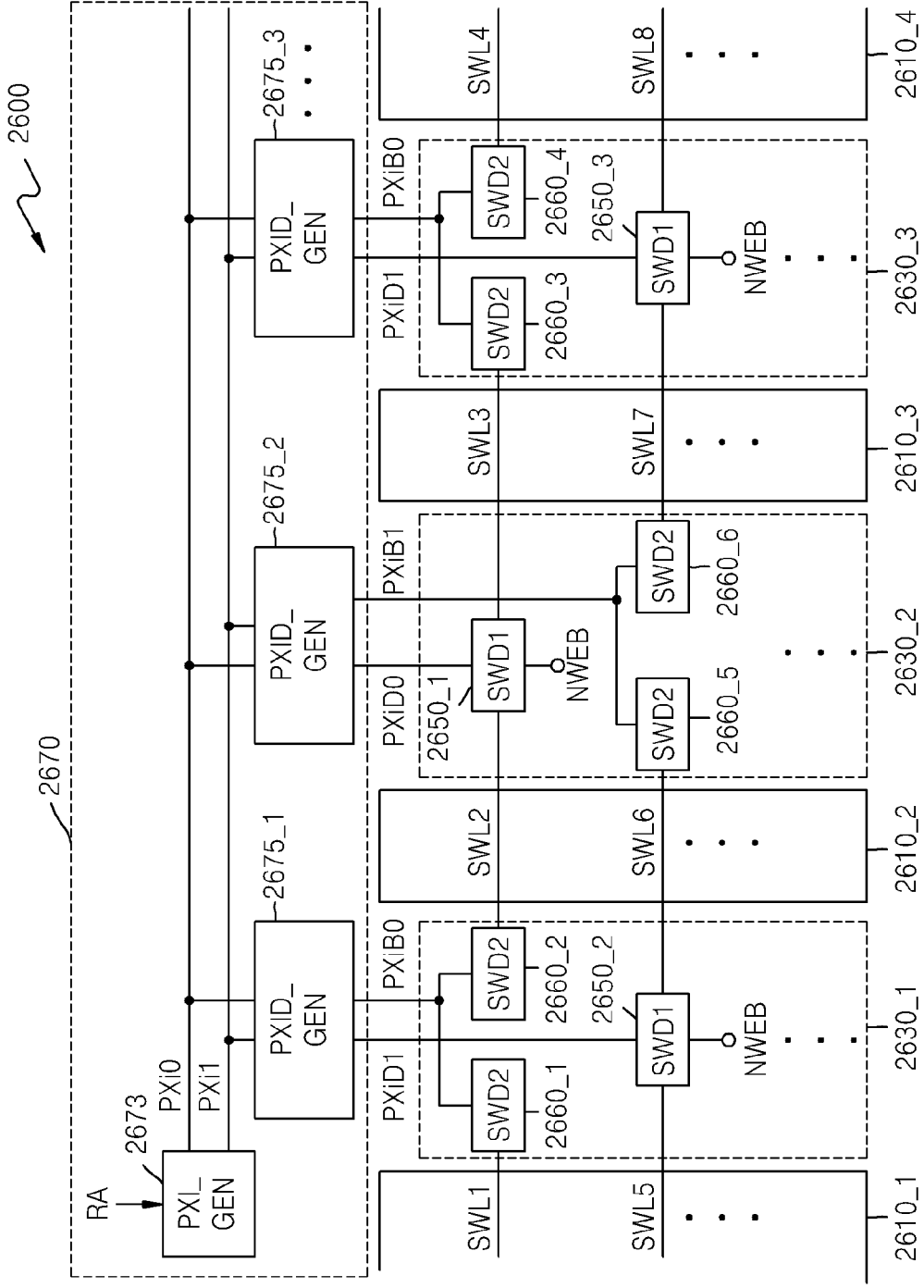
FIG. 26 is a block diagram of a semiconductor memory device according to another example embodiment of inventive concepts.

FIG. 26 is a block diagram of a semiconductor memory device 2600 according to another example embodiment of inventive concepts.

Referring to FIG. 26, the semiconductor memory device 2600 may include a plurality of memory cell arrays 2610_1, 2610_2, 2610_3, 2610_4, . . . , a plurality of sub word lines SWL1, SWL2, SWL3, SWL4, SWL5, SWL6, SWL7, SWL8, . . . , a plurality of sub word line driver regions 2630_1, 2630_2, 2630_3, . . . , a plurality of first sub word line drivers 2650_1, 2650_2, 2650_3, . . . , a plurality of second sub word line drivers 2660_1, 2660_2, 2660_3, 2660_4, 2660_5, 2660_6, . . . , and a driving signal generation unit 2670.

Each of the plurality of memory cell arrays 2610_1, 2610_2, 2610_3, 2610_4, . . . may include a plurality of memory cells. Each of the plurality of memory cells may be arranged at an intersection of a corresponding sub word line and a corresponding bit line, and may include one transistor and one capacitor. For example, the memory cell array 2610_2 may include a plurality of memory cells connected to the sub word line SWL2, and a plurality of memory cells connected to the sub word line SWL6. Although for convenience of explanation FIG. 26 illustrates that two sub word lines are connected to the memory cells of each of the plurality of memory cell arrays 2610_1, 2610_2, 2610_3, 2610_4, . . . , example embodiments are not limited thereto, and the memory cells of each of the plurality of memory cell arrays 2610_1, 2610_2, 2610_3, 2610_4, . . . may be connected to a different number of sub word lines.

A first end of each of the plurality of sub word lines SWL1, SWL2, SWL3, SWL4, SWL5, SWL6, SWL7, SWL8, . . . may be connected to a corresponding first sub word line driver from among the plurality of first sub word line drivers 2650_1, 2650_2, 2650_3, . . . , and a second end thereof may be connected to a corresponding second sub word line driver from among the plurality of second sub word line drivers 2660_1, 2660_2, 2660_3, 2660_4, 2660_5, 2660_6, . . . . In this example, each of the plurality of sub word lines SWL1, SWL2, SWL3, SWL4, SWL5, SWL6, SWL7, SWL8, . . . may be driven by the corresponding first and second sub word line drivers connected to the first and second ends thereof, respectively.

Each of the plurality of first sub word line drivers 2650_1, 2650_2, 2650_3, . . . may supply either a corresponding first driving signal from among first driving signals PXiD0, PXiD1, . . . or a ground voltage to the first end of the corresponding sub word line according to a main word line signal NWEB. The first driving signals PXiD0, PXiD1, . . . may have a high voltage or the ground voltage. For example, the first sub word line driver 2650_1 may supply the first driving signal PXiD0 or the ground voltage to the first end of the sub word line SWL3 according to the main word line signal NWEB. Also, the first sub word line driver 2650_1 may supply the first driving signal PXiD0 or the ground voltage to the first end of the sub word line SWL2 according to the main word line signal NWEB.

FIG. 26 illustrates a case where each of the first sub word line drivers 2650_1, 2650_2, 2650_3, . . . is connected to first ends of two sub word lines. However, example embodiments are not limited thereto, and each of the first sub word line drivers 2650_1, 2650_2, 2650_3, . . . may be connected to first ends of a different number of corresponding sub word lines. For example, the first ends of the sub word lines SWL1, SWL2, SWL3, SWL4, SWL5, SWL6, SWL7, SWL8, . . . may be connected to different first sub word line drivers, respectively.

Each of the plurality of second sub word line drivers 2660_1, 2660_2, 2660_3, 2660_4, 2660_5, 2660_6, . . . may selectively apply the ground voltage to the second end of the corresponding sub word line according to a second driving signal from among the second driving signals PXiB0, PXiB1, . . . . For example, the second sub word line driver 2660_3 may apply the ground voltage to the second end of the sub word line SWL3 according to the second driving signal PXiB0.

FIG. 26 illustrates a case where each of the second sub word line drivers 2660_1, 2650_2, 2660_3, 2660_4, 2660_6, . . . is connected to the second end of one sub word line. However, example embodiments are not limited thereto, and each of the second sub word line drivers 2660_1, 2650_2, 2660_3, 2660_4, 2660_5, 2660_6, . . . may be connected to second ends of two or more sub word lines. A manner in which the second sub word line drivers 2660_1, 2660_2, 2660_3, 2660_4, 2660_5, 2660_6, . . . are connected according to another example embodiment of inventive concepts, will be described below in greater detail with reference to FIGS. 28 to 30.

The plurality of sub word line driver regions 2630_1, 2630_2, 2630_3, . . . may be located between the plurality of memory cell arrays 2610_1, 2610_2, 2610_3, 2610_4, . . . . In each of the sub word line driver regions 2630_1, 2630_2, 2630_3, . . . , a corresponding first sub word line driver from among the first sub word line drivers 2650_1, 2650_2, 2650_3, . . . , and a corresponding second sub word line driver from among second sub word line drivers 2660_1, 2660_2, 2660_3, 2660_4, 2660_5, 2660_6, . . . may be arranged. The first and second sub word line drivers included in each of the sub word line driver regions 2630_1, 2630_2, 2630_3, . . . may be connected to different sub word lines, respectively.

For example, referring to FIG. 26, the different sub word lines connected to the first and second sub word line drivers connected to each of the sub word line driver regions 2630_1, 2630_2, 2630_3, . . . , respectively, may be adjacent to each other. For example, the sub word line driver region 2630_2 may include the first sub word line driver 2650_1 and the second sub word line drivers 2660_5 and 2660_6. In this example, the sub word lines SWL2 and SWL3 connected to the first sub word line driver 2650_1 and the sub word lines SWL6 and SWL7 connected to the second sub word line drivers 2660_5 and 2660_6 are different from one another. Also, the sub word line SWL2 connected to the first sub word line driver 2650_1 may be adjacent to the sub word line SWL6 connected to the second sub word line drivers 2660_5. Also, the sub word line SWL3 connected to the first sub word line driver 2650_1 may be adjacent to the sub word line SWL7 connected to the second sub word line drivers 2660_6.

The first sub word line driver and the second sub word line driver connected to the first and second lines of the same sub word line, respectively, may be arranged in different sub word line driver regions. For example, the first sub word line driver 2650_1 connected to the first end of the sub word line SWL3 may be located in the sub word line driver region 2630_2, and the second sub word line driver 2660_3 connected to the second end of the sub word line SWL3 may be located in the sub word line driver region 2630_3.

The driving signal generation unit 2670 may generate the first driving signals PXiD0, PXiD1, . . . and the second driving signals PXiB0, PXiB1, . . . based on a row address RA. The driving signal generation unit 2670 may include a decoding unit 2673 and signal generation units 2675_1, 2675_2, 2675_3, . . . . The decoding unit 2673 may generate a first reference driving signal PXi0 and a second reference driving signal PXi1 based on the row address RA. For example, the decoding unit 2673 may generate the first reference driving signal PXi0 and the second reference driving signal PXi1 by using lower bits of the row address RA. The signal generation units 2675_1, 2675_2, 2675_3, . . . may generate the first driving signals PXiD0, PXiD1, . . . , and the second driving signals PXiB0, PXiB1, . . . based on the first reference driving signal PXi0 and the second reference driving signal PXi1. For example, the signal generation unit 2675_1 may generate the first driving signal PXiD1 and the second driving signal PXiB0 based on the first reference driving signal PXi0 and the second reference driving signal PXi1. The signal generation unit 2675_2 may generate the first driving signal PXiD0 and the second driving signal PXiB1 based on the first reference driving signal PXi0 and the second reference driving signal PXi1. The signal generation unit 2675_3 may generate the first driving signal PXiD1 and the second driving signal PXiB0 based on the first reference driving signal PXi0 and the second reference driving signal PXi1.

Figure 27:
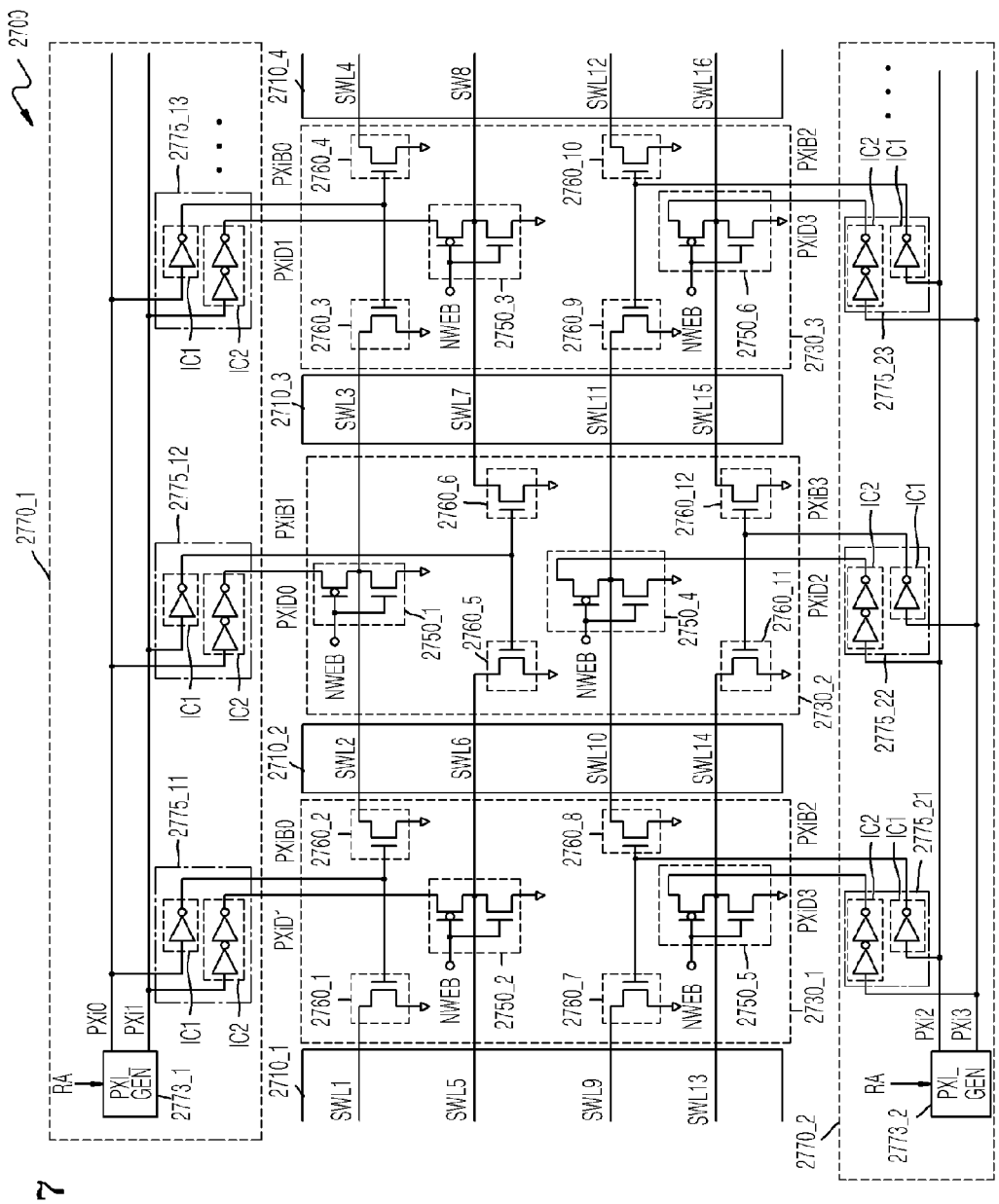
FIG. 27 is a circuit diagram of a semiconductor memory device, such as the semiconductor memory device of FIG. 26, according to another example embodiment of inventive concepts.

FIG. 27 is a circuit diagram of a semiconductor memory device 2700, such as the semiconductor memory device 2600 of FIG. 26, according to another example embodiment of inventive concepts. For convenience of explanation, it is assumed that in the semiconductor memory device 2700, each memory cell included in each of memory cell arrays 2710_1, 2710_2, 2710_3, 2710_4, . . . is connected to a corresponding sub word line from among four sub word lines. However, example embodiments are not limited thereto, and each memory cell included in each of the memory cell arrays 2710_1, 2710_2, 2710_3, 2710_4, . . . may be connected to a corresponding memory cell from among a different number of sub word lines.

Referring to FIG. 27, the semiconductor memory device 2700 may include a plurality of memory cell arrays 2710_1, 2710_2, 2710_3, 2710_4, . . . , a plurality of sub word lines SWL1, SWL2, SWL3, SWL4, SWL5, SWL6, SWL7, SWL8, SWL9, SWL10, SWL11, SWL12, SWL13, SWL14, SWL15, SWL16, . . . , a plurality of sub word line driver regions 2730_1, 2730_2, 2730_3, . . . , a plurality of first sub word line drivers 2750_1, 2750_2, 2750_3, 2750_4, 2750_5, 2750_6, . . . , a plurality of second sub word line drivers 2760_1, 2760_2, 2760_3, 2760_4, 2760_5, 2760_6, 2760_7, 2760_8, 2760_9, 2760_9, 2760_10, 2760_11, 2760_12, . . . , and a plurality of driving signal generation units 2770_1 and 2770_2.

The structures and connections of the plurality of memory cell arrays 2710_1, 2710_2, 2710_3, 2710_4, . . . , the plurality of sub word lines SWL1, SWL2, SWL3, SWL4, SWL5, SWL6, SWL7, SWL8, SWL9, SWL10, SWL11, SWL12, SWL13, SWL14, SWL15, SWL16, . . . , and the plurality of sub word line driver regions 2730_1, 2730_2, 2730_3, . . . illustrated in FIG. 27 are the same as or similar to those of the plurality of memory cell arrays 2610_1, 2610_2, 2610_3, 2610_4, . . . , the plurality of sub word lines SWL1, SWL2, SWL3, SWL4, SWL5, SWL6, SWL7, SWL8, . . . , and the plurality of sub word line driver regions 2630_1, 2630_2, 2630_3, . . . illustrated in FIG. 26, and thus, will not be described again here.

Each of the plurality of first sub word line drivers 2750_1, 2750_2, 2750_3, . . . may supply either a corresponding first driving signal from among first driving signals PXiD0 and PXiD1 or a ground voltage to a first end of a corresponding sub word line according to a main word line signal NWEB. Each of the other first sub word line drivers 2750_4, 2750_5, 2750_6, . . . may supply either a corresponding first driving signal from among the other first driving signals PXiD2 and PXiD3 or the ground voltage to a first end of a corresponding sub word line according to the main word line signal NWEB. The first driving signals PXiD0, PXiD1, PXiD2, PXiD3, . . . may have a high voltage or the ground voltage.

Each of the first sub word line drivers 2750_1, 2750_2, 2750_3, . . . may include a complementary metal-oxide-semiconductor (CMOS) circuit. In this example, each of the first sub word line drivers 2750_1, 2750_2, 2750_3, . . . may include a first transistor having a gate to which the main word line signal NWEB is supplied, a first terminal to which a first driving signal is supplied, and a second terminal connected to the first end of a corresponding sub word line, and a second transistor having a gate to which the word line signal NWEB is supplied, a first terminal to which a ground voltage is applied, and a second terminal connected to the second terminal of the first transistor. The first transistor may be a PMOS transistor and the second transistor may be an NMOS transistor. However, example embodiments are not limited to a case where each of the first sub word line drivers 2750_1, 2750_2, 2750_3, . . . is a CMOS circuit, and other devices may be used as the first sub word line driver as long as the other devices are capable of operating in the same or a similar manner as the first sub word line driver described above.

For example, referring to FIG. 27, in the PMOS transistor of the first sub word line driver 2750_1, the main word line signal NWEB may be supplied to a gate, the first driving signal PXiD0 may be supplied to a first terminal, and the first ends of the sub word lines SWL2 and SWL3 may be connected to a second terminal. In the NMOS transistor of the first sub word line driver 2750_1, the main word line signal NWEB may be supplied to a gate, the ground voltage may be applied to a first terminal, and the second terminal of the NMOS transistor and the first ends of the sub word lines SWL2 and SWL3 may be connected to a second terminal. In another example, in the PMOS transistor of the first sub word line driver 2750_4, the main word line signal NWEB may be supplied to a gate, the first driving signal PXiD2 may be supplied to a first terminal, and the first ends of the sub word lines SWL10 and SWL11 may be connected to a second terminal. In the NMOS transistor of the first sub word line driver 2750_4, the main word line signal NWEB may be supplied to a gate, the ground voltage may be applied to a first terminal, and the second terminal of the NMOS transistor and the first ends of the sub word lines SWL2 and SWL3 may be connected to a second terminal.

Each of the second sub word line drivers 2760_1, 2760_2, 2760_3, 2760_4, 2760_5, 2760_6, 2760_7, 2760_8, 2760_9, 2760_10, 2760_11, 2760_12, . . . may include an NMOS transistor. In this example, each of the second sub word line drivers 2760_1, 2760_2, 2760_3, 2760_4, 2760_5, 2760_6, 2760_7, 2760_8, 2760_9, 2760_10, 2760_11, 2760_12, . . . may include an NMOS transistor in which a corresponding second driving signal is supplied to a gate, the ground voltage is applied to a first terminal, and the second end of a corresponding sub word line is connected to a second terminal. For example, referring to FIG. 27, in the NMOS transistor of the second sub word line driver 2760_5, the second driving signal PXiB1 may be supplied to a gate, the ground voltage may be applied to a first terminal, and the second end of the sub word line SWL6 may be connected to a second terminal. In the NMOS transistor of the second sub word line driver 2760_6, the second driving signal PXiB1 may be supplied to a gate, the ground voltage may be applied to a first terminal, and the second end of the sub word line SWL7 may be connected to a second terminal. However, example embodiments are not limited to a case where each of the second sub word line drivers 2760_1, 2760_2, 2760_3, 2760_4, 2760_5, 2760_6,

2760_7, 2760_8, 2760_9, 2760_10, 2760_11, 2760_12, . . . is an NMOS transistor, and other devices may be used as the second sub word line driver as long as the other devices are capable of operating the same or a similar manner as the second sub word line driver described above.

The driving signal generation unit 2770_1 may generate the first driving signals PXiD0, PXiD1, . . . and the second driving signals PXiB0, PXiB1, . . . based on a row address RA. The driving signal generation unit 2770_1 may include a decoding unit 2773_1, and signal generation units 2775_11, 2775_12, 2775_13, . . . .

The decoding unit 2773_1 may generate a first reference driving signal PXi0 and a second reference driving signal PXi1 based on the row address RA. The decoding unit 2773_1 is the same as or similar to the decoding unit 2673 described above with reference to FIG. 26, and thus, will not be described again here. The signal generation units 2775_11, 2775_12, 2775_13, . . . may generate the first driving signals PXiD0, PXiD1, . . . and the second driving signals PXiB0, PXiB1, . . . based on the first reference driving signal PXi0 and the second reference driving signal PXi1. Each of the signal generation units 2775_11, 2775_12, 2775_13, . . . may include a first inverter chain IC1 that inverts and outputs the first reference driving signal PXi0 or the second reference driving signal PXi1, and a second inverter chain IC2 that does not invert and directly outputs the first reference driving signal PXi0 or the second reference driving signal PXi1. For example, the first inverter chain IC1 may include an odd number of inverters, and the second inverter chain IC2 may include an even number of inverters. However, example embodiments are not limited thereto, and different circuits may be used as the signal generation units 2775_11, 2775_12, 2775_13, . . . as long as they are capable of operating in the same or a similar manner as the signal generation units 2775_11, 2775_12, 2775_13 described above.

The first inverter chain IC1 of the signal generation unit 2775_11 may invert the first reference driving signal PXi0 and supply the result of inverting as the second driving signal PXiB0 to the second sub word line drivers 2760_1 and 2760_2. The second inverter chain IC2 of the signal generation unit 2775_11 may invert the second reference driving signal PXi1 and supply the result of inverting as the first driving signal PXiD1 to the first sub word line driver 2750_2. The first inverter chain IC1 of the signal generation unit 2775_12 may invert the second reference driving signal PXi1 and supply the result of inverting as the second driving signal PXiB1 to the second sub word line drivers 2760_5 and 2760_6. The second inverter chain IC2 of the signal generation unit 2775_12 may invert the first reference driving signal PXi0 and supply the result of inverting as the first driving signal PXiD0 to the first sub word line driver 2750_1.

The driving signal generation unit 2770_2 may generate the first driving signals PXiD2, PXiD3, . . . and the second driving signals PXiB2, PXiB2, . . . based on the row address RA. The driving signal generation unit 2770_2 may include a decoding unit 2773_2, and signal generation units 2775_21, 2775_22, 2775_23, . . . .

Similarly, the decoding unit 2773_2 may generate a first reference driving signal PXi2 and a second reference driving signal PXi3 based on the row address RA. The decoding unit 2773_2 is the same as or similar to the decoding unit 2673 described above with reference to FIG. 26, and thus, will not be described again here. The signal generation units 2775_21, 2775_22, 2775_23, . . . may generate the first driving signals PXiD2, PXiD3, . . . and the second driving signals PXiB2, PXiB3, . . . based on the first reference driving signal PXi2 and the second reference driving signal PXi3. Each of the signal generation units 2775_21, 2775_22, 2775_23, . . . may include a first inverter chain IC1 that inverts and outputs the first reference driving signal PXi2 or the second reference driving signal PXi3, and a second inverter chain IC2 that does not invert and directly outputs the first reference driving signal PXi2 or the second reference driving signal PXi3. For example, the first inverter chain IC1 may include an odd number of inverters, and the second inverter chain IC2 may include an even number of inverters. However, example embodiments are not limited thereto, and different circuits may be used as the signal generation units 2775_21, 2775_22, 2775_23, . . . as long as they are capable of operating in the same or a similar manner as the signal generation units 2775_21, 2775_22, 2775_23, . . . described above.

The first inverter chain IC1 of the signal generation unit 2775_21 may invert the first reference driving signal PXi2 and supply the result of inverting as the second driving signal PXiB2 to the second sub word line drivers 2760_7 and 2760_8. The second inverter chain IC2 of the signal generation unit 2775_21 may invert the second reference driving signal PXi3 and supply the result of inverting as the first driving signal PXiD3 to the first sub word line drivers 2750_5. The first inverter chain IC1 of the signal generation unit 2775_22 may invert the second reference driving signal PXi3 and supply the result of inverting as the second driving signal PXiB3 to the second sub word line drivers 2760_11 and 2760_12. The second inverter chain IC2 of the signal generation unit 2775_22 may invert the first reference driving signal PXi2 and supply the result of inverting as the first driving signal PXiD2 to the first sub word line driver 2750_4.

Referring to FIG. 27, memory cells of each of the memory cell arrays 2710_1, 2710_2, 2710_3, 2710_4, . . . are connected to four sub word lines, and thus, the semiconductor memory device 2700 includes the two driving signal generation units 2770_1 and 2770_2. However, example embodiments are not limited thereto, and the total number of the driving signal generations may be different when the memory cells of each of the memory cell arrays 2710_1, 2710_2, 2710_3, 2710_4, . . . are connected to a different number of sub word lines. For example, if the memory cells of each of the memory cell arrays 2710_1, 2710_2, 2710_3, 2710_4, . . . are connected to eight sub word lines, then the semiconductor memory device 2700 may include four driving signal generation units.

An example operation of the semiconductor memory device 2700 according to an example embodiment of inventive concepts will now be described with reference to FIG. 27. For convenience of explanation, it is assumed that the sub word lines SWL1, SWL2, SWL3, and SWL4 are enabled and the other sub word lines SWL5, SWL6, SWL7, SWL8, SWL9, SWL10, SWL11, SWL12, SWL13, SWL14, SWL15, SWL16, . . . are disabled.

The decoding unit 2773_1 of the driving signal generation unit 2770_1 may generate the first reference driving signal PXi0 in a logic high state and the second reference driving signal PXi1 in a logic low state based on the row address RA. Also, the decoding unit 2773_2 of the driving signal generation unit 2770_2 may generate the first reference driving signal PXi2 in the logic low state and the second reference driving signal PXi3 in the logic low state based on the row address RA.

The signal generation units 2775_11, 2775_13, . . . of the driving signal generation unit 2770_1 may generate the first driving signal PXiD1 in the logic low state and the second driving signal PXiB0 in the logic low state. The signal generation unit 2775_12, . . . of the driving signal generation unit 2770_1 may generate the first driving signal PXiD0 in the logic high state and the second driving signal PXiB1 in the logic high state. The signal generation units 2775_21, 2775_23, . . . of the driving signal generation unit 2770_2 may generate the first driving signal PXiD3 in the logic low state and the second driving signal PXiB2 in the logic high state. The signal generation unit 2775_22 of the driving signal generation unit 2770_2 may generate the first driving signal PXiD2 in the logic low state and the second driving signal PXiB3 in the logic high state.

Because the sub word lines SWL1, SWL2, SWL3, and SWL4 are enabled, the main sub word line enable signal NWEB may be enabled and may be in the logic low state. Thus, the PMOS transistors and the NMOS transistors of the first sub word line drivers 2750_1, 2750_2, 2750_3, 2750_4, 2750_5, 2750_6, . . . are turned on and turned off, respectively. The first driving signal PXiD0 supplied to the first sub word line drivers 2750_1, . . . connected to the first ends of the sub word lines SWL1, SWL2, SWL3, SWL4, . . . , is in the logic high state. Thus, the first sub word line drivers 2750_1, . . . may drive the sub word lines SWL1, SWL2, SWL3, SWL4, . . . with a high voltage. Also, the second sub word line drivers 2760_1, 2760_2, 2760_3, 2760_4, . . . connected to the second ends of the sub word lines SW1, SW2, SW3, SW4, . . . are disabled according to the second driving signal PXiB0 in the logic low state.

Each of the first sub word line drivers 2750_2, 2750_3, 2750_4, 2750_5, 2750_6, . . . and the second sub word line drivers 2760_5, 2760_6, 2760_7, 2760_8, 2760_9, 2760_10, 2760_11, 2760_12, . . . that are connected to the other sub word lines SWL5, SWL6, SWL7, SWL8, SWL9, SWL10, SWL11, SWL12, SWL13, SWL14, SWL15, SWL16, . . . , may drive a corresponding sub word line with a low voltage. For example, because the NMOS transistors of the second sub word line drivers 2760_5 and 2760_6 are turned on, each of the second sub word line drivers 2760_5 and 2760_6 drives a corresponding sub word line from among the sub word lines SWL6 and SWL7 with the low voltage. Also, the first driving signal PXiD1 supplied to the first sub word line drivers 2750_2 and 2750_3 is in the logic low state, and each of the first sub word line drivers 2750_2 and 2750_3 drives a corresponding sub word line from among the sub word lines SWL6 and SWL7 with the low voltage.

Figure 28:
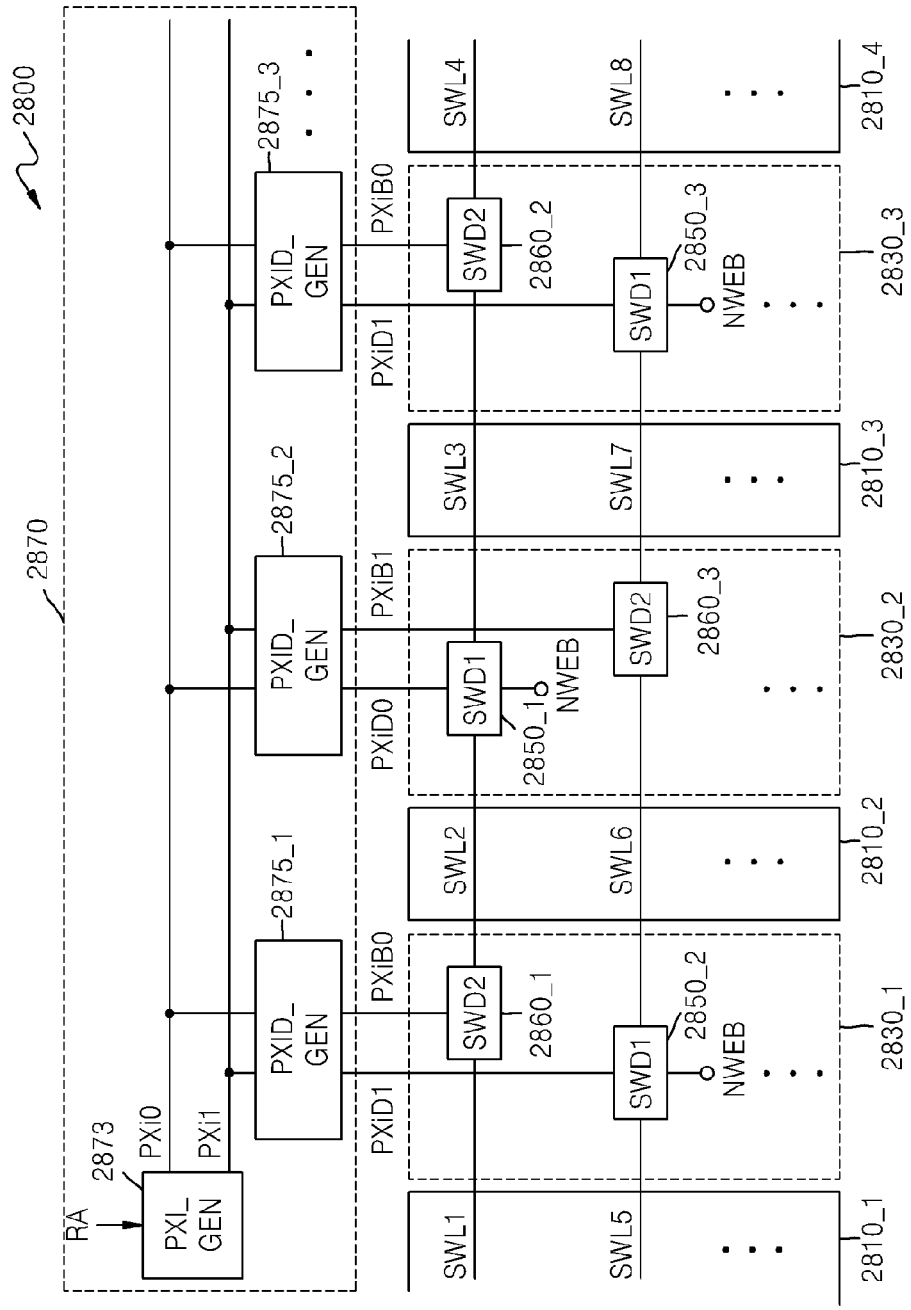
FIG. 28 is a block diagram of a semiconductor memory device according to another example embodiment of inventive concepts.

FIG. 28 is a block diagram of a semiconductor memory device 2800 according to another example embodiment of inventive concepts.

Referring to FIG. 28, the semiconductor memory device 2800 may include a plurality of memory cell arrays 2810_1, 2810_2, 2810_3, 2810_4, . . . , a plurality of sub word lines SWL1, SWL2, SWL3, SWL4, SWL5, SWL6, SWL7, SWL8, . . . , a plurality of sub word line driver regions 2830_1, 2830_2, 2830_3, . . . , a plurality of first sub word line drivers 2850_1, 2850_2, 2850_3, . . . , a plurality of second sub word line drivers 2860_1, 2860_2, 2860_3, . . . , and a driving signal generation unit 2870.

The semiconductor memory device 2800 is the same as or similar to the semiconductor memory device 2700 of FIG. 27, except for connections of second sub word line drivers 2860_1, 2860_2, 2860_3, . . . . In this example embodiment, the plurality of memory cell arrays 2810_1, 2810_2, 2810_3, 2810_4, . . . , the plurality of sub word line driver regions 2830_1, 2830_2, 2830_3, . . . , the plurality of first sub word line drivers 2850_1, 2850_2, 2850_3, . . . , and the driving signal generator 2870 are the same as or similar to those described above with reference to FIG. 27, and thus, will not be described again here. Only the second sub word line drivers 2860_1, 2860_2, 2860_3, . . . that are different than in the semiconductor memory device 2700 of FIG. 27 will be described in detail.

In the semiconductor memory device 2800, a first end of each of the plurality of sub word lines SWL1, SWL2, SWL3, SWL4, SWL5, SWL6, SWL7, SWL8, . . . may be connected to a corresponding first sub word line driver from among the first sub word line drivers 2850_1, 2850_2, 2850_3, . . . , and a second end thereof may be connected to a second sub word line driver from among the second sub word line drivers 2860_1, 2860_2, 2860_3, . . . . Also, the plurality of sub word lines SWL1, SWL2, SWL3, SWL4, SWL5, SWL6, SWL7, SWL8, . . . included in the semiconductor memory device 2800 may be connected to one another. For example, the second ends of the sub word lines SWL1 and SWL2 may be connected to each other, the second ends of the sub word lines SWL3 and SWL4 may be connected to each other, and the second ends of the sub word lines SWL6 and SWL7 may be connected to each other.

In at least the example embodiment of FIG. 28, each of the second sub word line drivers 2860_1, 2860_2, 2860_3, . . . is connected to the second ends of two sub word lines connected to each other. For example, the second sub word line driver 2860_1 is connected to the second end of the sub word line SWL1 and the second end of the sub word line SWL2. Also, the second sub word line driver 2860_2 is connected to the second end of the sub word line SWL3 and the second end of the sub word line SWL4, and the second sub word line driver 2860_3 is connected to the second end of the sub word line SWL6 and the second end of the sub word line SWL7. Thus, each of the plurality of second sub word line drivers 2860_1, 2860_2, 2860_3, . . . may selectively apply a ground voltage to the second ends of corresponding two sub word lines according to a second driving signal from among second driving signals PXiB0, PXiB1, . . . .

Figure 29:
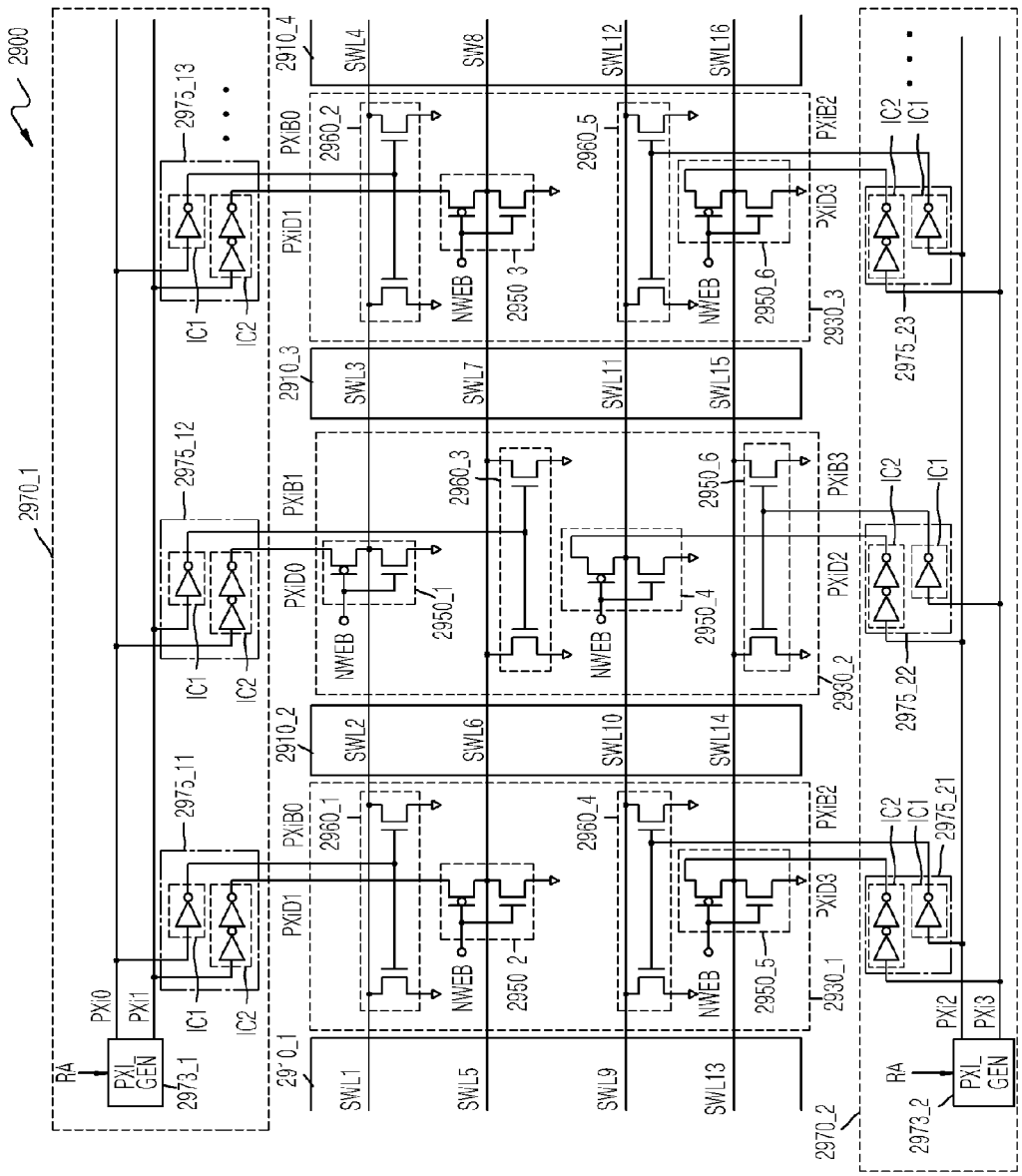
FIG. 29 is a circuit diagram of a semiconductor memory device, such as the semiconductor memory device of FIG. 28, according to another example embodiment of inventive concepts.

FIG. 29 is a circuit diagram of a semiconductor memory device 2900, such as the semiconductor memory device 2800 of FIG. 28, according to another example embodiment of inventive concepts. For convenience of explanation, it is assumed that in the semiconductor memory device 2900, each memory cell included in each of memory cell arrays 2910_1, 2910_2, 2910_3, 2910_4, . . . is connected to a corresponding sub word line from among four sub word lines. However, example embodiments are not limited thereto, and each memory cell included in each of the memory cell arrays 2910_1, 2910_2, 2910_3, 2910_4, . . . may be connected to a different number of word lines.

Referring to FIG. 29, the semiconductor memory device 2900 may include a plurality of memory cell arrays 2910_1, 2910_2, 2910_3, 2910_4, . . . , a plurality of sub word lines SWL1, SWL2, SWL3, SWL4, SWL5, SWL6, SWL7, SWL8, SWL9, SWL10, SWL11, SWL12, SWL13, SWL14, SWL15, SWL16, . . . , a plurality of sub word line driver regions 2930_1, 2930_2, 2930_3, . . . , a plurality of first sub word line drivers 2950_1, 2950_2, 2950_3, 2950_4, 2950_5, 2950_6, . . . , a plurality of second sub word line drivers 2960_1, 2960_2, 2960_3, 2960_4, 2960_5, 2960_6, . . . , and a plurality of driving signal generation units 2970_1 and 2970_2.

The structures and connections of the plurality of memory cell arrays 2910_1, 2910_2, 2910_3, 2910_4, . . . , the plurality of sub word lines SWL1, SWL2, SWL3, SWL4, SWL5, SWL6, SWL7, SWL8, SWL9, SWL10, SWL11, SWL12, SWL13, SWL14, SWL15, SWL16, . . . , and the plurality of sub word line driver regions 2930_1, 2930_2, 2930_3, . . . illustrated in FIG. 29, are the same as or similar to those of the plurality of memory cell arrays 2810_1, 2810_2, 2810_3, 2810_4, . . . , the plurality of sub word lines SWL1, SWL2, SWL3, SWL4, SWL5, SWL6, SWL7, SWL8, . . . , and the plurality of sub word line driver regions 2830_1, 2830_2, 2830_3, . . . illustrated in FIG. 28, and thus, will not be described again here. The structures and operations of the plurality first sub word line drivers 2950_1, 2950_2, 2950_3, 2950_4, 2950_5, 2950_6, . . . and the plurality of driving signal generation units 2970_1 and 2970_2 are the same as or similar to those of the plurality first sub word line drivers 2750_1, 2750_2, 2750_3, 2750_4, 2750_5, 2750_6, . . . and the plurality of driving signal generation units 2770_1 and 2770_2 of FIG. 27, and thus, will not be described again here.

Each of the second sub word line drivers 2960_1, 2960_2, 2960_3, 2960_4, 2960_5, 2960_6, . . . may include a plurality of NMOS transistors. FIG. 29 illustrates that each of the second sub word line drivers 2960_1, 2960_2, 2960_3, 2960_4, 2960_5, 2960_6, . . . includes two NMOS transistors, but example embodiments are not limited thereto and each of the second sub word line drivers 2960_1, 2960_2, 2960_3, 2960_4, 2960_5, 2960_6, . . . may include a different number of NMOS transistors. Example embodiments are also not limited to a case where each of the second sub word line drivers 2960_1, 2960_2, 2960_3, 2960_4, 2960_5, 2960_6, . . . is an NMOS transistor, and other devices may be used as the second sub word line driver as long as the other devices are capable of operating in the same or a similar manner as the second sub word line driver described above.

Each of the second sub word line drivers 2960_1, 2960_2, 2960_3, 2960_4, 2960_5, 2960_6, . . . may include a plurality of NMOS transistors each having a gate to which a corresponding second driving signal is supplied, a first terminal to which a ground voltage is applied to a first terminal, and a second terminal connected to the second ends of corresponding sub word lines. For example, referring to FIG. 29, in each of the NMOS transistors of the second sub word line driver 2960_3, a second driving signal PXiB1 may be supplied to a gate, the ground voltage may be applied to a first terminal, and the second ends of the sub word lines SWL6 and SWL7 may be connected to a second terminal. In each of the NMOS transistors of the second sub word line driver 2960_6, a second driving signal PXiB3 may be supplied to a gate, the ground voltage may be applied to a first terminal, and the second ends of the sub word lines SWL14 and SWL15 may be connected to a second terminal.

Operation of the semiconductor memory device 2900 is the same as or similar to that of the semiconductor memory device 2700 of FIG. 27 described above, and thus, will not be described again here. In more detail, an operation of the semiconductor memory device 2900 is the same as or similar to that of the semiconductor memory device 2700 of FIG. 27, except that each of the second sub word line drivers 2960_1, 2960_2, 2960_3, 2960_4, 2960_5, 2960_6, . . . drives the corresponding two sub word lines with a ground voltage that is about two times that in the semiconductor memory device 2700.

Figure 30:
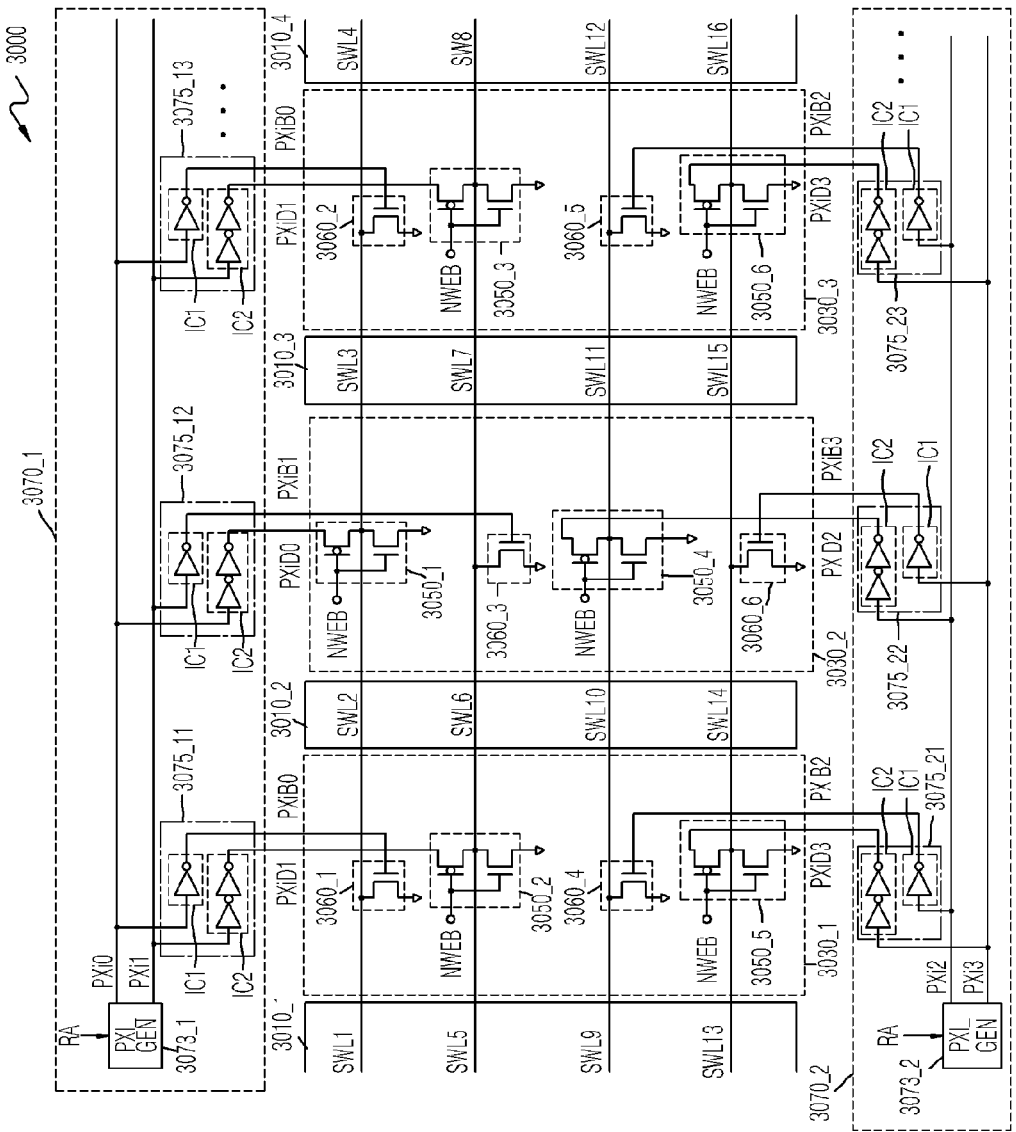
FIG. 30 is a circuit diagram of the semiconductor memory device of FIG. 28, according to another example embodiment of inventive concepts.

FIG. 30 is a circuit diagram of a semiconductor memory device 3000, such as the semiconductor memory device 2800 of FIG. 28, according to another example embodiment of inventive concepts. For convenience of explanation, it is assumed that in the semiconductor memory device 3000, each memory cell included in each of memory cell arrays 3010_1, 3010_2, 3010_3, 3010_4, . . . is connected to a corresponding sub word line from among four sub word lines. However, example embodiments are not limited thereto, and each memory cell included in each of the memory cell arrays 3010_1, 3010_2, 3010_3, 3010_4, . . . may be connected to a different number of word lines.

Referring to FIG. 30, the semiconductor memory device 3000 may include a plurality of memory cell arrays 3010_1, 3010_2, 3010_3, 3010_4, . . . , a plurality of sub word lines SWL1, SWL2, SWL3, SWL4, SWL5, SWL6, SWL7, SWL8, SWL9, SWL10, SWL11, SWL12, SWL13, SWL14, SWL15, SWL16, . . . , a plurality of sub word line driver regions 3030_1, 3030_2, 3030_3, . . . , a plurality of first sub word line drivers 3050_1, 3050_2, 3050_3, 3050_4, 3050_5, 3050_6, . . . , a plurality of second sub word line drivers 3060_1, 3060_2, 3060_3, 3060_4, 3060_5, 3060_6, . . . , and a plurality of driving signal generation units 3070_1 and 3070_2.

The structures and connections of the plurality of memory cell arrays 3010_1, 3010_2, 3010_3, 3010_4, . . . , the plurality of sub word lines SWL1, SWL2, SWL3, SWL4, SWL5, SWL6, SWL7, SWL8, SWL9, SWL10, SWL11, SWL12, SWL13, SWL14, SWL15, SWL16, . . . , and the plurality of sub word line driver regions 3030_1, 3030_2, 3030_3, . . . illustrated in FIG. 29, are the same as or similar to those of the plurality of memory cell arrays 2810_1, 2810_2, 2810_3, 2810_4, . . . , the plurality of sub word lines SWL1, SWL2, SWL3, SWL4, SWL5, SWL6, SWL7, SWL8, . . . , and the plurality of sub word line driver regions 2830_1, 2830_2, 2830_3, . . . illustrated in FIG. 28, and thus, will not be described again here. Also, the structures and operations of the plurality of first sub word line drivers 3050_1, 3050_2, 3050_3, 3050_4, 3050_5, 3050_6, . . . and the plurality of driving signal generation units 3070_1 and 3070_2, are the same as or similar to those of the plurality of first sub word line drivers 2750_1, 2750_2, 2750_3, 2750_4, 2750_5, 2750_6, . . . and the plurality of driving signal generation units 2770_1 and 2770_2 of FIG. 27, and thus, will not be described again here.

Each of the second sub word line drivers 3060_1, 3060_2, 3060_3, 3060_4, 3060_5, 3060_6, . . . may include one NMOS transistor. However, example embodiments are not limited to a case where each of the second sub word line drivers 3060_1, 3060_2, 3060_3, 3060_4, 3060_5, 3060_6, . . . is an NMOS transistor, and other devices may be used as the second sub word line driver as long as the other devices are capable of operating in the same or a similar manner as the second sub word line driver described above.

Each of the second sub word line drivers 3060_1, 3060_2, 3060_3, 3060_4, 3060_5, 3060_6, . . . may include a NMOS transistor in which a corresponding second driving signal is supplied to a gate, a ground voltage is applied to a first terminal, and the second ends of corresponding sub word lines are connected to a second terminal. For example, referring to FIG. 30, in the NMOS transistor of the second sub word line driver 3060_3, a second driving signal PXiB1 may be supplied to a gate, the ground voltage may be applied to a first terminal, and the second ends of the sub word lines SWL6 and SWL7 may be connected to a second terminal. Also, in the NMOS transistor of the second sub word line driver 3060_6, a second driving signal PXiB3 may be supplied to a gate, the ground voltage may be applied to a first terminal, and the second ends of the sub word lines SWL14 and SWL15 may be connected to a second terminal.

Operation of the semiconductor memory device 3000 is the same as or similar to that of the semiconductor memory device 2700 of FIG. 27 described above, and thus, will not be described again here. In more detail, an operation of the semiconductor memory device 3000 is the same as or similar to that of the semiconductor memory device 2700, except that each of the second sub word line drivers 3060_1, 3060_2, 3060_3, 3060_4, 3060_5, 3060_6, . . . drives corresponding two sub word lines with the ground voltage.

Conventionally, when a first sub word line driver drives a corresponding sub word line with a high voltage, a second sub word line driver connected to a word line adjacent to the driven word line drives the adjacent word line with a low voltage in a sub word line driver region where the first sub word line driver is not located. Thus, conventionally, coupling noise is generated in a sub word line portion adjacent to the first sub word line driver and a sub word line portion distant from the second sub word line driver. However, according to at least the example embodiments of FIGS. 26 to 30, when a first sub word line driver drives a corresponding sub word line with a high voltage, a second sub word line driver connected to a word line adjacent to the word line driven with the high voltage drives the adjacent word line with a low voltage in the same sub word line driver region where the first sub word line driver is located. Thus, in a semiconductor device according to at least some example embodiments of inventive concepts, coupling noise may be reduced relatively to a conventional semiconductor memory device.

Figure 31:
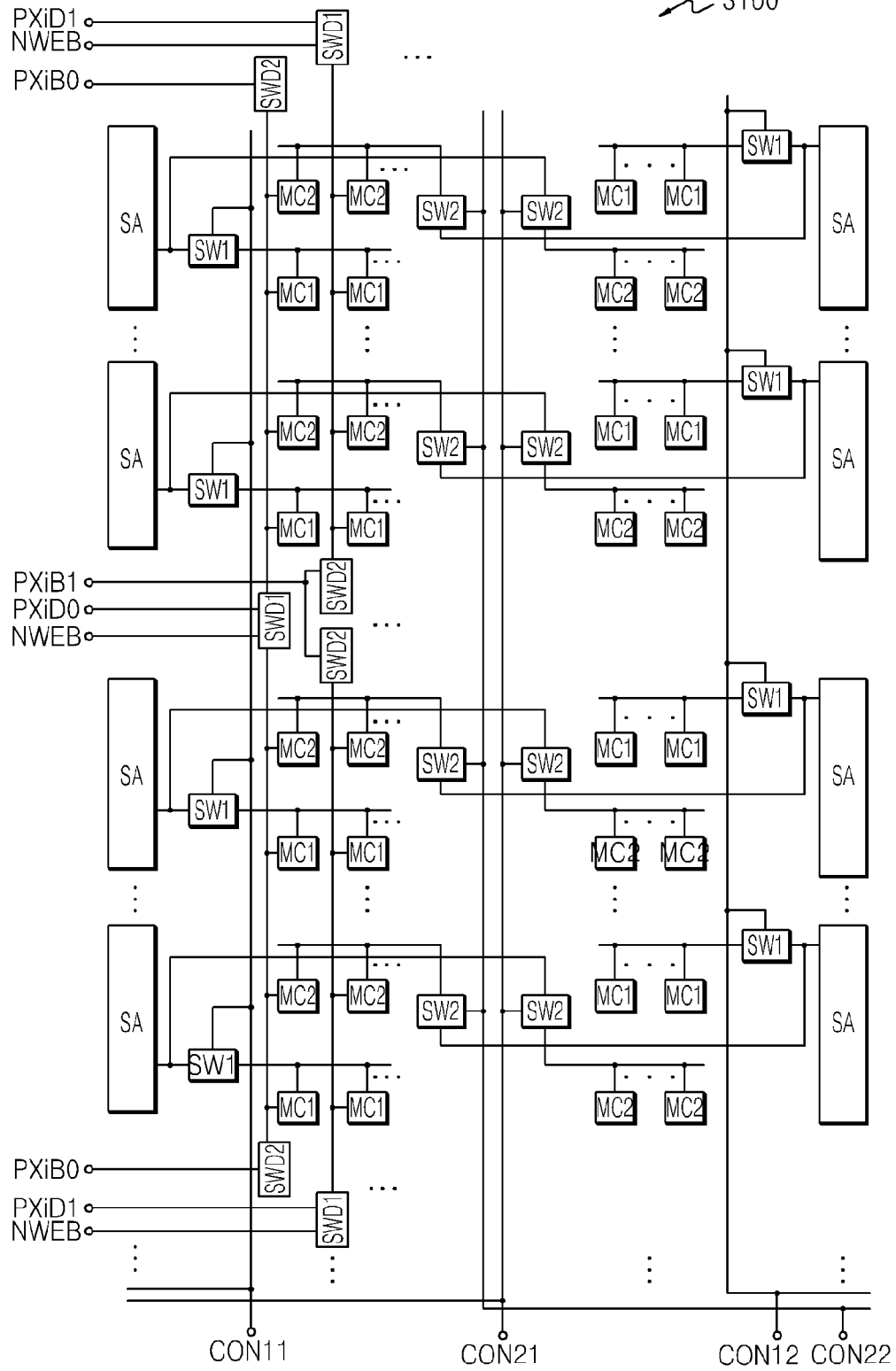
FIG. 31 is a block diagram of a semiconductor memory device according to another example embodiment of inventive concepts.

FIG. 31 is a block diagram of a semiconductor memory device 3100 according to another example embodiment of inventive concepts.

Referring to FIG. 31, the memory device 3100 is the same as or similar to a combination of the semiconductor memory device 100 of FIG. 1 and the semiconductor memory device 2600 of FIG. 26. The semiconductor memory device 100 has been described above in detail with reference to FIG. 1, and the semiconductor memory device 2600 has been described above in detail with reference to FIG. 26. Thus, the semiconductor memory device 3100 will not be described in detail here. Also, a part of the semiconductor memory device 3100 of FIG. 31 corresponding to the semiconductor memory device 100 may be the same as or similar to the semiconductor memory device 200 of FIG. 2, and a part of the semiconductor memory device 3100 corresponding to the semiconductor memory device 2600 may be the same as or similar to the semiconductor memory device 2700 of FIG. 27.

Figure 32:
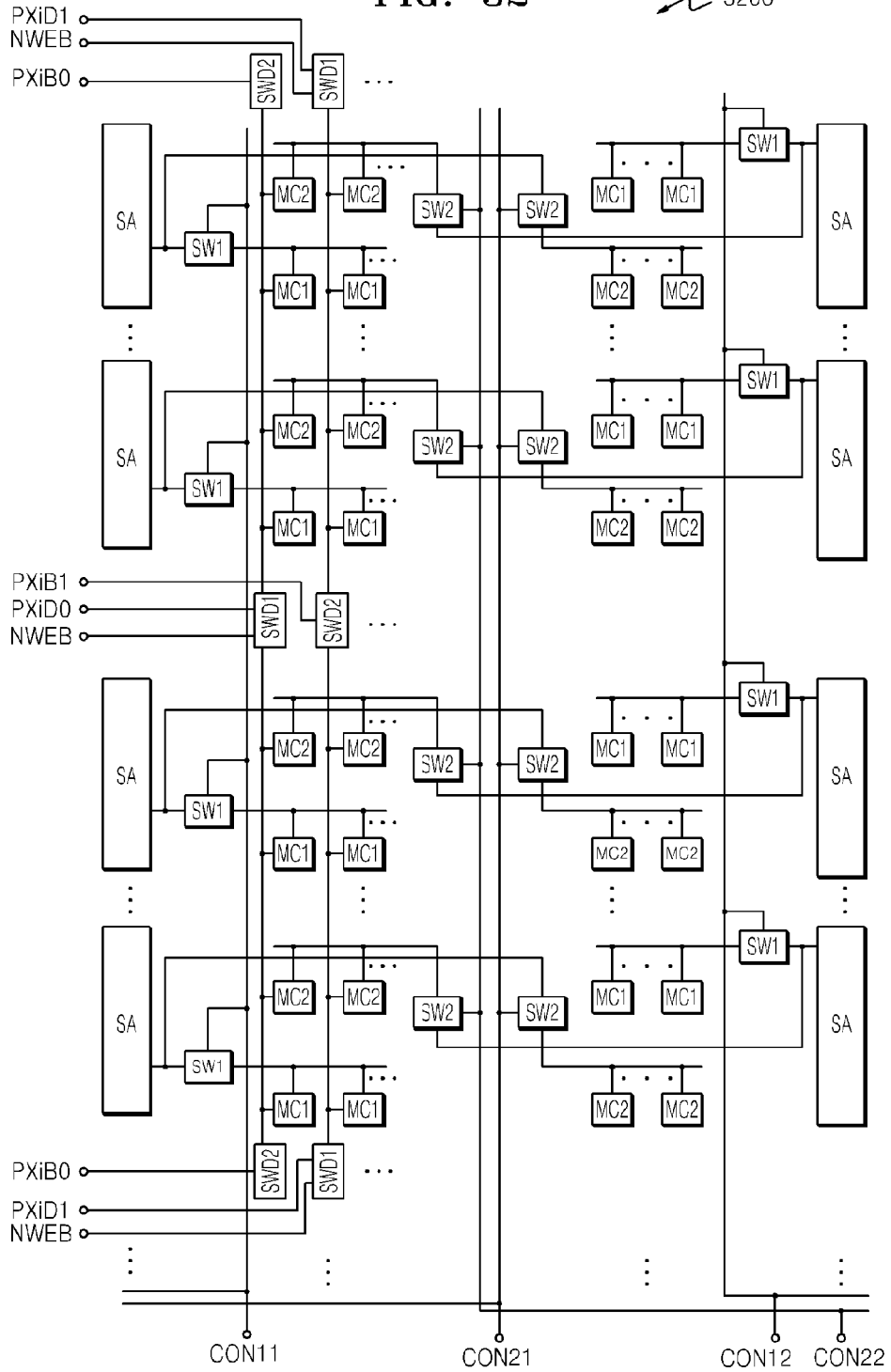
FIG. 32 is a block diagram of a semiconductor memory device according to another example embodiment of inventive concepts.

FIG. 32 is a block diagram of a semiconductor memory device 3200 according to another example embodiment of inventive concepts.

Referring to FIG. 32, the memory device 3200 is the same as or similar to a combination of the semiconductor memory device 100 of FIG. 1 and the semiconductor memory device 2800 of FIG. 28. The semiconductor memory device 100 has been described above in detail with reference to FIG. 1, and the semiconductor memory device 2800 has been described above in detail with reference to FIG. 28. Thus, the semiconductor memory device 3200 will not be described in detail here. Also, a part of the semiconductor memory device 3200 of FIG. 32 corresponding to the semiconductor memory device 100 may be the same as or similar to the semiconductor memory device 200 of FIG. 2, and a part of the semiconductor memory device 3200 corresponding to the semiconductor memory device 2800 may be the same as or similar to the semiconductor memory device 2900 of FIG. 29 or the semiconductor memory device 3000 of FIG. 30.

A combination of one of the semiconductor memory devices 100 and 200 illustrated in FIGS. 1 and 2, and one of the semiconductor memory devices 2600 to 3000 illustrated in FIGS. 26 to 30 will be described below. However, example embodiments are not limited thereto, and one of the semiconductor memory devices 300 to 1200 illustrated in FIGS. 3 to 12 and one of the semiconductor memory devices 2600 to 3000 illustrated in FIGS. 26 to 30 may be combined with each other.

Figure 33:
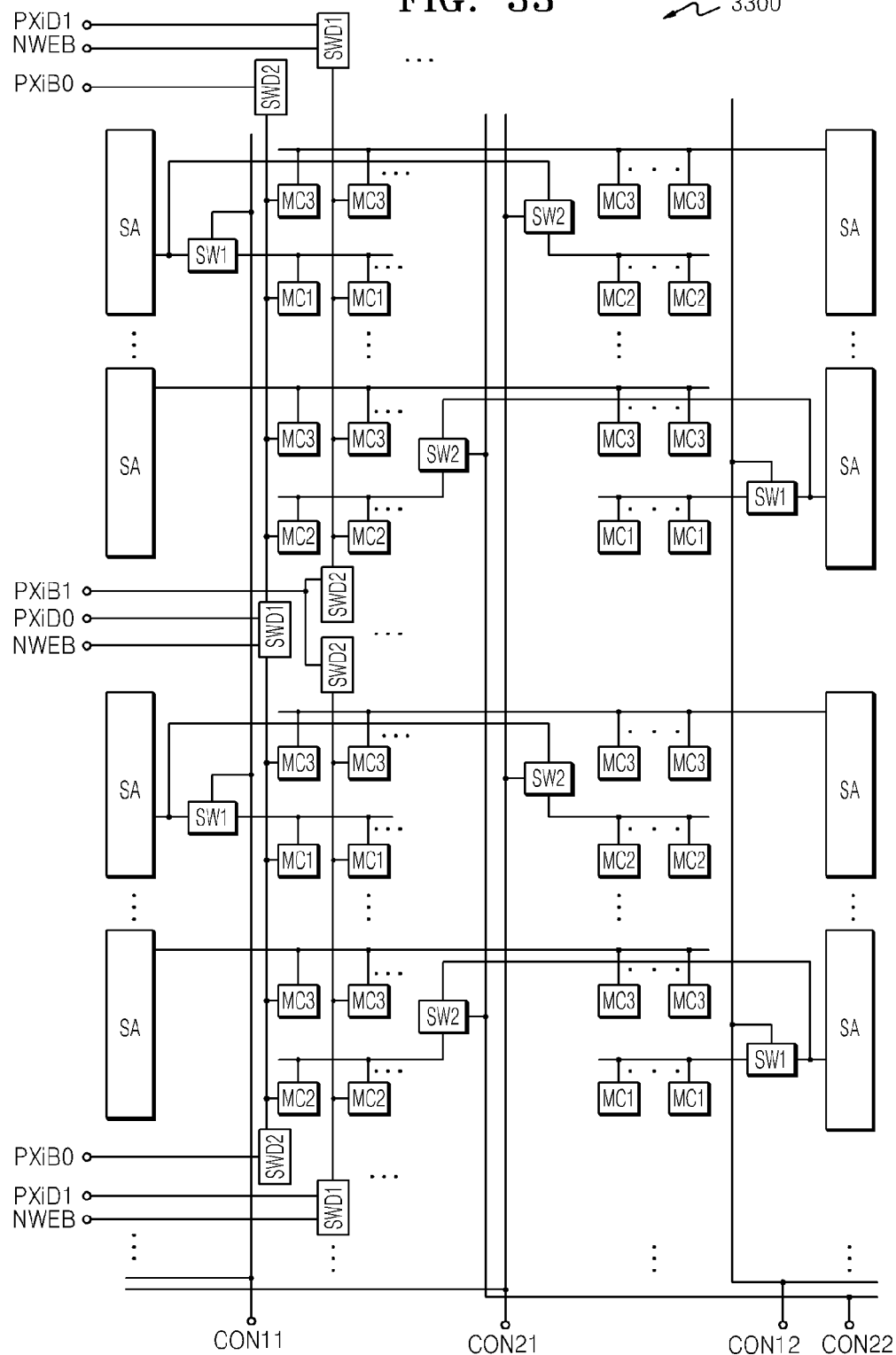
FIG. 33 is a block diagram of a semiconductor memory device according to another example embodiment of inventive concepts.

FIG. 33 is a block diagram of a semiconductor memory device 3300 according to another example embodiment of inventive concepts.

Referring to FIG. 33, the memory device 3300 is the same as or similar to a combination of the semiconductor memory device 1300 of FIG. 13 and the semiconductor memory device 2600 of FIG. 26. The semiconductor memory device 1300 has been described above in detail with reference to FIG. 13, and the semiconductor memory device 2600 has been described above in detail with reference to FIG. 26. Thus, the semiconductor memory device 3300 will not be described in detail here. Also, a part of the semiconductor memory device 3300 of FIG. 33 corresponding to the semiconductor memory device 1300 may be the same as or similar to the semiconductor memory device 1400 of FIG. 14, and a part of the semiconductor memory device 3300 corresponding to the semiconductor memory device 2600 may be the same as or similar to the semiconductor memory device 2700 of FIG. 27.

Figure 34:
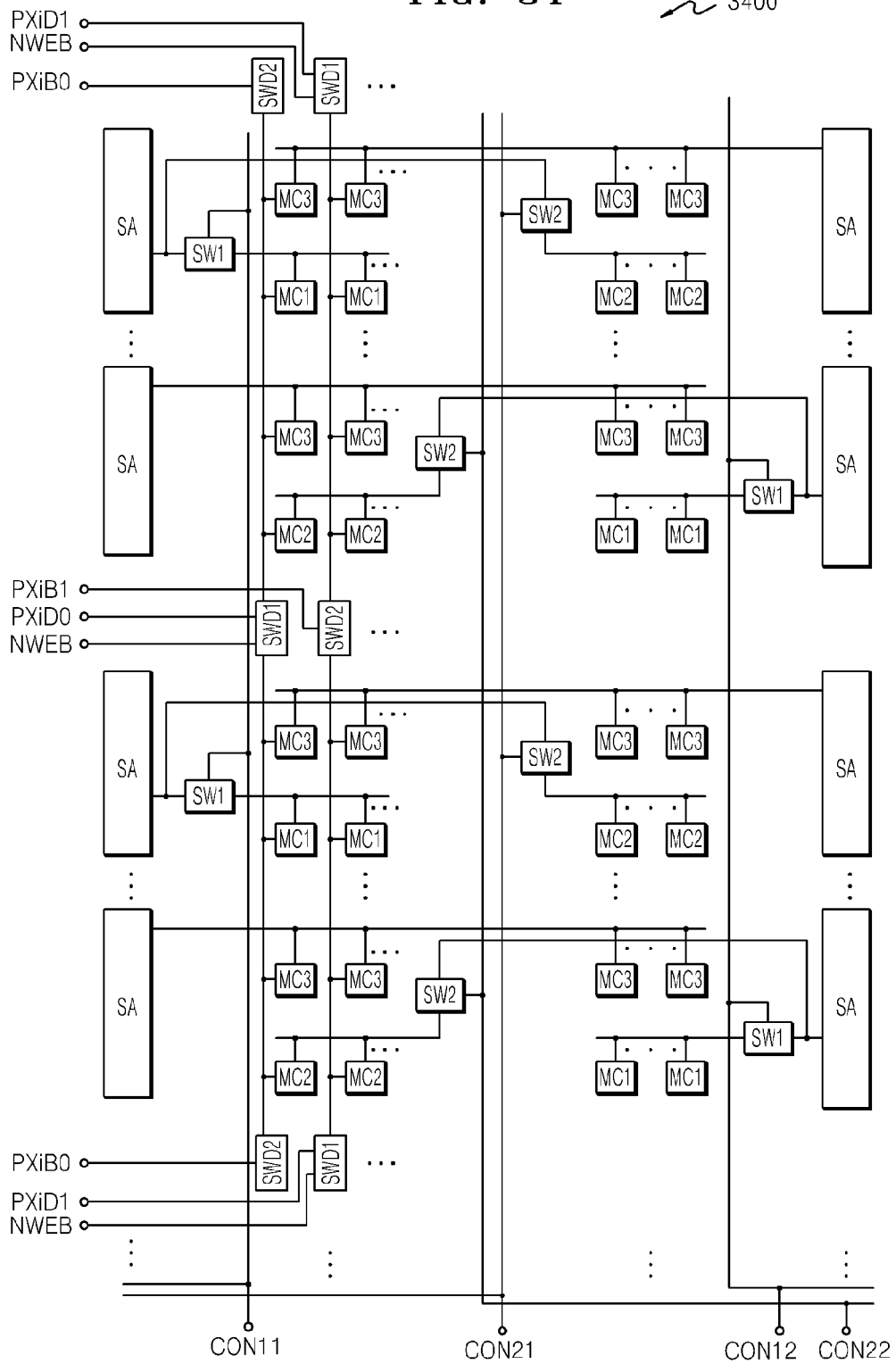
FIG. 34 is a block diagram of a semiconductor memory device according to another example embodiment of inventive concepts.

FIG. 34 is a block diagram of a semiconductor memory device 3400 according to another example embodiment of inventive concepts.

Referring to FIG. 34, the memory device 3400 is the same as or similar to a combination of the semiconductor memory device 1300 of FIG. 13 and the semiconductor memory device 2800 of FIG. 28. The semiconductor memory device 1300 has been described above in detail with reference to FIG. 13, and the semiconductor memory device 2800 has been described above in detail with reference to FIG. 28. Thus, the semiconductor memory device 3400 will not be described in detail here. Also, a part of the semiconductor memory device 3400 of FIG. 34 corresponding to the semiconductor memory device 1300 may be the same as or similar to the semiconductor memory device 1400 of FIG. 14, and a part of the semiconductor memory device 3400 corresponding to the semiconductor memory device 2800 may be the same as or similar to the semiconductor memory device 2900 of FIG. 29 or the semiconductor memory device 3000 of FIG. 30.

A combination of one of the semiconductor memory devices 1300 and 1400 illustrated in FIGS. 13 and 14, and one of the semiconductor memory devices 2600 to 3000 illustrated in FIGS. 26 to 30 will be described below. However, example embodiments are not limited thereto, and one of the semiconductor memory devices 1500 to 2400 illustrated in FIGS. 15 to 24 and one of the semiconductor memory devices 2600 to 3000 illustrated in FIGS. 26 to 30 may be combined with each other.

A transistor included in one or more memory cells of a semiconductor memory device according to at least some example embodiments of inventive concepts may be a vertical-channel transistor. In the vertical-channel transistor, a source region and a drain region may be located above and below a gate electrode, respectively. However, the transistor included in one or more memory cells in at least the example embodiments discussed herein are not limited to the vertical-channel transistor, but may be a planar transistor. In the planar transistor, a gate electrode may be disposed on a semiconductor substrate, and a source region and a drain region may be disposed in the semiconductor substrate and adjacent to both ends of the gate electrode, respectively. An example of the vertical-channel transistor according to an example embodiment of inventive concepts will be described in detail with reference to FIG. 35 below.

Figure 35:
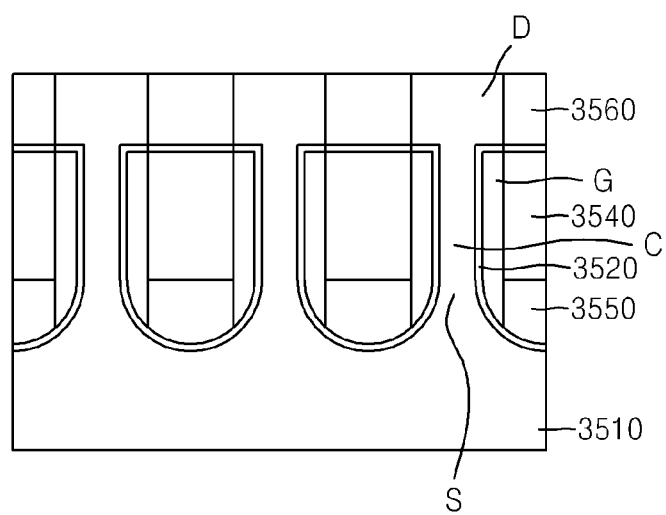
FIG. 35 is a cross-sectional view of a vertical-channel transistor included in each memory cell of a semiconductor memory device according to an example embodiment of inventive concepts.

FIG. 35 is a cross-sectional view of a vertical-channel transistor included in each memory cell a semiconductor memory device according to an example embodiment of inventive concepts.

Referring to FIG. 35, a plurality of pillars formed of the same or substantially the same material used to manufacture a semiconductor substrate 3510, protrude vertically from the semiconductor substrate 3510. In each of the pillars, a source region S and a drain region are formed on upper and lower portions, respectively, and a channel region C is disposed between the source region S and the drain region D.

A gate electrode G is formed on outer circumferences of each of the pillars to surround the channel region C. A gate insulating layer is formed between the gate electrode G and each of the pillars. A word line 3540 may be formed at side surfaces of the gate electrode G to be electrically connected to the gate electrode G. In FIG. 35, reference numerals '3550' and '3560' denote interlayer insulating layers.

Figure 36:
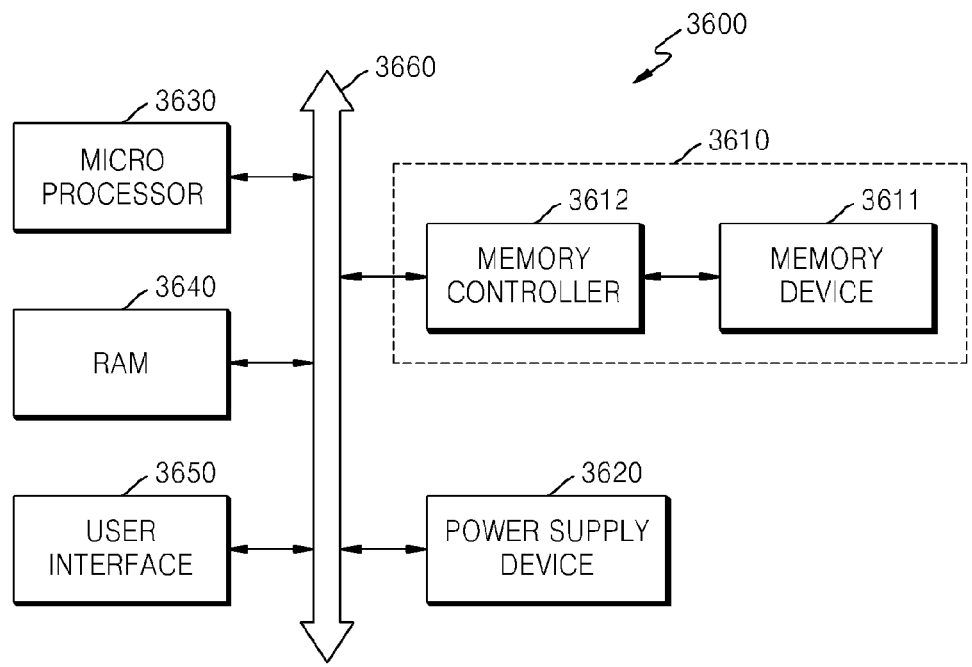
FIG. 36 is a block diagram of a computing system apparatus that includes a semiconductor memory device according to an example embodiment of inventive concepts.

FIG. 36 is a block diagram of a computing system apparatus 3600 including a semiconductor memory device according to an example embodiment of inventive concepts.

Referring to FIG. 36, the computing system apparatus 3600 may include a microprocessor 3630 electrically connected to a bus 3660, a user interface 3650, and a memory system device 3610 that includes a memory controller 3612 and a memory device 3611. The memory device 3611 may include a plurality of memory cells for storing data. The memory device 3611 may include one of the semiconductor memory devices 100 to 2400 illustrated in FIGS. 1 to 24 and the semiconductor memory devices 2600 to 3400 illustrated in FIGS. 26 to 34. The memory controller 3612 may control the memory device 3611. In at least this example embodiment, the computing system apparatus 3600 may further include random access memory (RAM) 3640 and a power supply device 3620.

If the computing system apparatus 3600 is a mobile apparatus, for example, a battery that supplies power to operate the computing system apparatus 3600, and a modem (e.g., a base-band chipset) may also be provided. Although not illustrated, the computing system apparatus 3600 may include additional devices, such as an application chipset, a camera image processor (CIS), a mobile dynamic random access memory (DRAM), etc.

The memory controller 3612 and the memory device 3611 may form, for example, a solid state drive/disk (SSD), which uses non-volatile memory to store data.

The computing system apparatus 3600 may be a mobile phone, a smart phone, a tablet personal computer (PC), a personal digital assistant (PDA), MP3 or other music player device, or the like.

Figure 37:
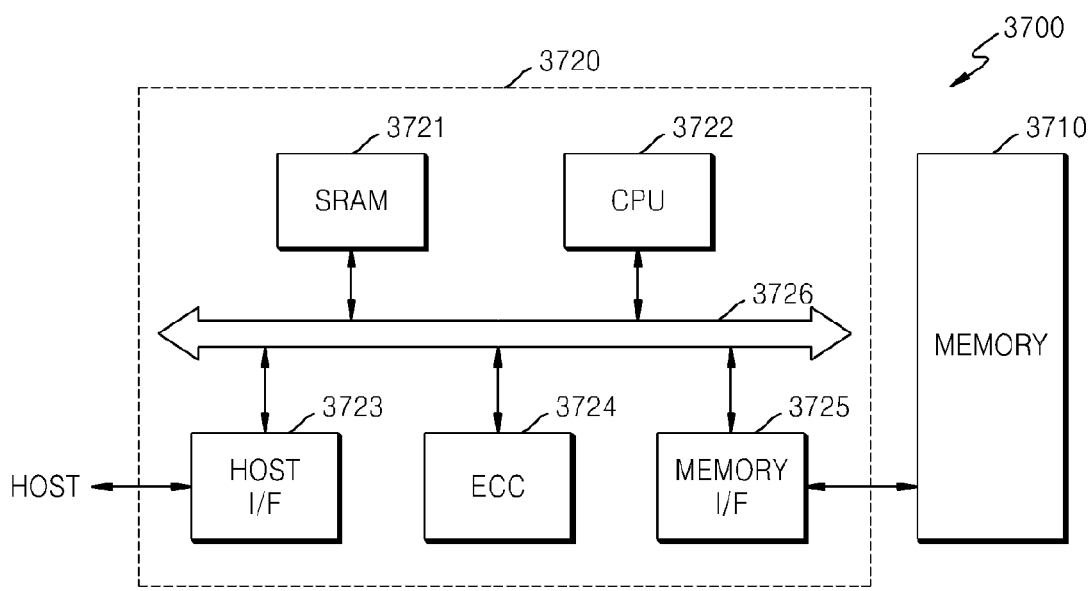
FIG. 37 is a block diagram of a memory card that includes a semiconductor memory device according to an example embodiment of inventive concepts.

FIG. 37 is a block diagram of a memory card 3700 that includes a semiconductor memory device according to an example embodiment of inventive concepts.

Referring to FIG. 37, the memory card 3700 may include a memory device 3710 and a memory controller 3720. The memory device 3710 may include a plurality of memory cells for storing data. The memory device 3710 may include one of the semiconductor memory devices 100 to 2400 illustrated in FIGS. 1 to 24 and the semiconductor memory devices 2600 to 3400 illustrated in FIGS. 26 to 34. The memory controller 3720 may control the memory device 3710. The memory controller 3720 may be configured to communicate with an external device (e.g., a host) via one or more of various interface protocols (e.g., a universal serial bus (USB), a multimedia card (MMC), a peripheral component interconnect express (PCI-E), a serial advanced technology attachment (SATA), a parallel advanced technology attachment (PATA), a small computer system interface (SCSI), an enhanced small device interface (ESDI), integrated device electronics (IDE), etc.). The structures and operations of a central processing unit (CPU) 3722, synchronous random access memory (SRAM) 3721, a host interface (I/F) 3723, an ECC 3724, a memory I/F 3725, and a bus 3726 included in the memory controller 3720 are well-known, and thus, will not described in detail here.

A memory device according to at least some example embodiments of inventive concepts may be mounted by using one of various shaped packages. For example, a memory device according to at least some example embodiments of inventive concepts may be mounted by using a package, such as a package on package (PoP), ball grid arrays (BGAs), chip scale packages (CSPs), plastic leaded chip carrier (PLCC), a plastic dual in-line package (PDIP), a die in waffle pack, a die-in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a system-in package (SIP), a multi-chip package (MCP), a wafer-level fabricated package (WFP), a wafer-level processed stack package (WSP)), etc.

While inventive concepts have been particularly shown and described with reference to example embodiments thereof, it will be understood that various changes in form and details may be made therein without departing from the spirit and scope of the following claims.

What is claimed is:

1. A semiconductor memory device comprising:
    a plurality of memory cell blocks, each of the plurality of memory cell blocks having a first region including first memory cells connected to a first bit line, and a second region including second memory cells connected to a second bit line;
    a plurality of bit line sense amplifiers, each of the plurality of bit line sense amplifiers being connected to the first or second memory cells of a corresponding memory cell block from among the plurality of memory cell blocks; and
    a plurality of connection units, each of the plurality of connection units being configured to selectively connect the first bit line to a corresponding bit line sense amplifier based on a first control signal, and to selectively connect the second bit line to the corresponding bit line sense amplifier via a corresponding global bit line based on a second control signal, wherein
        the first region and the second region of each of the plurality of memory cell blocks cross each other in a first direction, and
        the first region and second region of each of the plurality of memory cell blocks are arranged adjacent to each other in a second direction.

2. The semiconductor memory device of claim 1, wherein the first direction is not parallel to the second direction.

3. The semiconductor memory device of claim 1, wherein the first direction is perpendicular to the second direction.

4. The semiconductor memory device of claim 1, further comprising:
    a plurality of first bit lines and a plurality of second bit lines as local bit lines, wherein
        pitches between a plurality of global bit lines are about two times pitches between the local bit lines.

5. The semiconductor memory device of claim 1, further comprising:

at least one control signal generation unit configured to generate the first control signal and the second control signal based on a row address.

6. The semiconductor memory device of claim 5, wherein the at least one control signal generation unit is further configured to,
generate the first control signal having a first voltage when an enabled word line is connected to a corresponding first memory cell,
generate the first control signal having a second voltage when the enabled word line is not connected to the corresponding first memory cell,
generate the second control signal having the first voltage when the enabled word line is connected to a corresponding second memory cell, and
generate the second control signal having the second voltage when the enabled word line is not connected to the corresponding second memory cell.

7. The semiconductor memory device of claim 6, wherein each of the plurality of connection units is further configured to,
connect the first bit line to the corresponding bit line sense amplifier in response to the first control signal having the first voltage,
disconnect the first bit line from the corresponding bit line sense amplifier in response to the first control signal having the second voltage,
connect the second bit line to the corresponding bit line sense amplifier via the corresponding global bit line in response to the second control signal having the first voltage, and
disconnect one of the second bit line and the corresponding bit line sense amplifier from the corresponding global bit line in response to the second control signal having the second voltage.

8. The semiconductor memory device of claim 7, wherein the at least one control signal generation unit is configured to generate the first control signal and the second control signal having a third voltage when the semiconductor memory device performs a precharging operation.

9. The semiconductor memory device of claim 8, wherein the first voltage is higher than the second voltage and the third voltage, and the third voltage is higher than the second voltage.

10. The semiconductor memory device of claim 1, further comprising:
at least one shield line between global bit lines adjacent to one another in the first direction, the at least one shield line being maintained at a constant voltage level.

11. The semiconductor memory device of claim 10, wherein the at least one shield line is maintained at a ground voltage level.

12. The semiconductor memory device of claim 1, wherein each of the plurality of connection units comprises:
a first switch unit configured to selectively connect the first bit line to the corresponding bit line sense amplifier based on the first control signal; and
a second switch unit configured to selectively connect the second bit line to the global bit line based on the second control signal.

13. The semiconductor memory device of claim 12, wherein the first switch unit is between the corresponding bit line sense amplifier and the corresponding memory cell block, and the second switch unit is at a location corresponding to the center of the corresponding memory cell block.

14. The semiconductor memory device of claim 1, wherein each of the plurality of connection units comprises:

a first switch unit configured to selectively connect the first bit line to the corresponding bit line sense amplifier based on the first control signal; and
a second switch unit configured to selectively connect the corresponding bit line sense amplifier to the global bit line based on the second control signal.

15. The semiconductor memory device of claim 14, wherein the first switch unit and the second switch unit are between the corresponding bit line sense amplifier and the corresponding memory cell block.

16. The semiconductor memory device of claim 1, wherein the semiconductor memory device has an open bit line architecture, and each of the plurality of bit line sense amplifiers includes,
an input terminal configured to be connected to the global bit line or the first bit line of a memory cell block adjacent to the bit line sense amplifier in one direction, and
an inversion input terminal configured to be connected to the global bit line or the first bit line of a memory cell block adjacent to the bit line sense amplifier in the opposite direction.

17. The semiconductor memory device of claim 1, wherein the semiconductor memory device has a folded bit line architecture, and each of the plurality of bit line sense amplifiers includes,
a first input terminal configured to be connected to the global bit line or the first bit line of a memory cell block adjacent to the bit line sense amplifier in one direction, and
an inversion input terminal configured to be connected to an other of the global bit line and the first bit line of a memory cell block adjacent to the bit line sense amplifier, which is not connected to the first input terminal.

18. The semiconductor memory device of claim 17, wherein each of the plurality of bit line sense amplifiers further comprise's:
a second input terminal configured to be connected to the global bit line or the first bit line of a memory cell block adjacent to the bit line sense amplifier in the opposite direction; and
a second inversion input terminal configured to be connected to an other of the global bit line and the first bit line of the memory cell block adjacent to the bit line sense amplifier, which is not connected to the second input terminal.

19. The semiconductor memory device of claim 1, wherein each of the first and second memory cells includes a vertical-channel transistor.

20. The semiconductor memory device of claim 1, further comprising:
a plurality of memory cell arrays, each of the plurality of memory cell arrays including at least one memory cell block from among the plurality of memory cell blocks;
a plurality of sub word line driver regions between the plurality of memory cell arrays;
a plurality of first sub word line drivers, each of the plurality of first sub word line drivers being configured to apply a corresponding first driving signal or a ground voltage to a first end of a corresponding sub word line based on a main word line signal; and
a plurality of second sub word line drivers, each of the plurality of second sub word line drivers being configured to selectively apply the ground voltage to a second end of the corresponding sub word line based on a corresponding second driving signal, wherein
a first sub word line driver and a second sub word line driver connected to a sub word line different from a sub word line connected to the first sub word line driver are formed in a first sub word line driver region from among the plurality of sub word line driver regions.

21. The semiconductor memory device of claim 20, wherein the sub word line connected to the first sub word line driver in the first sub word line driver region is adjacent to the sub word line connected to the second sub word line driver in the first sub word line driver region.

22. The semiconductor memory device of claim 20, wherein first and second sub word line drivers connected to the same sub word line are located in different sub word line driver regions.

23. The semiconductor memory device of claim 20, wherein each of the plurality of first sub word line drivers includes,
a first transistor having a first gate, a first terminal and a second terminal, wherein
the first gate is configured to receive the main word line signal, the first terminal is configured to receive a corresponding first driving signal, and the second terminal is connected to a first end of a corresponding sub word line, and
a second transistor having a second gate, a third terminal and a fourth terminal, wherein
the second gate is configured to receive the main word line signal, the third terminal is configured to receive the ground voltage, and the fourth terminal is connected to the second terminal of the first transistor and the first end of the corresponding sub word line, and
each of the plurality of second sub word line drivers includes,
a third transistor having a third gate, a fifth terminal and a sixth terminal, wherein
the third gate is configured to receive a corresponding second driving signal, the fifth terminal is configured to receive the ground voltage, and the sixth terminal is connected to a second end of the corresponding sub word line.

24. The semiconductor memory device of claim 20, wherein each of the plurality of second sub word line drivers formed in the sub word line driver regions in which the plurality of first sub word line drivers, each of which is configured to drive a corresponding sub word line with a high voltage, are formed, respectively, and configured to drive the corresponding sub word line with the ground voltage according to a corresponding second driving signal.

25. The semiconductor memory device of claim 20, wherein a second sub word line driver connected to a second end of a sub word line driven with a high voltage by a corresponding first sub word line driver, is disabled according to a corresponding second driving signal.

* * * * *